United States Patent
Lee

(10) Patent No.: US 9,230,677 B2
(45) Date of Patent: Jan. 5, 2016

(54) NAND ARRAY HIARCHICAL BL STRUCTURES FOR MULTIPLE-WL AND ALL-BL SIMULTANEOUS ERASE, ERASE-VERIFY, PROGRAM, PROGRAM-VERIFY, AND READ OPERATIONS

(71) Applicant: Aplus Flash Technology, Inc, Fremont, CA (US)

(72) Inventor: Peter Wung Lee, Saratoga, CA (US)

(*) Notice: Subject to any disclaimer, the term of this patent is extended or adjusted under 35 U.S.C. 154(b) by 0 days.

(21) Appl. No.: 14/341,739

(22) Filed: Jul. 25, 2014

(65) Prior Publication Data

US 2015/0078080 A1 Mar. 19, 2015

Related U.S. Application Data

(60) Provisional application No. 61/858,611, filed on Jul. 25, 2013.

(51) Int. Cl.
| | |
|---|---|
| G11C 16/04 | (2006.01) |
| G11C 16/34 | (2006.01) |
| G11C 11/56 | (2006.01) |
| G11C 16/10 | (2006.01) |
| G11C 16/16 | (2006.01) |
| G11C 16/26 | (2006.01) |
| G11C 16/06 | (2006.01) |

(52) U.S. Cl.
CPC ............ *G11C 16/3459* (2013.01); *G11C 11/56* (2013.01); *G11C 11/5628* (2013.01); *G11C 11/5642* (2013.01); *G11C 16/0483* (2013.01); *G11C 16/06* (2013.01); *G11C 16/10* (2013.01); *G11C 16/16* (2013.01); *G11C 16/26* (2013.01); *G11C 16/3418* (2013.01)

(58) Field of Classification Search
CPC ............... G11C 16/0483; G11C 16/26; G11C 16/3459; G11C 16/10; G11C 16/16; G11C 16/3418; G11C 16/3445
USPC ............. 365/185.03, 185.11, 185.12, 185.17, 365/185.33
See application file for complete search history.

(56) References Cited

U.S. PATENT DOCUMENTS

| | | | |
|---|---|---|---|
| 5,734,609 | A | 3/1998 | Choi |
| 5,867,429 | A | 2/1999 | Chen |
| 6,522,580 | B2 | 2/2003 | Chen |
| 6,542,407 | B1 | 4/2003 | Chen |
| 6,657,891 | B1 | 12/2003 | Shibata |

(Continued)

*Primary Examiner* — Gene Auduong
(74) *Attorney, Agent, or Firm* — Fang Wu

(57) ABSTRACT

Several 2D and 3D HiNAND flash memory arrays with 1-level or 2-level broken BL-hierarchical structures are provided for Multiple Whole-WL and All-BL simultaneous operations in Dispersed Blocks. The global bit line (GBL) is divided to multiple 1(top)-level broken metal2 GBLs plus optional lower-level broken metal1 local bit lines (LBLs). A preferred $V_{inhibit}$ supply higher than Vdd can be selectively supplied via horizontal metal0 power line LBLps to charge selected broken GBLs/LBLs which can also be selectively discharged via a String source line. Charge-sharing technique for precharging and discharging of broken GBL/LBL capacitors for NAND cell data sensing is used in Read and Verify operations with reduced power consumption and latency. Recall technique to restore the desired Program Data stored in the broken GBL/LBL capacitors is used for Multiple-WL and All-BL Program and Program-Verify operation with reduced program current for highest program yield superior P/E cycles.

73 Claims, 38 Drawing Sheets

(56) References Cited

U.S. PATENT DOCUMENTS

| | | |
|---|---|---|
| 6,781,877 B2 | 8/2004 | Cernea |
| 6,807,095 B2 | 10/2004 | Chen |
| 6,816,409 B2 | 11/2004 | Tanaka |
| 6,847,553 B2 | 1/2005 | Chen |
| 6,870,768 B2 | 3/2005 | Cemea |
| 6,888,758 B1 | 5/2005 | Hemink |
| 6,917,542 B2 | 7/2005 | Chen |
| 7,023,735 B2 | 4/2006 | Ban |
| 7,046,548 B2 | 5/2006 | Cernea |
| 7,061,798 B2 | 6/2006 | Chen |
| 7,102,924 B2 | 9/2006 | Chen |
| 7,187,585 B2 | 3/2007 | Li |
| 7,196,928 B2 | 3/2007 | Chen |
| 7,224,613 B2 | 5/2007 | Chen |
| 7,289,344 B2 | 10/2007 | Chen |
| 7,301,808 B2 | 11/2007 | Li |
| 7,301,813 B2 | 11/2007 | Chen |
| 7,301,839 B2 | 11/2007 | Li |
| 7,315,477 B2 | 1/2008 | Chen |
| 7,321,510 B2 | 1/2008 | Li |
| 7,372,730 B2 | 5/2008 | Chen |
| 7,397,698 B2 | 7/2008 | Fong |
| 7,443,729 B2 | 10/2008 | Li |
| 7,499,329 B2 | 3/2009 | Nazarian |
| 7,499,338 B2 | 3/2009 | Ito |
| 7,506,113 B2 | 3/2009 | Li |
| 7,522,454 B2 | 4/2009 | Li |
| 7,652,929 B2 | 1/2010 | Li |
| 7,839,690 B2 | 11/2010 | Lee |
| 7,876,611 B2 | 1/2011 | Dutta |
| 8,036,041 B2 | 10/2011 | Li |
| 8,130,556 B2 | 3/2012 | Lutze |
| 8,148,763 B2 | 4/2012 | Kim |
| 7,570,517 B2 | 5/2012 | Hishida |
| 8,169,826 B2 * | 5/2012 | Hishida .................. G11C 5/02 257/324 |
| 8,189,391 B2 | 5/2012 | Itagaki |
| 8,194,453 B2 | 6/2012 | Maejima |
| 8,203,882 B2 | 6/2012 | Hishida |
| 8,218,348 B2 | 7/2012 | Roohparvar |
| 8,274,823 B2 | 9/2012 | Roohparvar |
| 8,284,606 B2 | 10/2012 | Li |
| 8,284,613 B2 | 10/2012 | Yamada |
| 8,334,551 B2 | 12/2012 | Itagaki |
| 8,335,111 B2 | 12/2012 | Fukuzumi |
| 8,400,826 B2 | 3/2013 | Roohparvar |
| 8,400,839 B2 | 3/2013 | Li |
| 8,437,192 B2 | 5/2013 | Lung |
| 8,446,777 B2 | 5/2013 | Ueno |
| 8,461,000 B2 | 6/2013 | Alsmeier et al. |
| 8,462,559 B2 | 6/2013 | Yamada |
| 8,477,533 B2 | 7/2013 | Kang |
| 8,488,382 B1 | 7/2013 | Li |
| 8,503,230 B2 | 8/2013 | Yoo |
| 8,503,245 B2 | 8/2013 | Yamada |
| 8,526,236 B2 | 9/2013 | Jones |
| 8,559,222 B1 | 10/2013 | Iwai et al. |
| 8,559,236 B2 | 10/2013 | Nakai |
| 8,570,810 B2 | 10/2013 | Fong |
| 8,599,617 B2 | 12/2013 | Shiino |
| 8,605,503 B2 | 12/2013 | Futatsuyama |
| 8,605,511 B2 | 12/2013 | Tanaka |
| 8,619,468 B2 | 12/2013 | Shibata |
| 8,625,356 B2 | 1/2014 | Shibata |
| 8,625,357 B2 | 1/2014 | Cho |
| 8,625,359 B2 | 1/2014 | Jeon |
| 8,630,115 B2 | 1/2014 | Pascucci |
| 8,630,116 B2 | 1/2014 | Maejima |
| 8,634,251 B2 | 1/2014 | Chung |
| 8,637,915 B2 | 1/2014 | Ichige |
| 8,638,608 B2 | 1/2014 | Lai |
| 8,638,609 B2 | 1/2014 | Lin |
| 8,644,081 B2 | 2/2014 | Chang |
| 8,654,585 B2 | 2/2014 | Oh |
| 8,654,588 B2 | 2/2014 | Aritome |
| 8,659,944 B2 * | 2/2014 | Hung .................. G11C 16/0466 365/185.05 |
| 8,659,951 B2 | 2/2014 | Nawata |
| 8,661,294 B2 | 2/2014 | Lee |
| 8,665,649 B2 | 3/2014 | Park |
| 8,670,272 B2 | 3/2014 | Radke |
| 8,675,416 B2 | 3/2014 | Lee |
| 8,681,543 B2 | 3/2014 | Jang |
| 8,681,545 B2 | 3/2014 | Kim et al. |
| 8,681,563 B1 | 3/2014 | Lee |
| 8,687,430 B2 | 4/2014 | Sarin et al. |
| 8,687,431 B2 | 4/2014 | Sarin |
| 8,694,720 B2 | 4/2014 | Lee |
| 8,694,766 B2 | 4/2014 | Toelkes |
| 8,700,879 B2 | 4/2014 | Porzio |
| 8,705,277 B2 | 4/2014 | Moschiano et al. |
| 8,705,290 B2 | 4/2014 | Damle |
| 8,705,293 B2 | 4/2014 | She |
| 8,711,621 B2 | 4/2014 | Kim |
| 8,711,624 B2 | 4/2014 | Choi |
| 8,717,819 B2 | 5/2014 | Aritome |
| 8,730,733 B2 | 5/2014 | Youn |
| 8,737,140 B2 | 5/2014 | Kim |
| 8,755,224 B2 | 6/2014 | Yun |
| 8,773,910 B2 | 7/2014 | Jones |
| 8,773,911 B2 | 7/2014 | Park |
| 8,893,247 B1 | 11/2014 | Faaborg |
| 2012/0051137 A1 | 3/2012 | Hung |
| 2014/0347928 A1 * | 11/2014 | Lee .................. G11C 16/0483 365/185.11 |
| 2015/0003151 A1 * | 1/2015 | Lee .................. G11C 16/10 365/185.02 |
| 2015/0078086 A1 * | 3/2015 | Lee .................. G11C 16/0483 365/185.11 |

\* cited by examiner

| Read Operation (Embodiment 1) | | 1) Pre-discharge GBL | 2) Pre-charge GBL | 3) Discharge GBL of On-cell | 4) Charge Sharing | 5) Multiply | 6) Sensing | 7) Copy Sensed Data to Cache | 8) Read Page Cache Sequentially |
|---|---|---|---|---|---|---|---|---|---|
| DIV_EN | DI | Vdd | Vread | Vread | Vread | Vread | Vdd | | Repeat 4) to 6) |
| | Sel Group | 0V | 0V | 0V | Vread | Vread | 0V | | Repeat 4) to 6) |
| | Unsel Group | 0V | 0V | 0V | 0V | 0V | 0V | | Repeat 4) to 6) |
| | CSL | 0V | 0V | 0V | 0V | 0V | 0V | | Repeat 4) to 6) |
| PRE | Sel Group | Vdd | Vread | 0V | 0V | 0V | Vdd | | Repeat 4) to 6) |
| | Unsel Group | Vdd | 0V | 0V | 0V | 0V | Vdd | | Repeat 4) to 6) |
| GBL_ps | Sel Group | 0V | Vdd | 0V | 0V | 0V | 0V | | Repeat 4) to 6) |
| | Unsel Group | 0V | 0V | 0V | 0V | 0V | 0V | | Repeat 4) to 6) |
| SSL | Sel Block | 0V | Vdd | Vread | Vread | Vdd | 0V | | Repeat 4) to 6) |
| | Unsel Block | 0V | 0V | 0V | 0V | 0V | 0V | | Repeat 4) to 6) |
| GSL | Sel Block | 0V | $V_{Rn}$ [c] | $V_{Rn}$ | $V_{Rn}$ | $V_{Rn}$ | 0V | | Repeat 4) to 6) |
| | Unsel Block | 0V | Vread | Vread | Vread | Vread | 0V | | Repeat 4) to 6) |
| WL | Sel Block / Sel WL | 0V | Vdd | Vdd | 0V | 0V | 0V | | Repeat 4) to 6) |
| | Unsel WL | 0V | 0V | 0V | 0V | 0V | 0V | | Repeat 4) to 6) |
| | Unsel Block | 0V | 0V | 0V | 0V | 0V | 0V | | Repeat 4) to 6) |
| GBL | Sel Group | 0V | Vdd | Vdd or 0V [a] | Vdd/M(J) or 0V [b] | Vdd/M(J) or 0V [b] | 0V | | Repeat 4) to 6) |
| | Unsel Group | 0V | 0V | 0V | 0V | 0V | 0V | | Repeat 4) to 6) | a) Vdd: Off-cell; 0V: On-cell
b) Vdd/M(J): Off-cell; 0V: On-cell; M(J) is a Function of J
c) $V_{Rn}$ is WL read voltage for distinguish cell threshold states

FIG. 8

| Read Operation (Embodiment 2) | | 1) Pre-discharge LBL/GBL | 2) Pre-charge LBL/GBL | 3) Discharge LBL/ GBL of On-cell | 4) Charge Sharing | 5) Multiply | 6) Sensing | 7) Copy Sensed Data to Cache | 8) Read Page Cache Sequentially |
|---|---|---|---|---|---|---|---|---|---|
| DIV_EN | Sel Group | Vdd | Vread | Vread | Vread | Vread | Vdd | Repeat 4) to 6) | Repeat 4) to 6) |
| | Unsel Group | 0V | 0V | 0V | Vread | Vread | 0V | Repeat 4) to 6) | Repeat 4) to 6) |
| | CSL | 0V | 0V | 0V | 0V | 0V | 0V | Repeat 4) to 6) | Repeat 4) to 6) |
| PRE | Sel Group | Vdd | Vread | 0V | 0V | 0V | Vdd | Repeat 4) to 6) | Repeat 4) to 6) |
| | Unsel Group | Vdd | 0V | 0V | 0V | 0V | Vdd | Repeat 4) to 6) | Repeat 4) to 6) |
| LBL_ps | | 0V | Vdd | Vdd | 0V | 0V | Vdd | Repeat 4) to 6) | Repeat 4) to 6) |
| SEG | Sel Group | Vdd | Vread | Vread | Vread | Vread | Vdd | Repeat 4) to 6) | Repeat 4) to 6) |
| | Unsel Group | Vdd | 0V | 0V | 0V | 0V | Vdd | Repeat 4) to 6) | Repeat 4) to 6) |
| SSL | Sel Block | 0V | Vdd | Vdd | Vdd | Vdd | 0V | Repeat 4) to 6) | Repeat 4) to 6) |
| | Unsel Block | 0V | 0V | Vread | Vread | Vread | 0V | Repeat 4) to 6) | Repeat 4) to 6) |
| GSL | Sel Block | 0V | 0V | 0V | 0V | 0V | 0V | Repeat 4) to 6) | Repeat 4) to 6) |
| | Unsel Block | 0V | 0V | 0V | 0V | 0V | 0V | Repeat 4) to 6) | Repeat 4) to 6) |
| WL | Sel Block / Sel WL | 0V | $V_{Rn}$[c] | $V_{Rn}$ | $V_{Rn}$ | $V_{Rn}$ | 0V | Repeat 4) to 6) | Repeat 4) to 6) |
| | Sel Block / Unsel WL | 0V | Vread | Vread | Vread | Vread | 0V | Repeat 4) to 6) | Repeat 4) to 6) |
| | Unsel Block | 0V | 0V | 0V | 0V | 0V | 0V | Repeat 4) to 6) | Repeat 4) to 6) |
| LBL | Sel Group | 0V | Vdd | Vdd or 0V[a] | Vdd/M(J) or 0V[b] | Vdd/M(J) or 0V[b] | 0V | Repeat 4) to 6) | Repeat 4) to 6) |
| | Unsel Group | 0V | 0V | 0V | 0V | 0V | 0V | Repeat 4) to 6) | Repeat 4) to 6) |
| GBL | Sel Group | 0V | Vdd | Vdd or 0V[a] | Vdd/M(J) or 0V[b] | Vdd/M(J) or 0V[b] | 0V | Repeat 4) to 6) | Repeat 4) to 6) |
| | Unsel Group | 0V | 0V | 0V | 0V | 0V | 0V | Repeat 4) to 6) | Repeat 4) to 6) | a) Vdd: Off-cell; 0V: On-cell
b) Vdd/M(J): Off-cell; 0V: On-cell; M(J) is a Function of J
c) $V_{Rn}$ is WL read voltage for distinguish cell threshold states

FIG. 9

| Multiple-WL Program Operation (Option 1 of Embodiment 1) | | 1) Pre-discharge GBL | 2) Pre-charge GBL | 3) S/H Paged Data on GBL | 4) S/H Multi-paged Data | 5) Program | 6) Recall[b] | 7) Program Verify |
|---|---|---|---|---|---|---|---|---|
| DI | Sel Segment | Vdd | Vpass | Vpass | Repeat 2), 3) | Vpass | Vread | Similar to Read[d] |
| | Unsel Segment | Vdd | 0V | 0V | Repeat 2), 3) | 0V | 0V | Similar to Read[d] |
| DIV_EN | Sel Group | 0V | 0V | Vpass | Repeat 2), 3) | Vpass | Vread | Similar to Read[d] |
| | Unsel Group | 0V | 0V | 0V | Repeat 2), 3) | 0V | 0V | Similar to Read[d] |
| CSL | | Vdd | Vdd | Vdd | Repeat 2), 3) | Vdd | 0V | Similar to Read[d] |
| PRE | Sel Segment | Vdd | Vpass | 0V | Repeat 2), 3) | 0V | 0V | Similar to Read[d] |
| | Unsel Segment | Vdd | 0V | 0V | Repeat 2), 3) | 0V | 0V | Similar to Read[d] |
| GBL_ps | Sel Segment | 0V | Vinh | 0V | Repeat 2), 3) | Vdd | 0V | Similar to Read[d] |
| | Unsel Segment | 0V | 0V | 0V | Repeat 2), 3) | 0V | 0V | Similar to Read[d] |
| SSL | Sel Block | 0V | Vpass | Vdd | Repeat 2), 3) | Vdd | 0V | Similar to Read[d] |
| | Unsel Block | 0V | 0V | 0V | Repeat 2), 3) | 0V | 0V | Similar to Read[d] |
| GSL | Sel Block | 0V | 0V | Vdd | Repeat 2), 3) | 0V | 0V | Similar to Read[d] |
| | Unsel Block | 0V | 0V | Vdd | Repeat 2), 3) | 0V | 0V | Similar to Read[d] |
| WL | Sel Block, Unsel WL (erased) | 0V | Vdd | Vdd | Repeat 2), 3) | Vpass | Vread | Same as Read[d] |
| | Sel Block, Sel WL | 0V | Vdd | Vdd | Repeat 2), 3) | Vpgm | VFYn | Same as Read[d] |
| | Sel Block, Unsel Adj. WL (pgmed) | 0V | Vdd | Vdd | Repeat 2), 3) | Vpass | Vread | Same as Read[d] |
| | Sel Block, Unsel WL (pgmed) | 0V | Vdd | Vdd | Repeat 2), 3) | Vpass | Vread | Same as Read[d] |
| | Unsel Block | 0V | 0V | Vdd | Repeat 2), 3) | 0V | 0V | Same as Read[d] |
| GBL | Inhibit-cell | 0V | Vdd | Vdd | Repeat 2), 3) | Vdd | Vdd/M(J)[c] or 0V | Similar to Read[d] |
| | PGM-cell | 0V | 0V | 0V | Repeat 2), 3) | 0V | 0V | Similar to Read[d] | a) Vdd: Inhibit-cell; 0V: PGM-cell.
b) Refer to Fig. 6C and Fig. 7C.
c) Vdd/M(J): Inhibit-cell; M(J) is a Function of J.
d) Similar to 1) – 6) in Fig. 8; Selected WL is applied to VFYn set for next Program-Verify.

Vpgm > Vpass > Vinh > Vread

FIG. 10

| Multiple-WL Program Operation (Option 2 of Embodiment 1) | | 1) Pre-discharge LBL/GBL | 2) Pre-charge LBL | 3) S/H Paged Data on LBL | 4) S/H Multi-Paged Data | 5) Program | 6) Recall[b] | 7) Program Verify |
|---|---|---|---|---|---|---|---|---|
| DI | Sel Segment | Vdd | Vpass | Vpass | Repeat 2), 3) | Vpass | Vread | Similar to Read[d] |
|  | Unsel Segment | Vdd | 0V | 0V | Repeat 2), 3) | 0V | 0V | Similar to Read[d] |
| DIW_EN | Sel Group | 0V | 0V | Vpass | Repeat 2), 3) | Vpass | Vread | Similar to Read[d] |
|  | Unsel Group | 0V | 0V | 0V | Repeat 2), 3) | 0V | 0V | Similar to Read[d] |
| CSL |  | Vdd | Vdd | Vdd | Repeat 2), 3) | Vdd | 0V | Similar to Read[d] |
| PRE | Sel Segment | Vdd | Vpass | 0V | Repeat 2), 3) | 0V | 0V | Similar to Read[d] |
|  | Unsel Segment | Vdd | 0V | 0V | Repeat 2), 3) | 0V | 0V | Similar to Read[d] |
| GBL_ps | Sel Segment | 0V | Vdd | Vdd | Repeat 2), 3) | Vdd | 0V | Similar to Read[d] |
|  | Unsel Segment | 0V | 0V | 0V | Repeat 2), 3) | 0V | 0V | Similar to Read[d] |
| SSL | Sel Block | 0V | Vpass | Vpass | Repeat 2), 3) | Vpass | 0V | Similar to Read[d] |
|  | Unsel Block | 0V | 0V | 0V | Repeat 2), 3) | 0V | 0V | Similar to Read[d] |
| GSL | Sel Block | 0V | 0V | 0V | Repeat 2), 3) | 0V | 0V | Similar to Read[d] |
|  | Unsel Block | 0V | 0V | 0V | Repeat 2), 3) | 0V | 0V | Similar to Read[d] |
| WL | Sel Block: Unsel WL (erased) | 0V | Vdd | Vdd | Repeat 2), 3) | Vpass | Vread | Same as Read[d] |
|  | Sel Block: Sel WL | 0V | Vdd | Vdd | Repeat 2), 3) | Vpgm | VFYn | Same as Read[d] |
|  | Sel Block: Unsel Adj. WL (pgmed) | 0V | Vdd | Vdd | Repeat 2), 3) | Vpass | Vread | Same as Read[d] |
|  | Sel Block: Unsel WL (pgmed) | 0V | Vdd | Vdd | Repeat 2), 3) | Vpass | Vread | Same as Read[d] |
|  | Unsel Block | 0V | 0V | 0V | Repeat 2), 3) | 0V | 0V | Same as Read[d] |
| GBL | Inhibit-cell | 0V | Vdd | Vdd | Repeat 2), 3) | Vdd | Vdd/M(J)[c] or 0V | Similar to Read[d] |
|  | PGM-cell | 0V | 0V | 0V | Repeat 2), 3) | 0V | 0V | Similar to Read[d] | a) Vdd: Inhibit-cell; 0V: PGM-cell.
b) Refer to Fig. 6C and Fig. 7C.
c) Vdd/M(J): Inhibit-cell; M(J) is a Function of J.
d) Similar to 1) – 6) in Fig. 8; Selected WL is VFYn set for next Program-Verify.

Vpgm > Vpass >> Vinh > Vread

FIG. 11

| Multiple WL Program Operation (Option 1 of Embodiment 2) | | 1) Pre-discharge LBL/GBL | 2) Pre-charge LBL | 3) S/H Paged Data on LBL | 4) S/H Multi-Paged Data | 5) Program | 6) Recall[b] | 7) Program Verify |
|---|---|---|---|---|---|---|---|---|
| DI | Sel Sector | Vdd | Vpass | Vpass | Repeat 3) | Vpass | Vread | Similar to Read[d] |
| | Unsel Sector | Vdd | 0V | 0V | Repeat 3) | 0V | 0V | Similar to Read[d] |
| DIV_EN | Sel Group | 0V | 0V | Vpass | Repeat 3) | Vpass | Vread | Similar to Read[d] |
| | Unsel Group | 0V | 0V | 0V | Repeat 3) | 0V | 0V | Similar to Read[d] |
| | CSL | Vdd | Vdd | Vdd | Repeat 3) | Vdd | 0V | Similar to Read[d] |
| PRE | Sel Sector | Vdd | Vpass | 0V | Repeat 3) | 0V | 0V | Similar to Read[d] |
| | Unsel Sector | Vdd | 0V | 0V | Repeat 3) | 0V | 0V | Similar to Read[d] |
| LBL_ps | Sel Sector | 0V | Vinh | 0V | Repeat 3) | 0V | 0V | Similar to Read[d] |
| | Unsel Sector | 0V | 0V | 0V | Repeat 3) | 0V | 0V | Similar to Read[d] |
| SEG | Sel Sector | Vdd | 0V | Vdd ↑↓ | Repeat 3) | Vpass | Vread | Similar to Read[d] |
| | Unsel Sector | Vdd | 0V | 0V | Repeat 3) | 0V | 0V | Similar to Read[d] |
| SSL | Sel Block | 0V | Vpass | Vpass | Repeat 3) | Vpass | 0V | Similar to Read[d] |
| | Unsel Block | 0V | 0V | 0V | Repeat 3) | 0V | 0V | Similar to Read[d] |
| GSL | Sel Block | 0V | 0V | 0V | Repeat 3) | 0V | 0V | Similar to Read[d] |
| | Unsel Block | 0V | 0V | 0V | Repeat 3) | 0V | 0V | Similar to Read[d] |
| WL | Sel Block — Unsel WL (erased) | 0V | Vpass | Vpass | Repeat 3) | Vpass | Vread | Same as Read[d] |
| | Sel Block — Sel WL | 0V | Vpass | Vpass | Repeat 3) | Vpgm | VFYn | Same as Read[d] |
| | Sel Block — Unsel Adj. WL (pgmed) | 0V | Vpass | Vpass | Repeat 3) | Vpass | Vread | Same as Read[d] |
| | Sel Block — Unsel WL (pgmed) | 0V | Vdd | Vdd | Repeat 3) | Vdd | Vread | Same as Read[d] |
| | Unsel Block | 0V | 0V | 0V | Repeat 3) | 0V | 0V | Similar to Read[d] |
| LBL | Sel Sector | 0V | Vinh | Vinh or 0V[a] | Repeat 3) | Vinh or 0V[a] | Vinh/M(J)[c] or 0V | Similar to Read[d] |
| | Unsel Sector | 0V | 0V | 0V | Repeat 3) | 0V | 0V | Similar to Read[d] |
| GBL | Inhibit-cell | 0V | Vdd | Vdd | Repeat 3) | Vdd | Vinh/M(J)[c] or 0V | Similar to Read[d] |
| | PGM-cell | 0V | 0V | 0V | Repeat 3) | 0V | 0V | Similar to Read[d] | a) Vinh: Inhibit-cell; 0V: PGM-cell.
b) Refer to Fig. 6C and Fig. 7C.
c) Vinh/M(J): Inhibit-cell; M(J) is a Function of J.
d) Similar to 1) – 6) in Fig. 8; Selected WL is VFYn set for next Program-Verify.

Vpgm > Vpass > Vinh > Vread

FIG. 12

| Multiple WL Program Operation (Option 2 of Embodiment 2) | | 1) Pre-discharge LBL/GBL | 2) Pre-charge LBL | 3) S/H Paged Data on LBL | 4) S/H Multi-Paged Data | 5) Program | 6) Recall[b] | 7) Program Verify |
|---|---|---|---|---|---|---|---|---|
| DI | Sel Segment | Vdd | Vpass | Vpass | Repeat 3) | Vpass | Vread | Similar to Read[d] |
|  | Unsel Segment | Vdd | 0V | 0V | Repeat 3) | 0V | 0V | Similar to Read[d] |
| DIV_EN | Sel Group | 0V | 0V | Vpass | Repeat 3) | Vpass | Vread | Similar to Read[d] |
|  | Unsel Group | 0V | 0V | 0V | Repeat 3) | 0V | 0V | Similar to Read[d] |
| CSL |  | Vdd | Vdd | Vdd | Repeat 3) | Vdd | 0V | Similar to Read[d] |
| PRE | Sel Segment | Vdd | Vpass | 0V | Repeat 3) | 0V | 0V | Similar to Read[d] |
|  | Unsel Segment | 0V | 0V | 0V | Repeat 3) | 0V | 0V | Similar to Read[d] |
| LBL_p[a] | Sel Segment | 0V | Vdd | 0V | Repeat 3) | 0V | 0V | Similar to Read[d] |
|  | Unsel Segment | 0V | 0V | 0V | Repeat 3) | 0V | 0V | Similar to Read[d] |
| SEG | Sel Segment | Vdd | 0V | Vdd ⌐⌐ | Repeat 3) | Vdd | Vread | Similar to Read[d] |
|  | Unsel Segment | Vdd | 0V | 0V | Repeat 3) | 0V | 0V | Similar to Read[d] |
| SSL | Sel Block | 0V | Vpass | Vdd | Repeat 3) | Vdd | 0V | Similar to Read[d] |
|  | Unsel Block | 0V | 0V | 0V | Repeat 3) | 0V | 0V | Similar to Read[d] |
| GSL | Sel Block | 0V | 0V | 0V | Repeat 3) | 0V | 0V | Similar to Read[d] |
|  | Unsel Block | 0V | 0V | 0V | Repeat 3) | 0V | 0V | Similar to Read[d] |
| WL | Sel Block / Unsel WL (erased) | 0V | Vdd | Vdd | Repeat 3) | Vpass | Vread | Same as Read[d] |
|  | Sel Block / Sel WL | 0V | Vdd | Vdd | Repeat 3) | Vpgm | VFYn | Same as Read[d] |
|  | Sel Block / Unsel Adj. WL (pgmed) | 0V | Vdd | Vdd | Repeat 3) | Vpass | Vread | Same as Read[d] |
|  | Sel Block / Unsel WL (pgmed) | 0V | Vdd | Vdd | Repeat 3) | Vpass | Vread | Same as Read[d] |
|  | Unsel Block | 0V | Vdd | Vdd | Repeat 3) | 0V | Vdd | Similar to Read[d] |
| LBL | Sel Segment | 0V | Vdd | Vdd or 0V[a] | Repeat 3) | Vdd or 0V[a] | Vdd/M(J)[c] or 0V | Similar to Read[d] |
|  | Unsel Segment | 0V | Vdd | Vdd | Repeat 3) | 0V | 0V | Similar to Read[d] |
| GBL | Inhibit-cell | 0V | Vdd | Vdd | Repeat 3) | Vdd | Vdd/M(J)[c] or 0V | Similar to Read[d] |
|  | PGM-cell | 0V | 0V | 0V | Repeat 3) | 0V | 0V | Similar to Read[d] | a) Vdd: Inhibit-cell; 0V: PGM-cell.
b) Refer to Fig. 6C and Fig. 7C.
c) Vdd/M(J): Inhibit-cell; M(J) is a Function of J.
d) Similar to 1) – 6) in Fig. 8; Selected WL is VFYn set for next Program-Verify.

Vpgm > Vpass > Vread

FIG. 13

| Dispersed Block Erase Operation Embodiment 1 & 2 (Channel erase scheme) | | Erase Setup1 | Erase Setup2 | Erase Start |
|---|---|---|---|---|
| DI | Sel Group | Vdd | Vdd (Floating) | Vers' (Floating) |
| | Unsel Group | Vdd | Vdd (Floating) | Vers' (Floating) |
| DIV_EN | Sel Group | Vdd | Vdd (Floating) | Vers' (Floating) |
| | Unsel Group | Vdd | Vdd (Floating) | Vers' (Floating) |
| CSL | | Vdd-Vt | Vdd-Vt (Floating) | Vers' (Floating) |
| PRE | Sel Group | Vdd | Vdd (Floating) | Vers' (Floating) |
| | Unsel Group | Vdd | Vdd (Floating) | Vers' (Floating) |
| LBL_ps[2] | Sel Group | Vdd | Vdd (Floating) | Vers' (Floating) |
| | Unsel Group | Vdd | Vdd (Floating) | Vers' (Floating) |
| SEG[1] | | Vdd | Vdd (Floating) | Vers' (Floating) |
| SSL | Sel Block | Vdd-Vt | Vdd-Vt (Floating) | Vers' (Floating) |
| | Unsel Block | 0V (Floating) | 0V (Floating) | Vers' (Floating) |
| GSL | Sel Block | Vdd-Vt | Vdd-Vt (Floating) | Vers' (Floating) |
| | Unsel Block | 0V (Floating) | 0V (Floating) | Vers' (Floating) |
| WL | Sel Block | Sel WL | 0V | 0V | 0V |
| | | Unsel WL | Vdd-Vt | Vdd-Vt (Floating) | Vers' (Floating) |
| | Unsel Block | | 0V (Floating) | 0V (Floating) | Vers' (Floating) |
| LBL[1] | Sel Group | Vdd-Vt | Vdd-Vt (Floating) | Vers' (Floating) |
| | Unsel Group | Vdd-Vt | Vdd-Vt (Floating) | Vers' (Floating) |
| GBL | Sel Group | Vdd-Vt | Vdd-Vt (Floating) | Vers' (Floating) |
| | Unsel Group | Vdd-Vt | Vdd-Vt (Floating) | Vers' (Floating) |
| TPW | | 0V | 0V | Vers |

1) No SEC and LBL in Embodiment 1
2) Same as GBL_ps in Embodiment 1

Vers=20V, Vers'=Vers + (Vdd-Vt)

FIG. 14

| Dispersed Block Erase Operation Embodiment 1 & 2 (GIDL erase scheme) | | Erase Setup1 | Erase Setup2 | Erase Start |
|---|---|---|---|---|
| DIV_EN | Sel Group | Vdd | Vers | Vers |
| | Unsel Group | Vdd | Vers | Vers |
| | Sel Group | Vdd | Vers | Vers |
| | Unsel Group | Vdd | Vers | Vers |
| CSL | | Vdd-Vt | Vers | Vers |
| PRE | Sel Group | Vdd | Vers | Vers |
| | Unsel Group | Vdd | Vers | Vers |
| LBL_ps[2)] | Sel Group | Vdd | Vers | Vers |
| | Unsel Group | Vdd | Vers | Vers |
| SEG[1)] | Sel Group | Vdd | Vers | Vers |
| | Unsel Group | Vdd | Vers | Vers |
| SSL | Sel Block | Vdd-Vt | Vers' (Floating) | Vers' (Floating) |
| | Unsel Block | 0V (Floating) | Vers' (Floating) | Vers' (Floating) |
| GSL | Sel Block | Vdd-Vt | Vers' (Floating) | Vers' (Floating) |
| | Unsel Block | 0V (Floating) | Vers' (Floating) | Vers' (Floating) |
| WL | Sel Block / Sel WL | 0V | 0V | 0V |
| | Unsel WL | Vdd-Vt | Vers' (Floating) | Vers' (Floating) |
| | Unsel Block | 0V (Floating) | Vers' (Floating) | Vers' (Floating) |
| LBL[1)] | Sel Group | Vdd-Vt | Vers' (Floating) | Vers' (Floating) |
| | Unsel Group | Vdd-Vt | Vers' (Floating) | Vers' (Floating) |
| GBL | Sel Group | Vdd-Vt | Vers' (Floating) | Vers' (Floating) |
| | Unsel Group | Vdd-Vt | Vers' (Floating) | Vers' (Floating) |

Vers=20V, Vers'=Vers + (Vdd-Vt)

1) No SEC and LBL in Embodiment 1
2) Same as GBL_ps in Embodiment 1

FIG. 15

| | $\overline{SSL1}$ | SSL1 | $\overline{SSL2}$ | SSL2 | $\overline{SSL3}$ | SSL3 |
|---|---|---|---|---|---|---|
| Layer 1 | 1 | 0 | 1 | 0 | 1 | 0 |
| Layer 2 | 0 | 1 | 1 | 0 | 1 | 0 |
| Layer 3 | 1 | 0 | 0 | 1 | 1 | 0 |
| Layer 4 | 0 | 1 | 0 | 1 | 1 | 0 |
| Layer 5 | 1 | 0 | 1 | 0 | 0 | 1 |
| Layer 6 | 0 | 1 | 1 | 0 | 0 | 1 |
| Layer 7 | 1 | 0 | 0 | 1 | 0 | 1 |
| Layer 8 | 0 | 1 | 0 | 1 | 0 | 1 |

FIG. 21

NAND ARRAY HIARCHICAL BL STRUCTURES FOR MULTIPLE-WL AND ALL-BL SIMULTANEOUS ERASE, ERASE-VERIFY, PROGRAM, PROGRAM-VERIFY, AND READ OPERATIONS

1. CROSS-REFERENCES TO RELATED APPLICATIONS

This application claims priority to U.S. Provisional Application No. 61/858,611, filed Jul. 25, 2013, commonly assigned and incorporated by reference herein for all purposes.

Additionally, this application is related to U.S. patent application Ser. No. 14/316,936, filed Jun. 27, 2014, and U.S. patent application Ser. No. 14/283,209, filed May 20, 2014, commonly assigned and incorporated by references herein for all purposes.

This application is also related to U.S. Patent Application No. 2012/0051137 A1, U.S. Pat. Nos. 8,189,391, 8,169,826, 8,194,453, 8,203,882, 8,334,551, 8,148,763, 8,335,111, 8,437,192, and 8,461,000, and 8,488,382 on 3D NAND array architecture and operation.

2. BACKGROUND OF THE INVENTION

The present invention generally relates to advanced NAND memory technology. More specifically, the invention provides a repeatedly electrically erasable and programmable 2D or 3D NAND memory array comprising a unified multi-level hierarchical broken Bit Line (BL) structure that enables superfast and low-power Multiple Word Line (WL) and All-BL Simultaneous Erase, Erase-Verify, Program, Program-Verify and Read operations.

Conventionally, a 2D NAND flash includes several 2-dimensional (2D) planes on a common Triple P-well within a deep N-well on top of a common silicon P-substrate. When 2D NAND flash technology is scaled down below 2×nm for increasing NAND memory size, it hits the wall to meet the Moore's scaling law, good data reliability and short latency. The reliability issues include short data retention life cycle, high power-consumption and low Program, Erase and Read cycles. The slow latency issues include slow page-Read, page-Program, page-Program-verification, block-Erase and page-Erase-verification, etc.

The WL page size can be defined either in a large physical page size such as whole WL or a smaller logic size such as ½ or ¼ of a whole physical WL. The NAND's data storage types can be SLC, MLC, TLC, XLC or even an analog one that stores more than 16 states per one physical NAND cell, regardless of 2D or 3D NAND memory.

Recently, many new 3D NAND flash memory cells and array architectures have been proposed by using 3D transistors and Strings with a cylindrical column type structures such as a multiple-layer stacked vertical-channel (VCh1) 3D NAND technology from Toshiba, SanDisk and Samsung, or a vertical-gate (Vgat) NAND String technology from Samsung, and Macronix (Taiwan) and other 3D NAND flash technologies from Hynix, and Micron.

Although a 3D NAND flash memory has many advantages to use the less advanced technology nodes to increase NAND density over 1 Tb with a smaller silicon area than 2D NAND, it encounters new process disadvantages such as high aspect ratio, stair-case etching etc, more WL disturbance and new challenges to use the new scheme of gate-induced-drain-leakage (GIDL) current to erase the 3D NAND flash cells, etc.

Irrespective of 2D or 3D NAND flash pros and cons under development, there are many common long-held old and new problems not being completely solved and instead being mitigated when further scaling below 2×nm. For example, the conventional 20-year good SBPI (Self-Boosting-Program-Inhibit) scheme has been found un-reliable in Program and Program-Inhibit operations due to larger proximity coupling effects such as the charging and discharging of adjacent BL-BL coupling noises.

In other words, the conventional SBPI operations are strongly affected by the stored Vts of two surrounding NAND cells dispersed in the adjacent left and right BLs. These coupling noise effects greatly degrade the NAND data reliability and integrity, thus more errors and less P/E/R cycles are produced. As a result, more sophisticated ECC algorithms are required to use those NAND memories made of more advanced nodes below 3×nm.

As NAND density will be quickly exceeding 1 Tb with the circuit layout scaled down to 10 nm or below, more power consumptions and latencies in Read, Program, and Erase operations are commonly found in product specs. It is desirable to improve NAND memory technology to solve the above problems. The present invention provides a superfast, superior, and unified broken-BL hierarchical NAND array structure plus DRAM-like BL Charge-sharing and Sensing plus a novel Recall circuit aimed for implementing Multiple-WL and All-BL simultaneous Erase, Erase-Verify, Program, Program-Verify, and Read operations on today's 2D and 3D NAND flash designs without cell and process changes, as described throughout the specification and all figures.

3. BRIEF SUMMARY OF THE INVENTION

This invention relates to advanced NAND memory technology. More specifically, the invention provides a 2D or 3D HiNAND memory array including a unified multi-level hierarchical broken-Bit-Line (BL) structure configured to be repeatedly electrically erasable and programmable for enabling superfast and low-power Multiple Word Line (WL) and All-BL Simultaneous Erase, Erase-verify, Program, Program-verify, and Read operations. Due to very broad aspects of the combinational architectures of HiNAND arrays of the present invention, the following summary cannot include all key features of the inventions. Thus the summary below should not be treated as a limitation of the present invention. One of skilled in the field should recognize many variations and alternatives within the scope of claims herein.

When HiNAND array uses only one preferred tight 2λ vertical metal1 for a 1-level BL array scheme, then it is referred as HiNAND1. When HiNAND array uses two preferred vertical tight 2λ metal1 and 2λ or 4λ metal2 lines if odd/even GBL scheme is used for a 2-level BL architecture, then it is referred as HiNAND2. Accordingly, when HiNAND array uses one vertical tight 2λ metal1, but less tight metal2 and metal3 for a 3-level BL architecture, then it is referred as HiNAND3. All above HiNAND2 or HiNAND1 arrays use a horizontal metal0 for connecting the common source nodes of a plurality of NAND Strings and $V_{inhibit}$ power supply lines. HiNAND3 has been filed by the same inventors of this application, thus the details are skipped here.

For description simplicity, the term of "Multiple-WL and All-GBL simultaneous Operations" is simply used to represent "Multiple-WL and All-GBL simultaneous Erase, Erase-Verify, Program, Program-verify and Read Operations" for the subsequent description below.

The first objective of the present invention is to propose a 1-level broken metal1 global bit line (GBL) hierarchical structure for a HiNAND1 array to perform the preferred Multiple-WL and All-GBL simultaneous operations. The HiNAND1 array includes J NAND Groups with J−1 Group-divided transistors MGBL extending from array top to bottom in GBL or Y-direction, connected by one broken-GBL metal1 line associated with a broken parasitic capacitor $C_{GBL}$. Each HiNAND1 Group is further divided by L Segments in series with L−1 Segment-divided NMOS transistors of MDBLp and each Segment is comprised of K identical NAND Blocks, with layout extending in Y-direction. Lastly, each NAND Block is further comprised of N identical NAND Strings cascaded in WL or X-direction. J, L, K, and N are integers. Each NAND-String includes M 2D NMOS NAND cells in series with one top String-select transistor MS and one bottom String-select transistor MG. The value of M can be 8, 16, 32, 64, 128 or any arbitrary integer number. In this application, one String includes 64 WLs or NAND cells as an example. Each physical NAND cell can store 2-state SLC, 4-state MLC, 8-state TLC or 16-state XLC or even 256-state analog values.

In an embodiment, the length of each metal1 GBL line extending one HiNAND1 Group is the longest metal1 line unit for charge-sharing simultaneous Multiple-WL Read operation of the HiNAND1 array. Thereby, this metal1 line is preferably referred as a broken Group metal1 line. Additionally, each broken Group metal1 line per Group can be further divided into L smaller broken Segment metal1 lines by L−1 Segment-divided NMOS transistors of MDBLp. Thus, the length of broken Segment metal1 line associated with one Segment is 1/L of each broken Group metal1 line. The broken Segment metal1 line is located at a same level topologically as the broken Group metal1 line.

In another embodiment, the length of each broken Segment metal1 line extending one HiNAND1 Segment is the shortest metal1 line unit for simultaneous Multiple-WL Program operation of HiNAND1 array.

The second objective of the present invention is to propose a 2-level broken GBL/LBL hierarchical structure for a HiNAND2 array to perform preferred Multiple-WL and All-GBL simultaneous operations. Like HiNAND1 array, the HiNAND2 array includes of similar J NAND Groups in series, extending from array top to bottom in BL or Y-direction, connected by one broken Group metal2 GBL line associated with a parasitic capacitor $C_{GBL}$. Note, the length of each broken Group metal2 GBL line extending one HiNAND2 Group without being further broken like the HiNAND1 Group mentioned before is the longest metal2 line for charge-sharing simultaneous Multiple-WL Read operation of HiNAND2 array. But each broken Group metal2 GBL line at top level is further connected in parallel to L metal1 LBL lines located at bottom level. Each metal1 LBL line is associated with one Segment in one Group of the HiNAND2 array. Each Group includes L Segments. Thus, the length of each metal1 LBL line is about 1/L of each broken Group metal2 GBL line. Alternatively, each metal1 LBL line can be further divided to n metal1 broken-LBL lines, each of them can be the shortest metal1 line for simultaneous Multiple-WL Program operation of the HiNAND2 array. In other words, each Segment is divided into n sub-Segments and each sub-Segment includes K identical NAND Blocks extended in Y-direction. Each Block is further comprised of N identical NAND Strings cascaded in WL or X-direction. Each NAND String includes M NMOS cells in series with one top String-select transistor MS and one bottom String-select transistor MG. J, L, n, K, M, and N are integers. Preferably, J=8 or 16, L=4, n≥4, K depends on memory density, M=64, and N=65,536 for 8 KB page. Again, each physical NAND cell, a 2D cell in this embodiment, can also similarly store 2-state SLC, 4-state MLC, 8-state TLC or 16-state XLC or even 256-state analog values.

The third objective is to propose a NMOS 1-poly MHV transistor MGBL, same type as typical NAND String-select transistors MS and MG, for dividing a large metal1 GBL line for the HiNAND1 array to J broken Group metal1 lines and similarly a NMOS 1-poly MHV transistor MDBLp for further dividing each broken Group metal1 lines to L smaller broken Segment metal1 lines. Alternatively, for the HiNAND2 array with 2-level BL hierarchical structure, it is to propose a similar MGBL transistor for dividing a large metal2 GBL line to J metal2 broken-GBL lines (capacitors) respectively associated to J Groups. Each metal2 broken-GBL line in a Group located at a top level is connected via L MLBLp transistors respectively to L smaller metal1 LBL lines located at bottom level and respectively extended over one of L Segments within the Group. It is proposed to have n−1 MDBLp transistors, similar to those used in HiNAND1 array, for dividing each smaller metal1 LBL line (or capacitor) of a Segment to n broken-LBL metal1 lines respectively associated with n sub-Segments Blocks. Each sub-Segment contains K Blocks, where J, L, K, n can be any integer number and J is preferred to be 8 and 16. As a result, this preferred 2-level broken-BL HiNAND2 array, regardless of 2D or 3D configuration, is comprised of J Groups with J×L Segments and J×L×n×K Blocks in Y-direction. Again, each Block is further comprised of N identical NAND Strings cascaded in WL or X-direction. Additionally, one or more metal0 power lines GBLps and Vss lines CSL are laid out in X-direction for the HiNAND1 array and several power lines LBLps and Vss lines CSL are also laid out in X-direction for the HiNAND2 array.

The fourth objective of present invention is to propose that one end of each metal1 broken GBL line (capacitor) of HiNAND1 array is preferably connected to one corresponding horizontal metal0 power line, GBLps, through a 1-poly NMOS MLBLs transistor (same type of transistor like MS and MG transistors). In other words, one metal0 GBLps line is associated with one Segment per each Group in the HiNAND1 array. Each common metal0 GBLps line has two purposes. The first purpose is used as a power supply line for the HiNAND1 array in initial precharge operation on all selected broken Group/Segment metal1 lines to charge the corresponding broken GBL capacitors up to $V_{inhibit}$ voltage during Multiple-WL and All-BL operations. In contrast, the second purpose is used as a Vss line to discharge each selected Segment and Group lines or capacitors.

The fifth objective of present invention is to propose that one end of each bottom-level metal1 LBL line (or capacitor) of a Segment in the HiNAND2 array is preferably connected to one corresponding common metal0 power line, LBLps, per Segment through a NMOS 1-poly transistor MLBLs (like String-select transistors MS and MG). The other end of each bottom-level metal1 LBL line of the Segment is preferably connected to one top-level metal2 broken GBL line through a MHV NMOS transistor MLBLp. All the smaller metal1 LBL lines associated with L Segments in the Group are connected in parallel to each corresponding larger metal2 broken GBL line (or capacitor). The metal1 LBL line of the Segment can be further divided into n broken-LBL metal1 lines by n−1 transistors MDBLp, each metal1 broken-LBL line belonging to a sub-Segment associated with a broken-LBL capacitor. One metal0 line LBLps connects commonly to each broken-LBL metal1 line respectively via a transistor MLBLs in the HiNAND2 array. Firstly, the LBLps line is used as a power supply line for the HiNAND2 array in initial precharge operation to charge all selected metal1 broken-LBL lines up to $V_{inhibit}$ voltage at the LBL capacitors during the Multiple-WL and All-BL operations. Secondly, the LBLps line is used as the Vss line to discharge each selected broken Segment and Group lines (or capacitors).

The sixth objective of present invention is to propose that each top-level metal2 broken-GBL line in HiNAND2 or broken Group metal1 line in HiNAND1 array is a N-bit BL flexibly connected to either 1-sided N-bit Page Buffer (PB) circuit or 2-sided N-bit PB circuit for an evenly power-saving distribution and faster speed performance for the preferred Multiple-WL and All-GBL simultaneous operations.

In an embodiment, the bit number of the PB can be made same as N-bit GBLs in one physical WL. In this scheme, the one physical N-bit page data trapped in the corresponding broken Group N-bit GBL capacitor or broken Segment N-bit LBL capacitor from a N-bit PB just needs 1-cycle of 1-page loading either from the top-side PB or the bottom-side PB of the HiNAND array.

In another embodiment, the bit number of either 2-sided or 1-sided PB can be made of N/2-bits, which is only one-half of N-bit of GBLs in one physical WL. In this scheme, the whole one physical N-bit WL's data trapped in the corresponding broken Group N-bit GBL capacitors from a N/2-bit PB needs 2-cycle of half-page data loadings so that whole Multiple Full-WL, All-BL Program and Erase can still be performed either from the top-side PB or the bottom-side PB.

The seventh objective of present invention is to propose that each top-level metal2 N-bit broken-GBL lines (capacitors) in a HiNAND2 array and the metal1 broken-GBL lines (capacitors) in a HiNAND1 array is preferably divided into two equal halves with a N-bit PB preferably being placed in the middle of either the HiNAND2 or the HiNAND1 array with two sets of N-bit outputs. The first set of N-bit outputs connect upward to the first N-bit GBL of top half of the HiNAND2 array and the second set of N-bit outputs connect downward to the second N-Bit GBL of bottom half of the HiNAND2 array. In this scheme both top and bottom half of HiNAND2 arrays can be performed the Multiple Whole-WL and All-GBL Program, Program-Verify, and Read operation simultaneously in 1-cycle.

The eighth objective of the present invention is to propose a preferred method to determine an optimal number J of all broken GBL lines or capacitors per column of a HiNAND1 array. The optimal number of J is mainly determined by the latency and reliable charge-sharing operations of Read and Program-Verify operations rather than by Program operation.

For a Multiple-WL and All-GBL Read and Program-Verify operations, the number of broken GBLs is determined by a preferred ratio R(HiNAND) of the farthest, relative to a 1-sided N-bit PB, Jth broken GBL capacitance to the sum of total J GBL capacitances when all the J–1 divided transistors MGBLs are turned on the same time to allow the N-bit sensed All-GBL data voltages to pass from the Jth GBL capacitor to the N-bit PB through J–1 GBL capacitors for N-bit data simultaneous evaluation. The preferred ratio R(HiNAND) equals to $1 \times C_{GBL}/ \times C_{GBL} = 1/J$, where $10 \leq J \leq 20$. The value of J below 10 is better for charge-sharing DRAM-like SA but at the expense of larger overhead with increasing number of MGBL transistors. Note, R(HiNAND)=R(DRAM), which is defined as a ratio of each DRAM cell capacitance to each DRAM BL capacitance and typically less than 1/20. Regardless of the HiNAND2 and HiNAND1 arrays, the preferred values of J are J=8 or 16.

The ninth objective of the present invention is to propose a preferred method to determine an optimal number L of all metal1 LBL lines (or capacitors) per HiNAND2 Group. The optimal number L is determined by the power-consumption of the preferred Program-Inhibit scheme by precharging a $V_{inhibit}$ voltage on the selected N-bit metal1 LBL capacitors within the selected Segments of a Group in the HiNAND2 array for less power consumption in Read and Program-Verify operations. In a specific embodiment, the preferred value of L is determined by an equation J/L=4 per four Segments for each metal2 broken-GBL line or capacitor for a preferred Multiple Whole-WL and All-GBL Read and Verify operations. In other words, each top level metal2 broken-GBL line of a Group is connected in parallel to four bottom-level metal1 LBL lines associated with 4 Segments. Each metal1 LBL line of a Segment is preferably divided into $n \geq 4$ metal1 broken LBL lines respectively associated with n sets of K Blocks for precharging to $V_{inhibit}$ voltage on the selected smaller N-bit metal1 broken-LBL capacitors within the selected Segments of a Group in the HiNAND2 array for less Program power consumption. Each Block includes N identical NAND Strings cascaded in WL or X-direction. The preferred length of each metal1 broken LBL line is the length of K 2D HiNAND cell Strings in Y-direction (where n typically is 4 and K is any integer depended on area density of the flash memory chip).

The 10th objective of the present invention is to propose a preferred n bottom-level broken-LBL metal1 lines per each NAND Segment, each broken-LBL metal1 line being associated with a parasitic line capacitor, $C_{LBL}$. There are two preferred ways to form this broken-LBL metal1 line. In a first embodiment, each Group associated with a broken-GBL metal2 line overlaps with L Segments and each Segment includes L smaller LBL metal1 lines in the HiNAND2 array. Each Segment is divided into n sub-Segment. In other words, the total number, m, of broken-LBL metal1 lines per GBL column (Y-direction) per Group is m=L×n, where each sub-Segment has a broken-LBL metal1 line. Each broken-LBL metal1 line connects in parallel to K HiNAND Strings in Y-direction. Note, the HiNAND String is the same as conventional NAND String in terms of String length in this application. But only one top $C_{LBL}$ capacitor of the n broken-LBL metal1 lines or capacitors per Segment is preferably connected to the top-level metal2 broken-GBL line through a MHV 1-poly NMOS transistor MLBLp with its gate being tied to a control signal, such as SEG_1[1], . . . , or SEG_1[L], in each selected Group J, respectively. In addition, only one bottom $C_{LBL}$ capacitor of the n broken-LBL metal1 lines per Segment is preferably connected to a bottom metal0 line LBLps_1[L] laid in X-direction through a MHV 1-poly NMOS transistor MLBLs with its gate being tied to one signal, such as PRE_1_n[1], . . . , or PRE_1_n[1:L], in each selected Group J, respectively. In an alternative embodiment, the number of LBLps lines can be increased n times to have one LBLps line per K Blocks.

The 11th objective is to use a NMOS MHV voltage device as the one used as String-select transistor MS (or MG) in conventional NAND for each of MDBLp and MLBLs transistors for forming broken GBLs or broken LBLs in the preferred HiNAND1 and HiNAND2 arrays of the present invention. Other HV device meeting BVDS spec higher than MHV MS and MG can also be used.

The 12th objective is to have a flexibility to divide each broken-GBL or broken-LBL lines in equal and unequal lengths and capacitances in all 2D and 3D HiNAND arrays. In an embodiment, the length of those farthest GBL or LBL lines (or capacitors) relative to a page buffer (PB) at one end of the HiNAND array are preferably made much larger than those in a Group nearest to the PB for a less dilution of charge-sharing voltages for superior DRAM-like sensing scheme used in the HiNAND array. For example, the length of farthest Segment or Group BL line can be made 4×longer than the nearest Segment BL line in each Group or nearest Group BL line relative to the PB.

The 13th objective of the present invention is to differentiate J Groups with different Read latencies and power-consumption in an one-sided N-bit or N/2-bit PB of the HiNAND2 and HiNAND1 array. Because the Group 1 is the nearest Group to the top-sided PB, it is a HiNAND Group with the fastest operation and the least power-consumption. The Group J is farthest Group from the top-sided PB, thus it is termed as a HiNAND Group with the slowest operation and the highest power-consumption. For example, for reading Operation System code programs, it requires least Read latency upon power-up cycle so that its data are preferred to be stored in the Group 1.

The 14th objective of the present invention is to differentiate J Groups with different Read latencies and power-consumption in a 2-sided N-bit or N/2-bit PB HiNAND2 and HiNAND1 array. The Group 1 and Group J are nearest to the top PB and bottom PB respectively, thus both Group 1 and Group J are termed as the fastest NAND Group with the least power-consumption. The middle Group(s), Group J/2 and Group J/2+1, are the farthest Groups from both top and bottom PBs, thus they are termed as the slowest NAND Groups with the highest power-consumption. For example, for reading Operation System code programs, it requires least Read latency upon power-up cycle so that its data are preferred to be stored in the Group 1 and Group J.

The 15th objective of the present invention is to precharge and discharge each selected metal2 broken-GBL line and each corresponding metal1 broken-LBL line through the one pair of transistors MLBLp and MLBLs so that no extra power-line like LBLps_J is required for each metal2 broken GBL capacitor in HiNAND2 array to save layout area. For fully passing the $V_{inhibit}$ voltage from a selected metal0 line LBLps to each metal1 LBL capacitor, the gate voltages of MLBLs transistors, PRE_1_1[1]==PRE_1_1~n[L], are applied with $V_{inhibit}$+Vt+$V_{margin}$, where $V_{margin}$≥0.5V and control signal SEG_1[1] is applied with Vss to disconnect each metal2 broken GBL line from the corresponding metal1 broken LBL line.

The 16th objective of the present invention is to disclose a preferred Read, Program, and Program-Inhibit schemes for HiNAND array to save power consumption and to perform faster Multiple-WL and All-BL simultaneous Program operation. This simultaneous Multiple-WL and All-BL Program operation can be successfully implemented by precharging all selected N-bit metal1 broken LBL lines first with a $V_{inhibit}$ voltage (up to about 7V) from only one selected metal0 LBLps line and then discharging part of the N-bit metal1 broken LBL lines selectively based on the data "zero" sent by the PB from selected metal2 broken GBL lines through the corresponding MLBLp transistors. The precharged $V_{inhibit}$ voltage would be retained in the remaining part of the N-bit LBL lines if the corresponding data from the PB are "one."

After the completion of discharge/non-discharge operation of first N-bit metal1 LBL capacitors of a first page data, the Program and Program-Inhibit page data is then locked therein. The Multiple-WL Program and Program-Inhibit data would be repeatedly locked in or trapped in the remaining selected N-bit metal1 LBL capacitors. Once all the selected WL Program and Program-Inhibit data being successfully stored in the corresponding pages of N-bit metal1 BL capacitors, then a set of Vpgm (15V to 25V) and Vpass (10V) for one selected and 63 non-selected WLs per String would be applied to all selected Blocks for simultaneous Multiple-WL Program (assuming each Block comprising of 64 NAND cells connected in series with two String-select transistors of MS and MG).

The 17th objective of the present invention is to disclose a preferred Multiple Whole-WL and All-BL simultaneous Read operation. This simultaneous Read operation can be successfully implemented by precharging all the selected N-bit metal1 LBL capacitors in HiNAND2 array first with a $V_{inhibit}$ voltage of Vdd reversely from only one selected LBLps line through a MLBLs transistor to each selected N-bit LBL line, and then through the divided transistor MDBLp (turned on) along the path of metal1 LBL line to reach the broken LBL capacitor and then through the corresponding NMOS MHV MLBLp transistor to the selected metal2 broken-GBL capacitor. Thus the conventional N-bit all-GBL precharged Vdd voltages are not from the N-bit PB through the long and heavy unbroken metal2 GBL line. Instead, the Read precharged voltage is directly coupled from only one selected metal0 power line LBLps in X-direction to the N-bit smaller metal1 LBL lines (capacitors) for achieving dramatic power reduction.

Afterwards, the precharged $V_{inhibit}$=Vdd on the N-bit metal1 LBL capacitors will be selectively discharged to 0V by the stored "1" data in the multiple selected WLs in the multiple selected Blocks in the multiple selected Segments of one or more selected Groups.

This simultaneous Multiple whole-WL and All-GBL Read operation can be started after the completion of trappings of $V_{inhibit}$ voltage on all multiple selected metal1 LBL lines (capacitors). The final non-discharged $V_{inhibit}$ voltage in all N-bit LBL capacitors in multiple Blocks would be dumped to the corresponding broken GBL capacitors in a predefined order for a DRAM-like charge-sharing Read scheme. A preferred charge-sharing Sense Amplifier (SA) operation can be done with an analog voltage reduced from the $V_{inhibit}$ voltage which is then amplified by a Multiplier and sent to DRAM latch-type SA for final N-bit data simultaneous evaluation. The preferred order of charge-sharing operation and SA data evaluation for each broken GBL capacitor is started from the top Group 1 which is the nearest to the PB. After the Group 1 is read into the PB, the broken-GBL capacitor voltage in Group 1 has to be reset to Vss and ready for the next GBL charges from Group 2 with the voltage diluted by half before being fed to the Multiplier. Accordingly, the Jth GBL capacitor's $V_{inhibit}$ voltage would be dumped into the longest GBL line with 1/16 $V_{inhibit}$ dilution before fed to the Multiplier and then SA for final data evaluation.

The 18th objective of the present invention is to disclose two preferred sets of the 64-WL biased Program and Program-Inhibit (PI) voltages along with the preferred $V_{inhibit}$ voltages on each LBL capacitor for a HiNAND array that is comprised of a plurality of 64-cell NAND Strings in each NAND Block. These two preferred PI schemes includes a) using SBPI scheme with $V_{inhibit}$=Vdd and $V_{program}$=VSS for the HiNAND Program operation, and b) using non-SBPI scheme with $V_{inhibit}$>Vdd and $V_{program}$=VSS for the HiNAND Program operation. Note: SBPI stands for Self-Boosting-Program-Inhibit.

The 19th objective of the present invention is to disclose a preferred Dispersed Block architecture for the 2D HiNAND array as oppose to the conventional Consolidated Block scheme for 2D NAND. In this preferred Dispersed 2D HiNAND Block, one or more dispersed WLs of K WLs can be flexibly selected for simultaneous Erase operation with the same Erase conditions such as TPW=20V, with the selected $V_{WL}$=0V and $V_{SSL}$=$V_{GSL}$ at floating to reduce the selected cells' Vt=Vte≤−0.7V. A preferred set of Erase biased conditions for this HiNAND array such as SSL and GSL lines and SEG lines, PRE lines, DI lines and DIV_EN lines will be shown. The values of K=16, 32, 64, 128 or any integer number. In an embodiment, the Erase operation of the 2D HiNAND flash cell uses a FN-channel tunneling scheme.

The 20th objective of the present invention is to disclose a preferred Dispersed Block architecture for a 3D HiNAND array as oppose to the conventional Consolidated Block scheme for 3D NAND. In this preferred Dispersed 3D HiNAND Block, similarly, one or more dispersed WLs of K WLs can be flexibly selected for simultaneous Erase operation with the same Erase conditions to reduce the selected cells' Vt=Vte≤−0.7V. The values of K=16, 32, 64 or any integer number. But the Erase operation of the 3D HiNAND flash cell uses preferred GIDL hot-hole injection scheme to raise the 3D flash cell channel's polysilicon bulk potential against 0V WL voltage to tunnel the stored electrons in a 3D flash cell charge-trapping layer for its Vt reduction.

The 21th objective of the present invention is to disclose a preferred set of biased voltage conditions for multiple selected WLs, the multiple remaining unselected WLs, and the multiple selected and unselected SSL and GSL lines and SEG lines, PRE lines, DI lines and DIV_EN lines for this Multiple Whole-WL and All-GBL simultaneous Erase-Verify operation of the preferred HiNAND array.

The 22th objective of the present invention is to disclose two preferred Erase schemes that will be used in 3D HiNAND array. The first Erase scheme is like the traditional 2D NAND that applies 20V in NAND's bulk TPW to perform reverse FN-channel Erase to remove the electrons in the floating-gate to reduce the NAND's Vt. The second Erase scheme is to use either top or bottom or both 3D select transistors in a 3D HiNAND String in the 3D HiNAND array to generate a high GILD hole current to increase the selected flash bulk voltage to a level such as $V_{erase}=20V$ to remove electrons in the charge-trapping layer.

The 23th objective of the present invention is to disclose both above preferred Erase schemes plus the preferred decoding circuits, one WL or more than one WL or whole WLs Erase and Erase-Verify operations can be flexibly and simultaneously performed in both Consolidated and Dispersed Blocks of 2D and 3D HiNAND arrays.

The 24th objective of the present invention is to disclose a preferred new Block decoder with an additional Latch circuit to have the flexible Set and Reset functions to allow independently and randomly selecting one or more Block decoders for the preferred Multiple-WL and All-GBL simultaneous operations for both 2D and 3D HiNAND arrays.

The 25th objective of the present invention is to disclose a preferred new circuit of Broken GBL and LBL decoders to allow independently and randomly selecting one or more rows of the broken-GBL transistor MGBL and the broken-LBL transistor MDBLp. In order to have a full passage of voltages up to 7V in GBL and LBL, the GBL and LBL drives need to output a HV on the control signals of DIV-EN and DI_1.

The 26th objective of the present invention is to disclose a preferred new circuit of LBLps line to supply the following voltages to metal1 LBL capacitor: a) LBLps=$V_{inhibit}$ for LBL's Program-Inhibit voltage, where Vdd≤$V_{inhibit}$≤7V; b) LBLps=$V_{inhibit}$ for LBL's Read, Erase-Verify, and Program-Verify precharged voltage, where $V_{inhibit}$=Vdd; c) LBLps=Vss for discharging the LBL capacitors or the corresponding GBL capacitors.

The 27th objective of the present invention is to disclose a preferred set of voltages for one selected WL and multiple unselected WLs along with a preferred set of Vss and $V_{inhibit}$ for all BLs in the selected Blocks so that a random multiple-WL and All-BL simultaneous Program and Program-Verify operations can be achieved for both HiNAND1 and HiNAND2 arrays.

The 28th objective of the present invention is to disclose a flow scheme and circuit for performing a preferred Multiple Whole-WL and All-GBL simultaneous Read operation. The operation requires only one N-bit Cache PB for a N-bit SLC Read, two N-bit Cache PB for a 2×N-bit MLC Read, three N-bit Cache PB for a 3×N-bit TLC Read, and four N-bit Cache PB for a 4×N-bit XLC Read by using a new scheme of "Recall" along with the one or more levels broken-BL hierarchical structure that inherently has many existing pages of available N-bit LBL capacitors to temporarily store K×N-bit page-data (regardless of SLC, MLC, TLC and XLC) of multiple selected WLs without overheads of the extra data registers.

The 29th objective of the present invention is to disclose a technique to use existing free multiple N-bit pages of Sample-and-Hold (S&H) LBL capacitors as Dynamic Cache to temporarily store the multiple-WL page data (in Segments of a Group) near the N-bit PB, rather than to store in multiple pages of real Cache Registers as used in conventional NAND, to save silicon area. The total numbers of rows or pages of N-bit S&H circuit depend on types of storages data. Typically one row of N-bit S&H LBL capacitors for N-bit SLC storage data, while two rows of N-bit S&H circuit for N-bit MLC storage data, three rows of N-bit S&H circuit for N-bit TLC storage data and lastly four rows of N-bit S&H circuit is for N-bit XLC storage data.

The 30th objective of the present invention is to disclose a preferred Rotation capacitor assignment with n rotation Dynamic Cache Registers and one Dynamic PB per multiple-state storage data in the HiNAND array. The value of n is subject to the NAND storage type. For example, for SLC, n=1, MLC, n=2, TLC, n=3 and XLC n=4. One N-bit Dynamic Cache Register is to store N-bit one-WL Program pattern, while one N-bit Dynamic PB is to store one-WL N-bit Program and Program-Inhibit pattern. The Rotation capacitor assignment is based on one Group size of n+1 N-bit LBL capacitors or n+1 WLs for one Dynamic PB and n Dynamic Cache Registers in the HiNAND array. During the progression of Multiple-WL Program, the selected WL is shifted or rotated from first WL to the final WL. Thus the only one Dynamic PB for each selected WL has to be shifted inside n+1 WLs. The details will be explained in accordance with FIG. 4A and FIG. 4B of this application.

The 31th objective of the present invention is to disclose a novel Recall function, which is defined as a DRAM-like page-based Read operation to allow the sensing of 1-page program voltage data stored in one designated page of Dynamic Cache Register by a PB located at top or bottom of the HiNAND array during this preferred Program-Verify operation. The Recall operation is performed directly to read the N stored voltages in accordance with the program page data loaded from I/O, as oppose to the program-verify that reads cell's stored analog Vt from the selected WLs. The required number of Dynamic Cache Registers for this broken-BL hierarchical HiNAND array is determined by the storage types. For SLC, only 1 Dynamic Cache Register is required, while for MLC, 2 Dynamic Cache Registers are required, TLC needs 3 Dynamic Cache Registers and TLC needs 4 Dynamic Cache Registers.

This preferred Recall operation is performed through using a first step of a DRAM-like Charge-sharing (CS) Read between one accessed $C_{SEG}$ with up to J×$C_{GBL}$ (assuming the array is divided into J broken Groups), then performing a second step of a Multiplier's analog voltage amplification and lastly a third step of a Latch-type SA's full digital amplification to recall the previously stored 1-page program data back to Static-PB in one read cycle of the present invention.

For a proper Read of two distinct diluted voltage data pattern such as, Vdd/J vs 0V or $V_{inhibit}$/J vs. 0V after CS, the ratio of 1/J value is preferred set to be not smaller $\frac{1}{16}$ as adopted by a DRAM Read.

The 32th objective of the present invention is to disclose several preferred PI (Program-Inhibit) schemes for this HiNAND array, regardless of 2D or 3D technologies. The key difference between HiNAND Program and NAND Program is that each N-bit Page data of $V_{inhibit}$ and Vss of each WL data are not directly controlled remotely by the N-bit PB through each long GBL as in conventional NAND dealing with one WL Program only, instead, in the HiNAND with Multiple whole-WL and All-GBL Program scheme, the multiple page data in $V_{inhibit}$/Vss patterns of the selected multiple WLs are allowed to be latched or stored in multiple steps in selected metal1 LBL capacitors in the selected Segments and Groups. Thus the simultaneous multiple whole-WL and All-BL Program operation becomes feasible without causing any data contention in the shared N-bit PB.

The 33th objective of the present invention is to disclose several preferred PI (Program-Inhibit) schemes for this HiNAND array, regardless of 2D or 3D technologies. The key differences between HiNAND Program and NAND Program are summarized below:
 a) $V_{inhibit}$ voltage≥7V is a much higher initial voltage in selected HiNAND cell's channel voltage $V_{ch1}$ than Vdd used in the conventional NAND cell supplied from a N-bit PB.
 b) Vpass=10V to obtain the highest $V_{ch1}$ before Program is initiated.
 c) Multiple randomly WLs are selected for concurrent Program from multiple dispersed Blocks on a basis of one-WL per one Block, each of the multiple dispersed Blocks belonging to different sub-Segment associated with a broken-LBL capacitor, each sub-Segment being selected randomly to same or different Segments of the same or different Groups.

This is termed as Multiple random-WL Program in the Dispersed NAND Blocks. A higher PI's $V_{inhibit}$ voltage is used by HiNAND array in the beginning of the page Program.

The 34th objective of the present invention discloses that all the above mentioned objectives, techniques, broken-BL hierarchical structures in 2D HiNAND flash array can be similarly applied in various 3D NAND arrays and technologies for the preferred Multiple-WL and All-GBL simultaneous Program, Read, Erase-Verify, and Program-Verify operations. The conventional 3D NAND technologies include 1) The vertical-channel 3D NAND technologies from Toshiba's BiCS and PiCS Vertical-channel NAND, Samsung's TCAT, and Hynix's DC-SF; 2) The vertical-gate 3D NAND technology from Samsung, Macronix, etc. In 2D HiNAND architecture, the optimal length of capacitance of each broken metal1 LBL line is optimally set around four 2D HiNAND Strings for the tradeoff between the overhead of added MLBLps MHV devices and PI precharge-current. But in 3D HiNAND flash architecture, the length of each LBL line of four or more 3D NAND Strings takes less area, thus less capacitance. As a result, it should be increased to more than 8 Strings to increase corresponding 3D broken LBL capacitance. Similarly, each broken GBL capacitance is reduced due to the 3D HiNAND Strings takes less area.

The 35th objective of the present invention is to disclose all above proposed 2-level broken BL HiNAND2 array can be reduced to 1-level broken BL HiNAND1 array only with metal1 broken GBL lines for different and high-density memories such as NOR array, SARAM array, DRAM array, PLD array, CAM array, and ROM array. This 1-level divided GBL architecture with segmented DGBL capacitance would result in faster read speed. For those cells read from the selected divided GBL capacitance near SA would have the highest read speed. For those cells located in the other end of column farthest away from SA would have the slowest read speed. The MGBL device used for dividing each long GBL line can be made of LV NMOS device in DRAM, SARAM and CAM and PLD designs with a larger channel width to reduce the pass resistance for not affecting the read BL delay.

4. BRIEF DESCRIPTION OF THE DRAWINGS

Figure 2A:
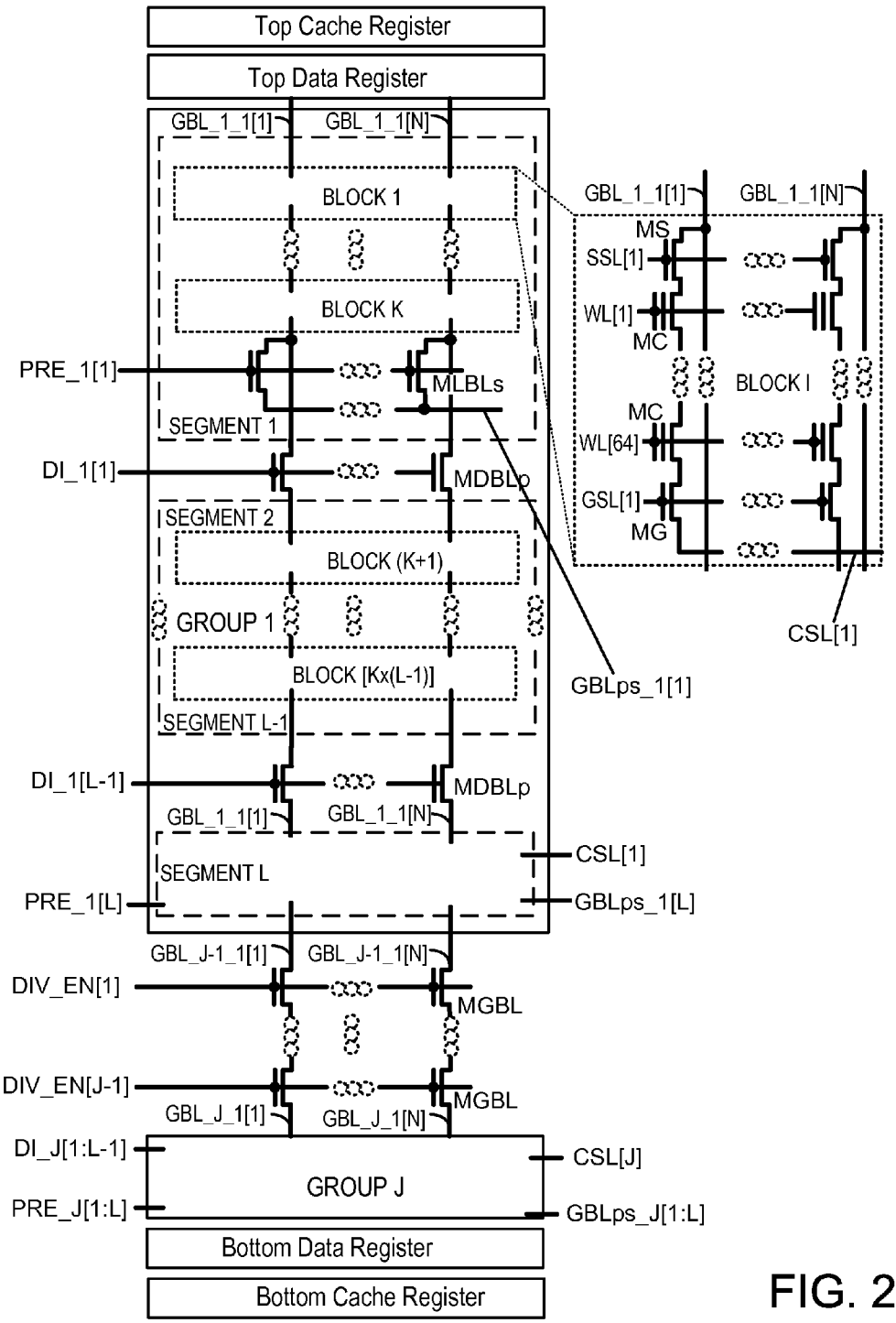
FIG. 2A is a circuit diagram of a 2D HiNAND1 array including 1-level hierarchical broken-GBL structure for multiple-WL and All-GBL simultaneous Erase, Erase-verify, Program, Program-Verify, and Read operations according to a specific embodiment of the present invention.
Figure 2B:
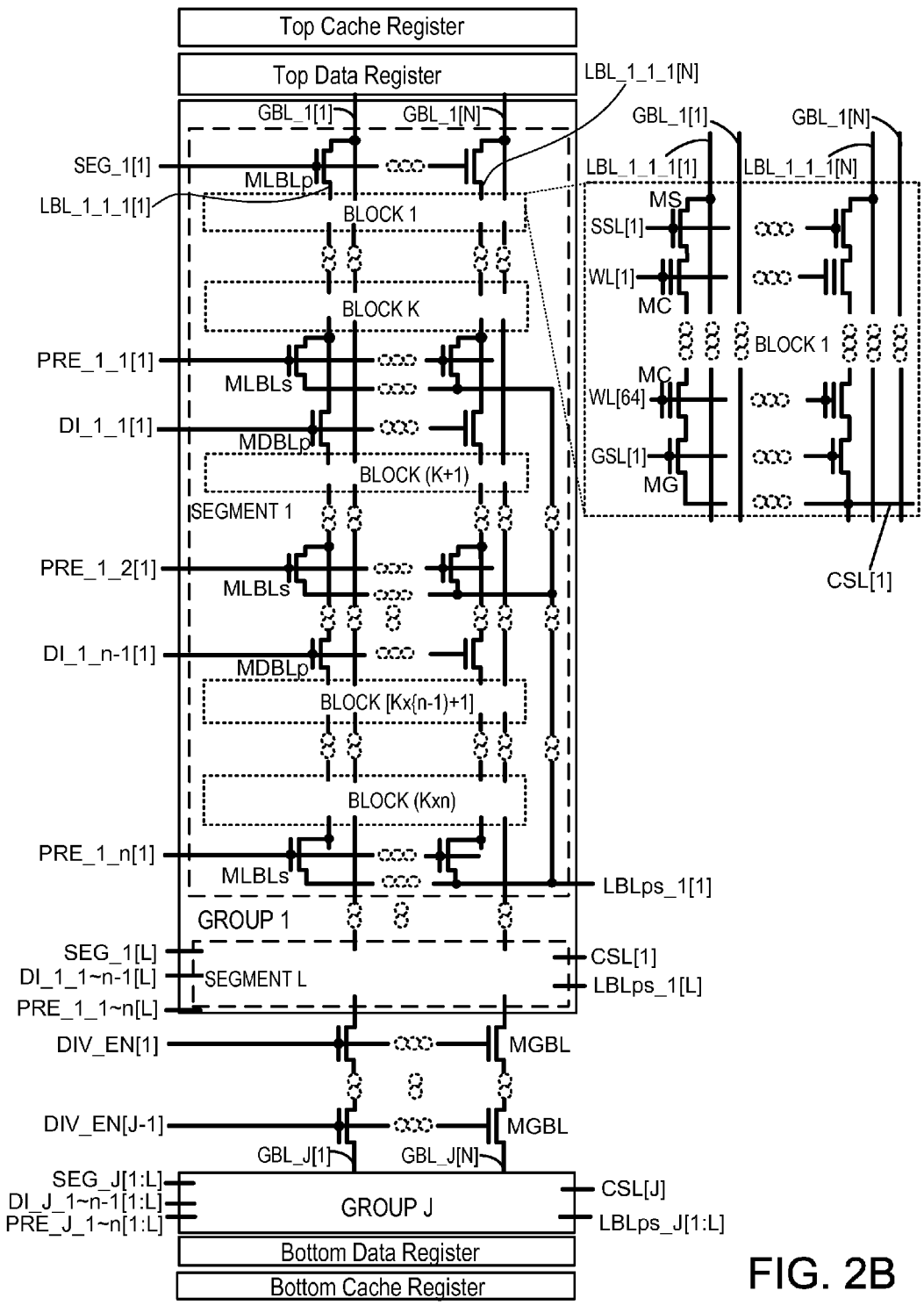
FIG. 2B is a circuit diagram of a 2D HiNAND2 array including 2-level broken-BL hierarchical structure for multiple-WL and All-GBL simultaneous Erase, Erase-Verify, Program, Program-Verify, and Read operations according to another specific embodiment of the present invention.
Figure 4A:
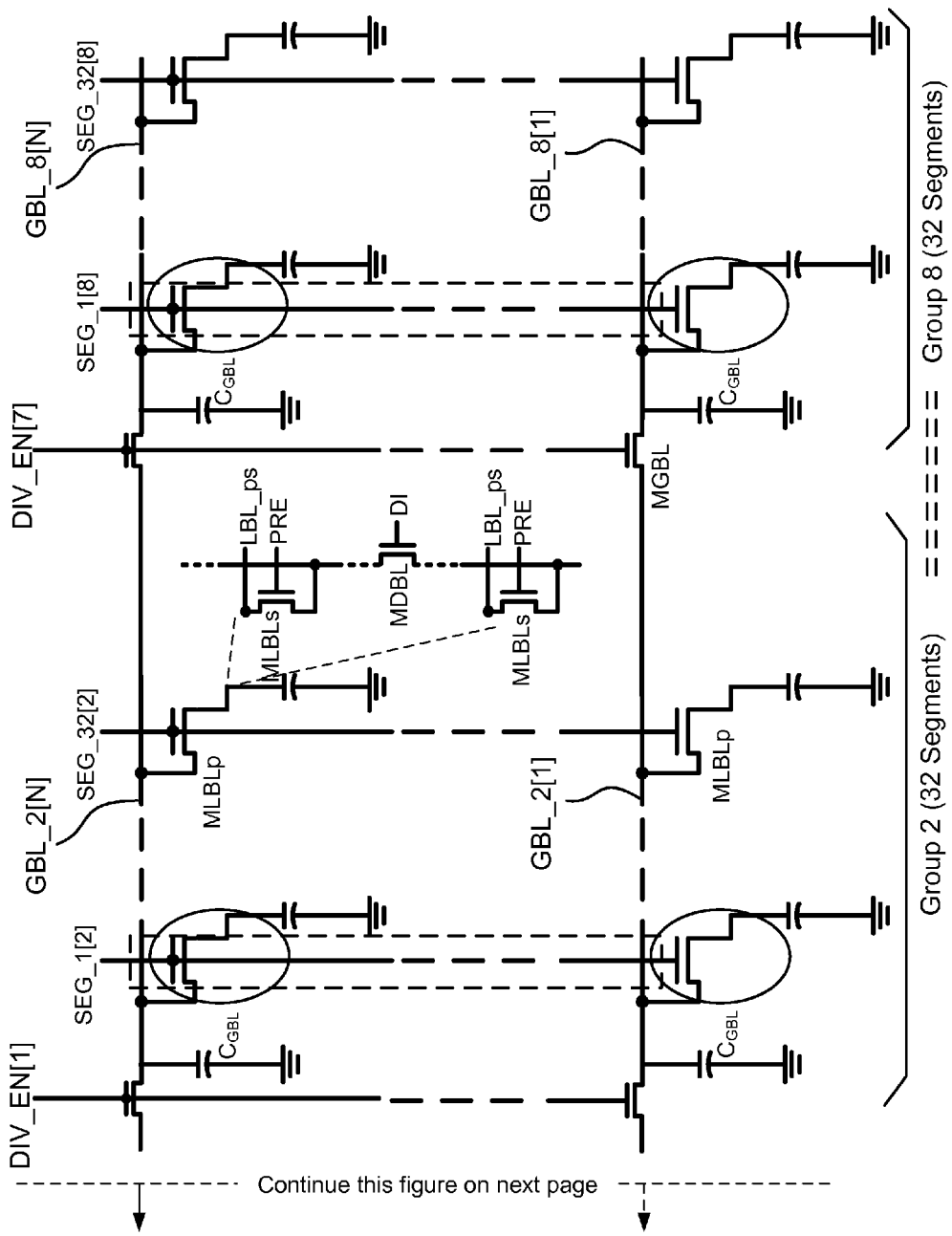
Figure 4A:
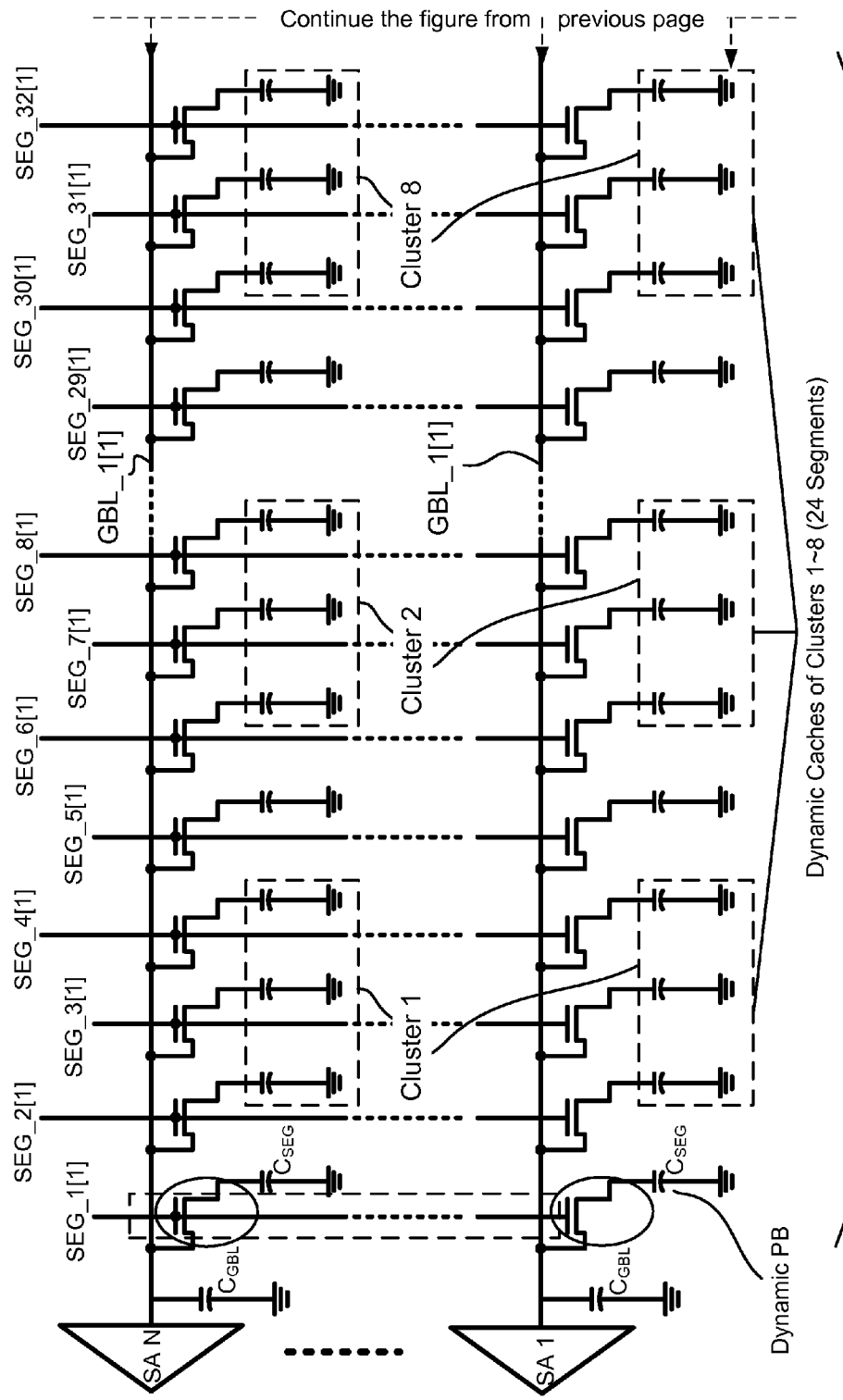

FIG. 4A is a simplified circuit diagram of a HiNAND2 array of FIG. 2B performing Sample & Hold functions of a Multiple-WL TLC Program operation according to a specific embodiment of the present invention. The HiNAND array has been divided into 8 Groups. Each Group large metal2 GBL capacitor (or GBL line) is divided into 8 Clusters of 4-Segment metal1 capacitors through 8 divided GBL transistor of MLBLp. Each Group-broken metal2 line has eight 4-Segment metal1 capacitors connected in parallel. Each 4-Segment cluster includes one Segment being assigned to be one Dynamic Page Buffer (PB) and three Segments being assigned to be Dynamic Cache Registers. The assignments are preferably rotated among these 4 Segments. FIG. 4A shows that the first Segment of Cluster 1 in the dispersed eight Groups is assigned to be one Dynamic PB but the next three Segments are assigned to be three corresponding Dynamic Cache Registers for storing one corresponding 3-bit TLC data.

Figure 4B:
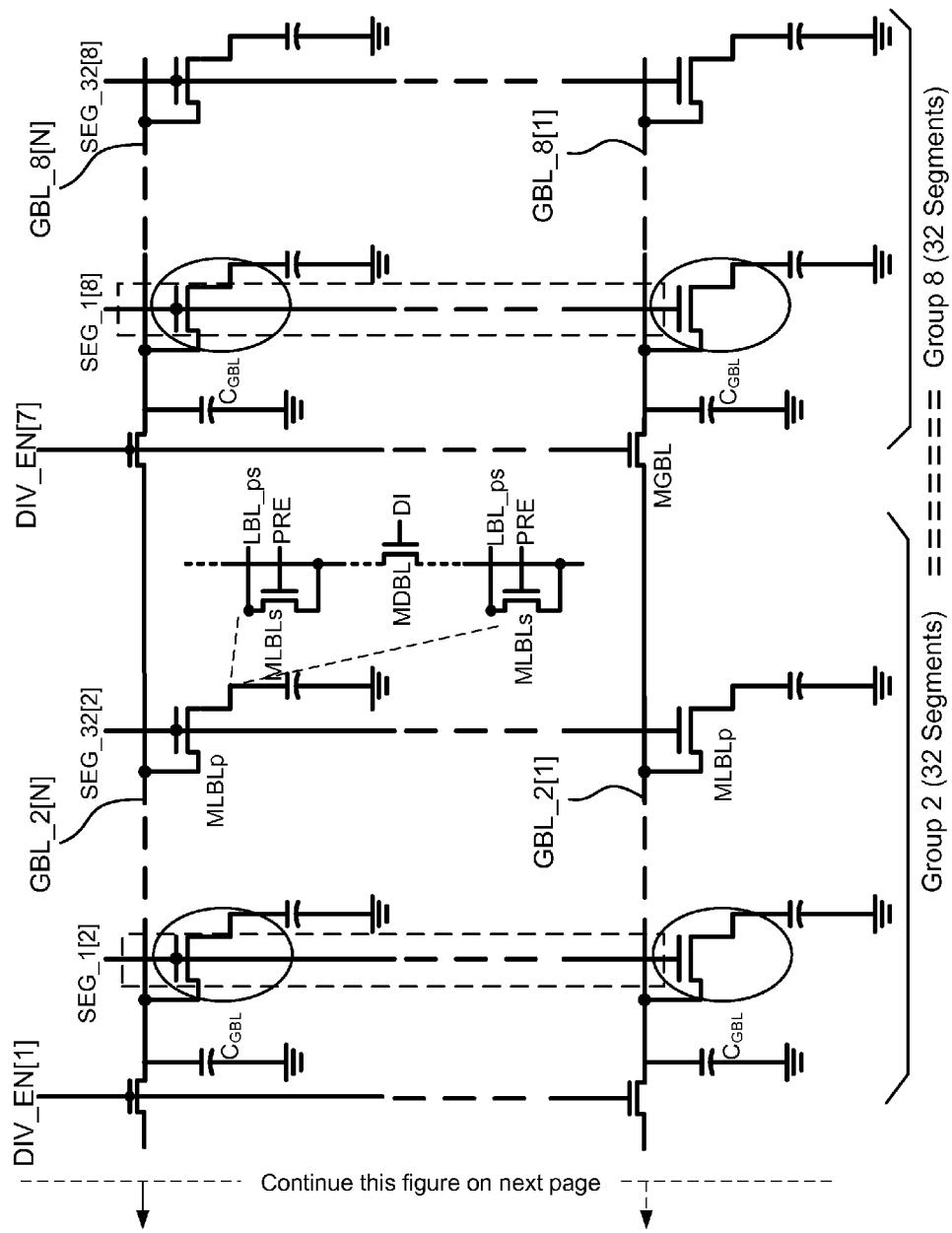
Figure 4B:
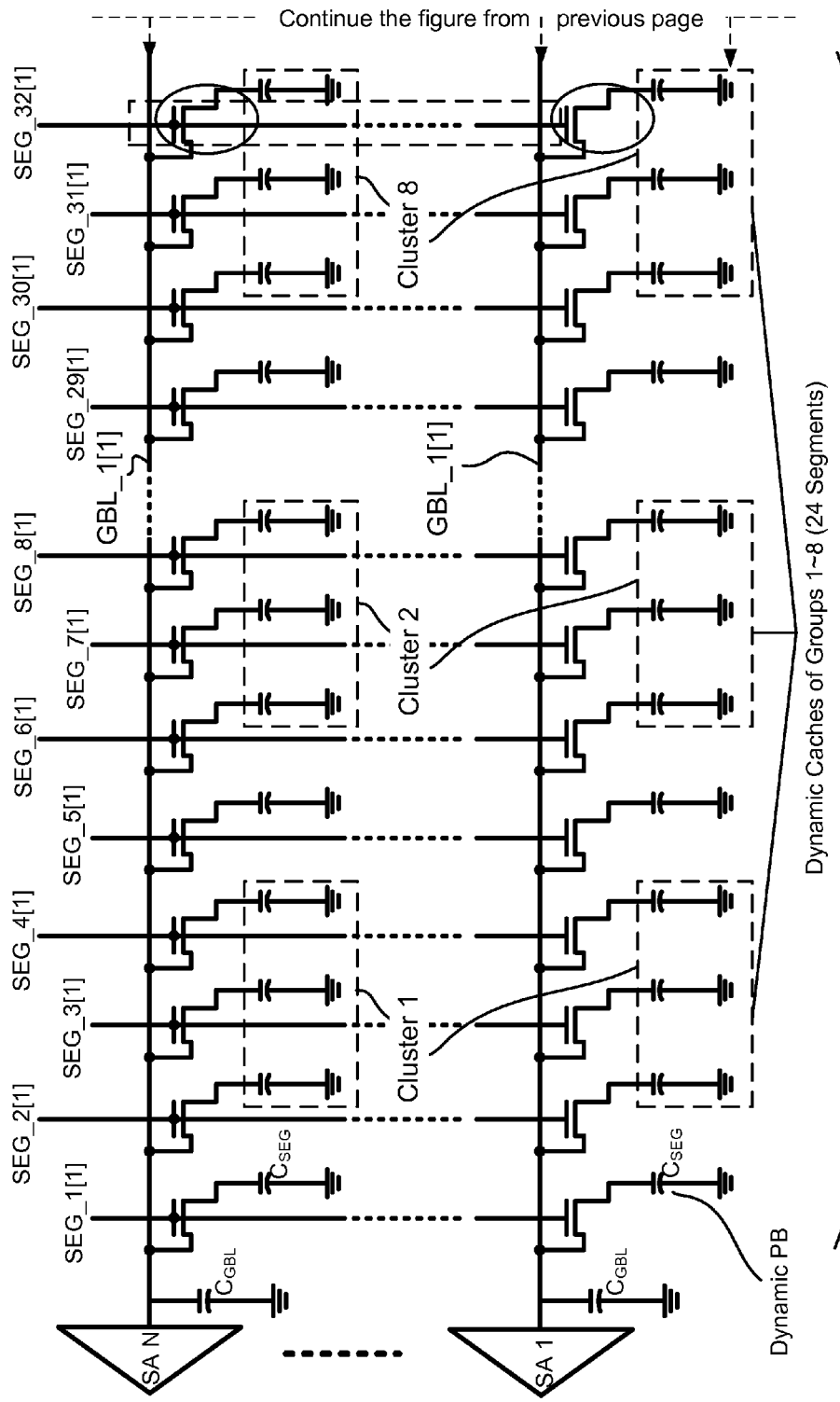

FIG. 4B is a simplified circuit diagram of a HiNAND2 array of FIG. 2B performing Sample & Hold functions of a Multiple-WL TLC Program operation according to another specific embodiment of the present invention. The assignment of 4-Segment metal1 capacitors are rotated with the last Segment of Cluster 8 in the dispersed eight Groups being assigned to one Dynamic PB and the first three Segments being assigned to be three corresponding Dynamic Cache Registers for storing another one corresponding 3-TLC data.

Figure 4C:
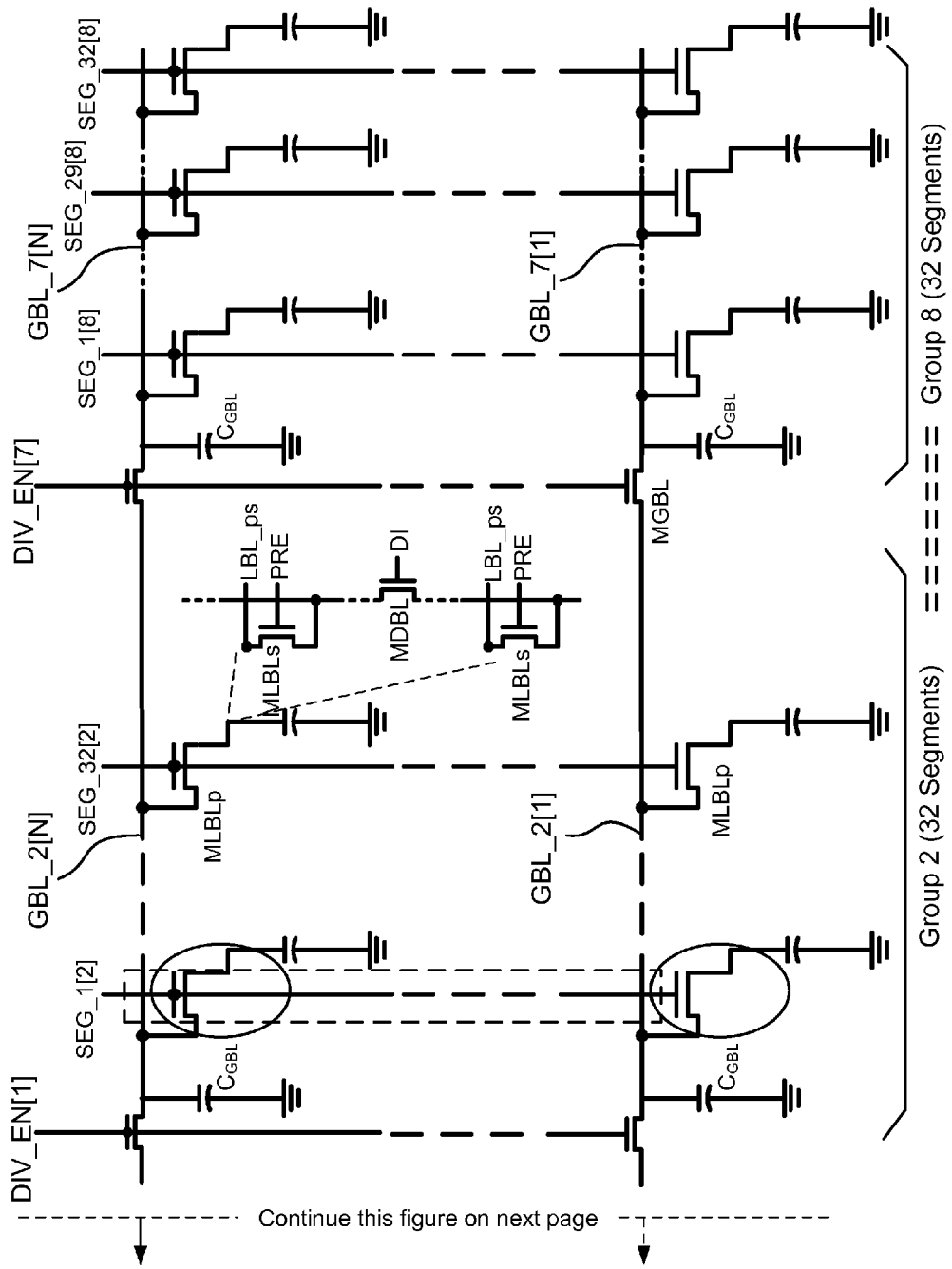
Figure 4C:
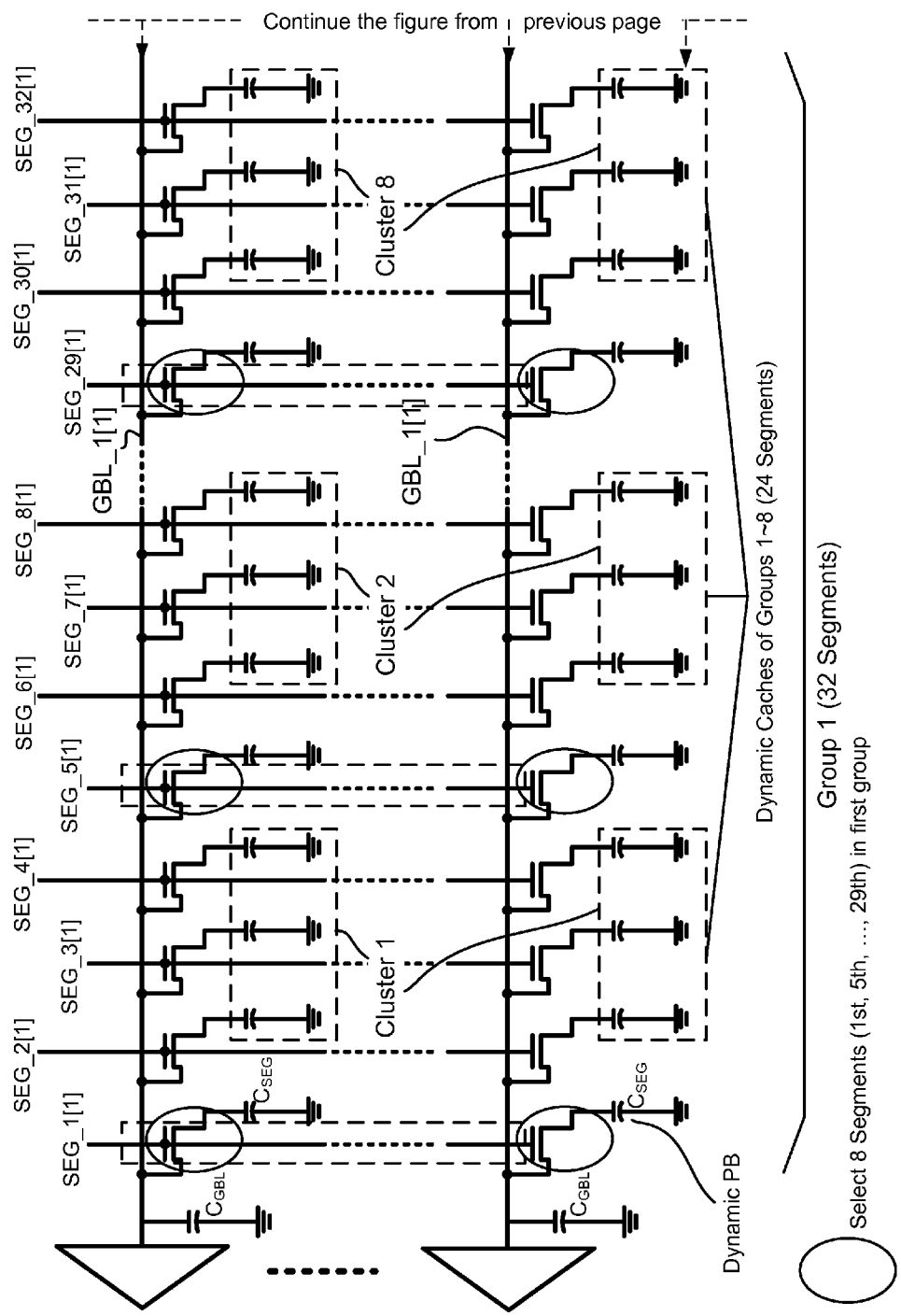

FIG. 4C is a simplified circuit diagram of a HiNAND2 array of FIG. 2B performing Sample & Hold functions of a Multiple-WL TLC Program operation according to another specific embodiment of the present invention. The assignment of 4-Segment metal1 capacitors are rotated with the first Segment of all eight Clusters in Group 1 being assigned to one Dynamic PB and the next three Segments in each Cluster being assigned to be three corresponding Dynamic Cache Registers for storing another one corresponding 3-TLC data.

Figure 4D:
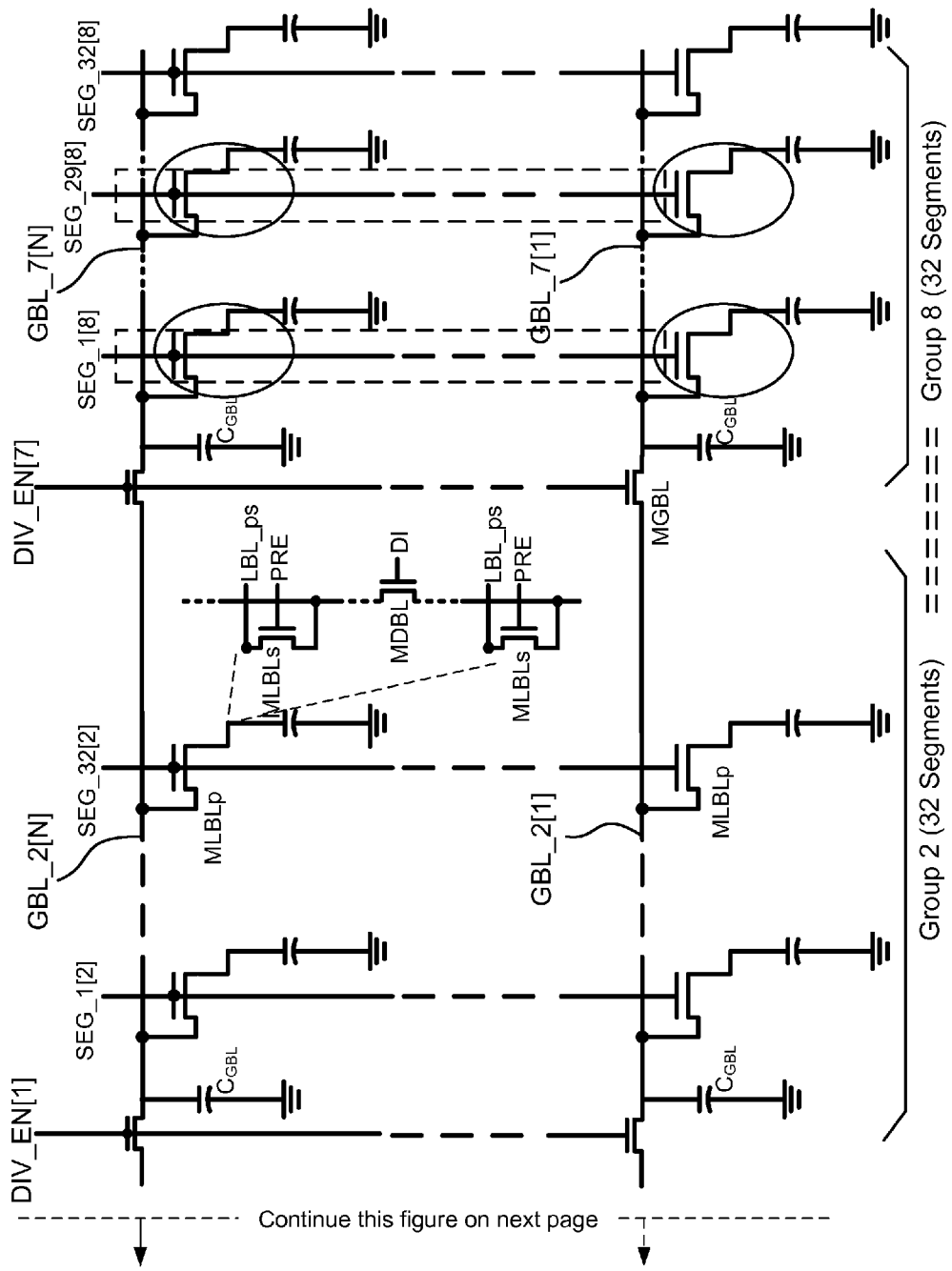
Figure 4D:
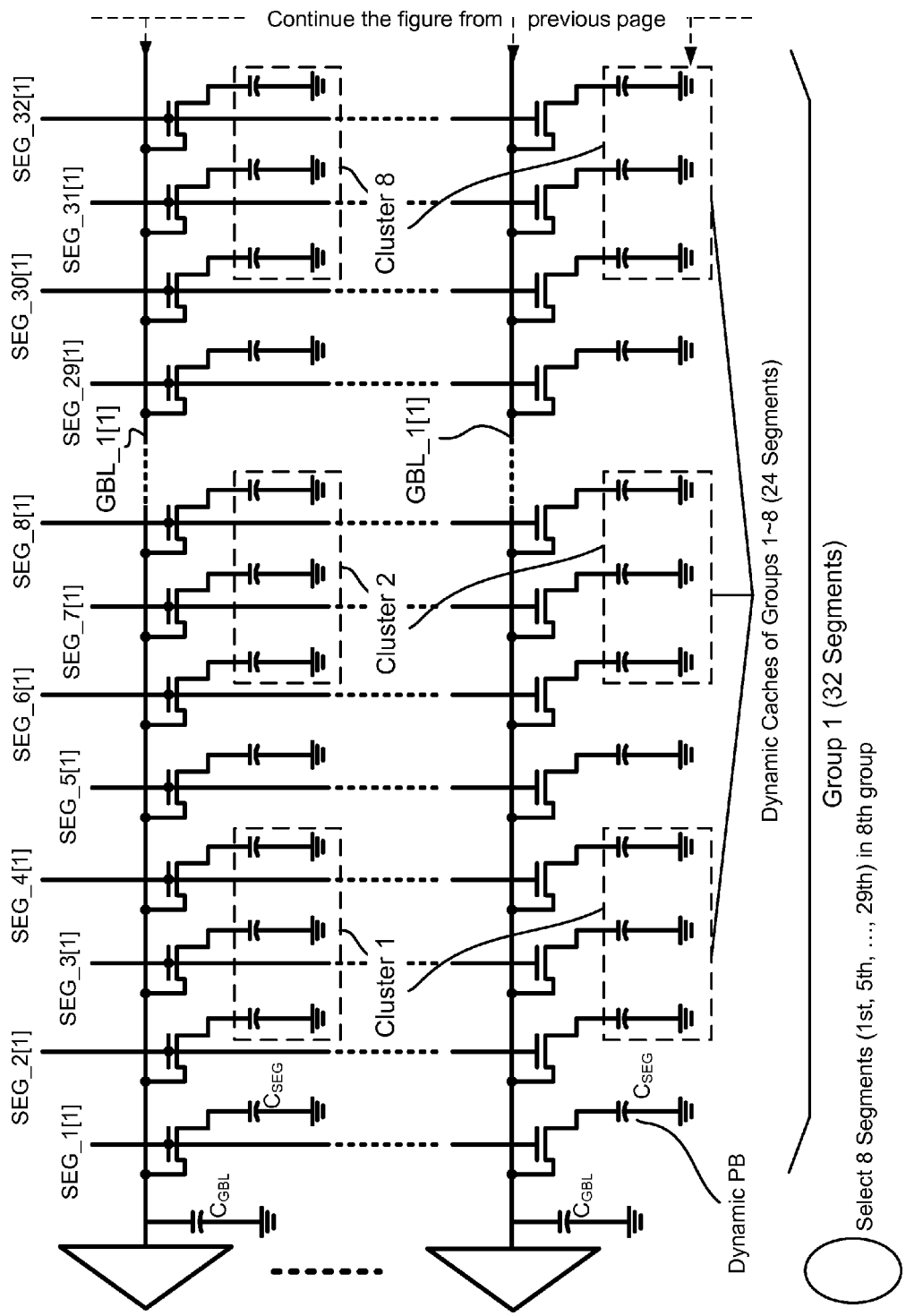

FIG. 4D is a simplified circuit diagram of a HiNAND2 array of FIG. 2B performing Sample & Hold functions of a Multiple-WL TLC Program operation according to another specific embodiment of the present invention. The assignment of 4-Segment metal1 capacitors are rotated with the first Segment of all eight Clusters in Group 8 being assigned to one Dynamic PB and the next three Segments in each Cluster being assigned to be three corresponding Dynamic Cache Registers for storing another one corresponding 3-TLC data.

Figure 5A:
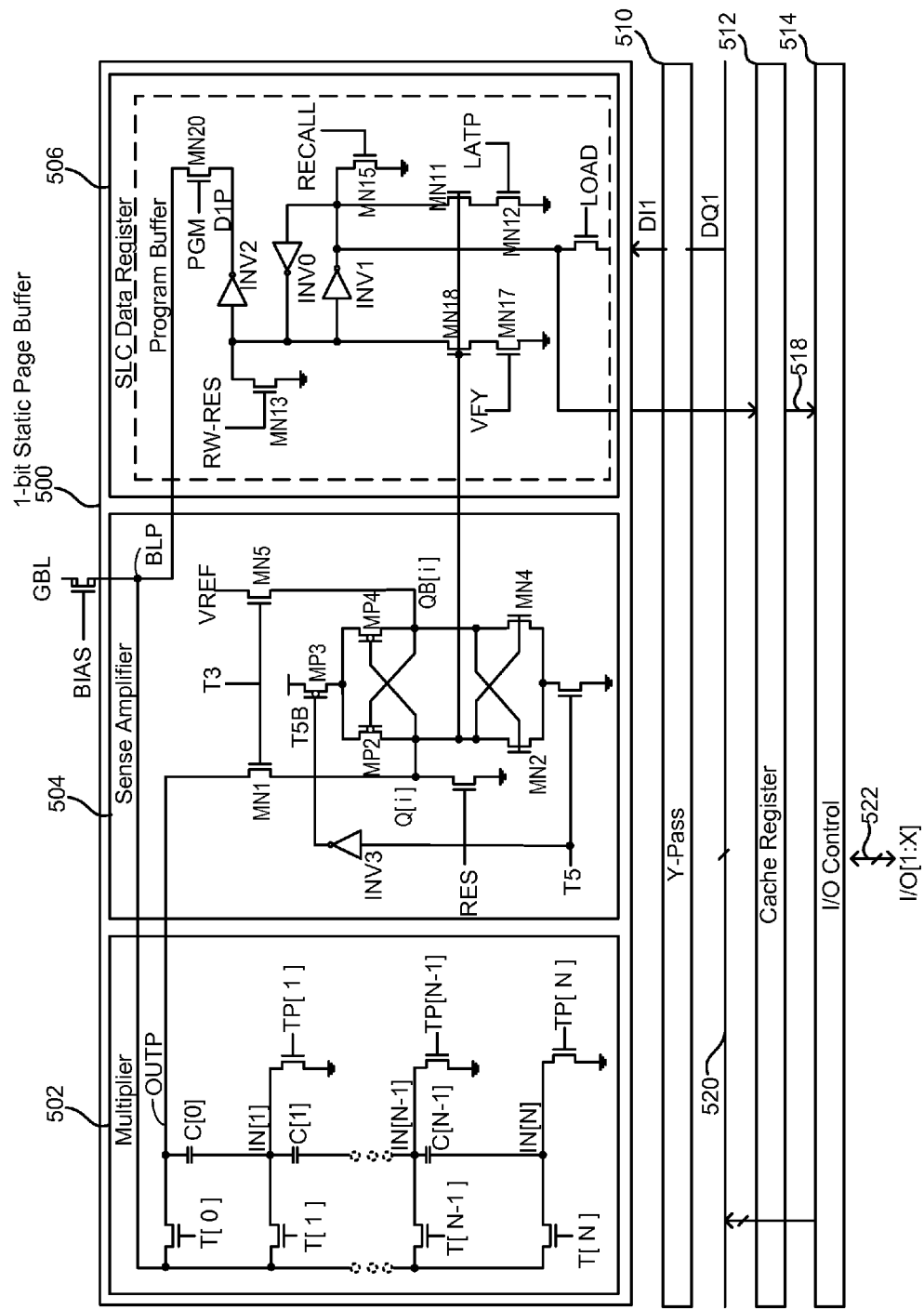

FIG. 5A is a circuit diagram of 1-bit static PB circuit that comprises one Multiplier circuit, one 1-bit Sense Amplifier circuit and one 1-bit SLC Data Register, along with one Y-pass circuit, One Cache Register, one I/O Control and multiple I/O [1:X] pins for Multiple-WL and All-GBL Simultaneous SLC operations for both HiNAND1 and HiNAND2 arrays according to an embodiment of the present invention.

Figure 5B:
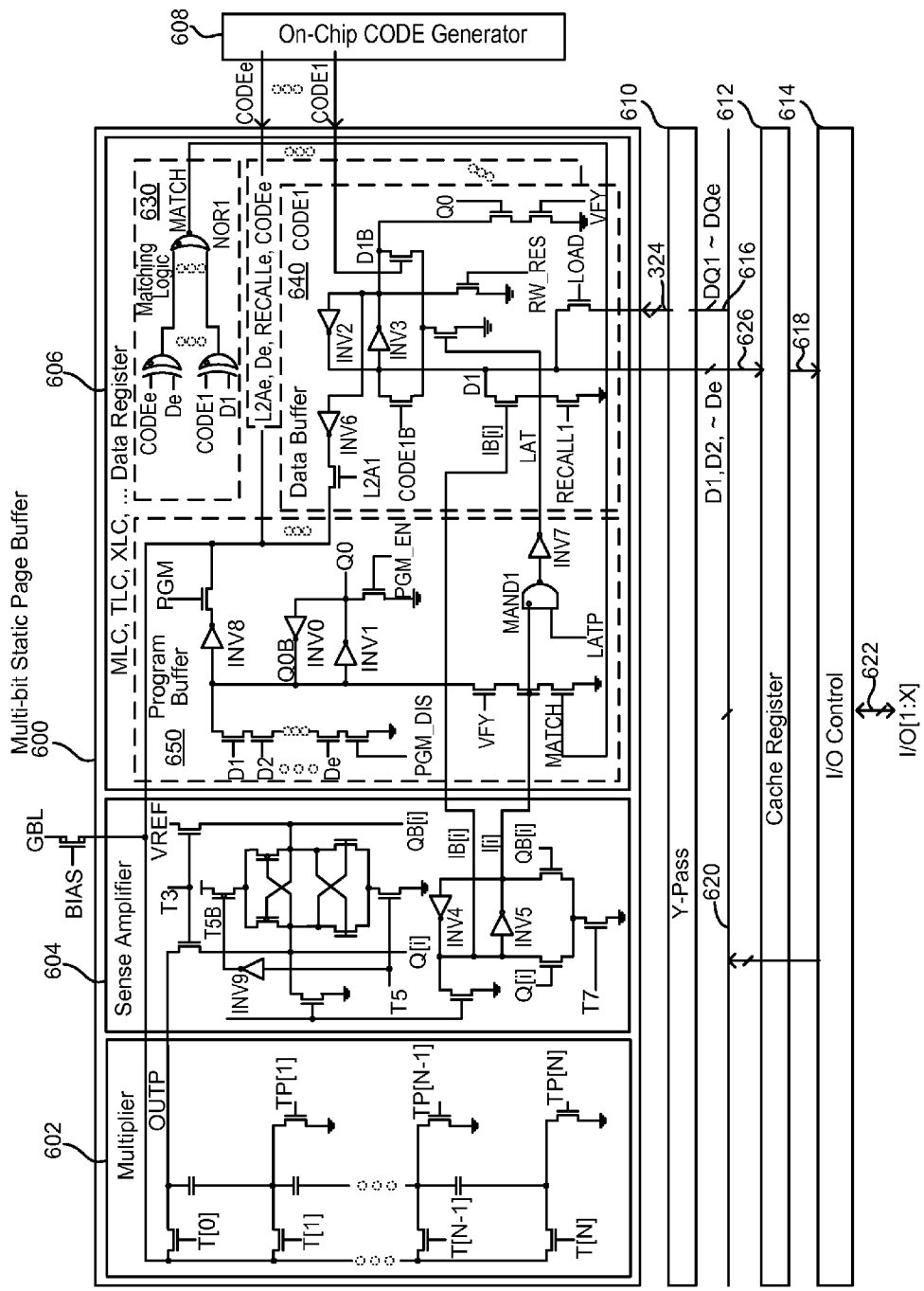

FIG. 5B is a circuit diagram of multi-bit static PB circuit for HiNAND array that allows to store e-bit NAND multiple-state page data for Multiple-WL and All-BL Simultaneous (MLC, TLC, XLC, . . . ) operations according to an embodiment of the present invention.

Figure 6A:
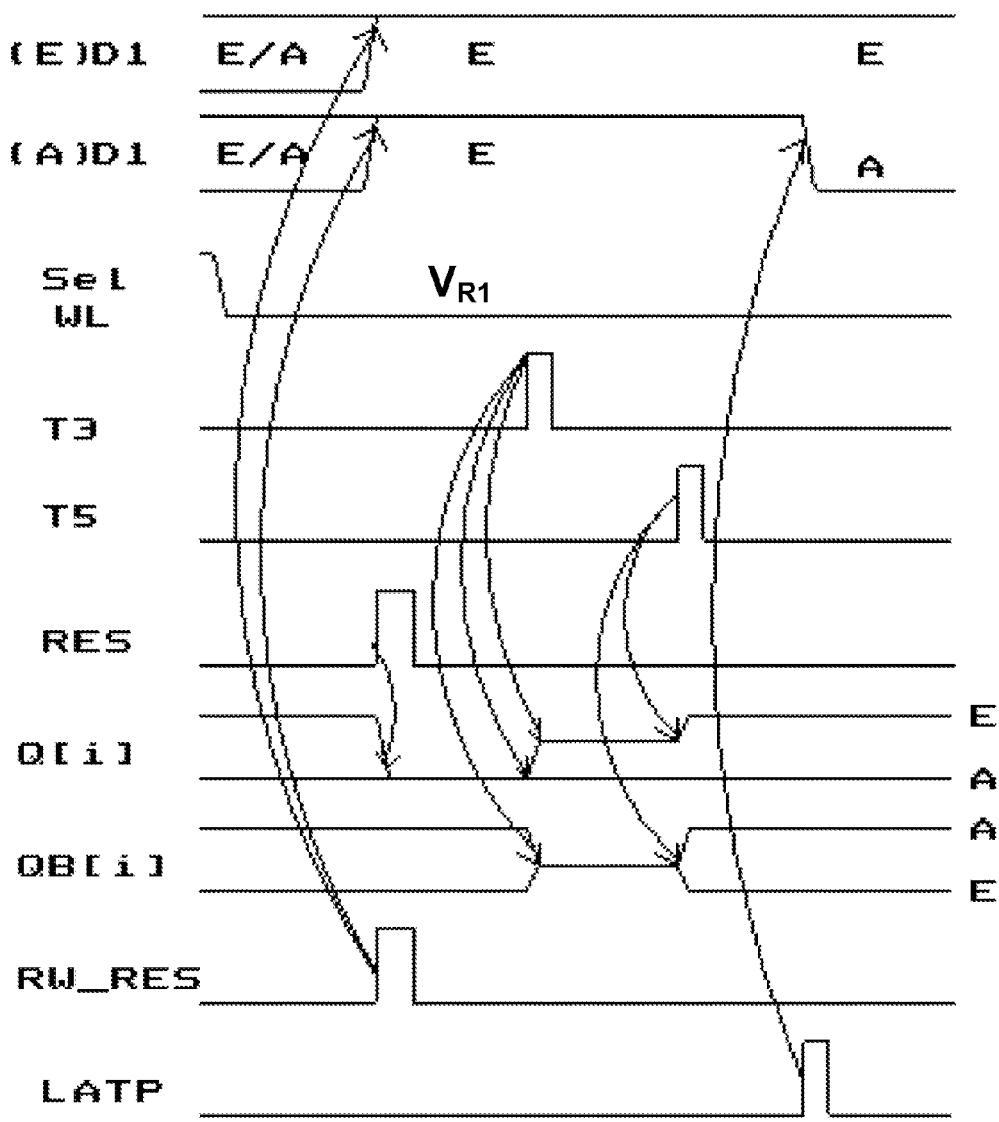

FIG. 6A is a diagram showing a set of SLC Read timing waveforms for Multiple-WL and All-GBL simultaneous Read operation with a preferred set of initial biased conditions in accordance with the 1-bit static PB circuit shown in FIG. 5A of both HiNAND1 and HiNAND2 arrays according to an embodiment of the present invention.

Figure 6B:
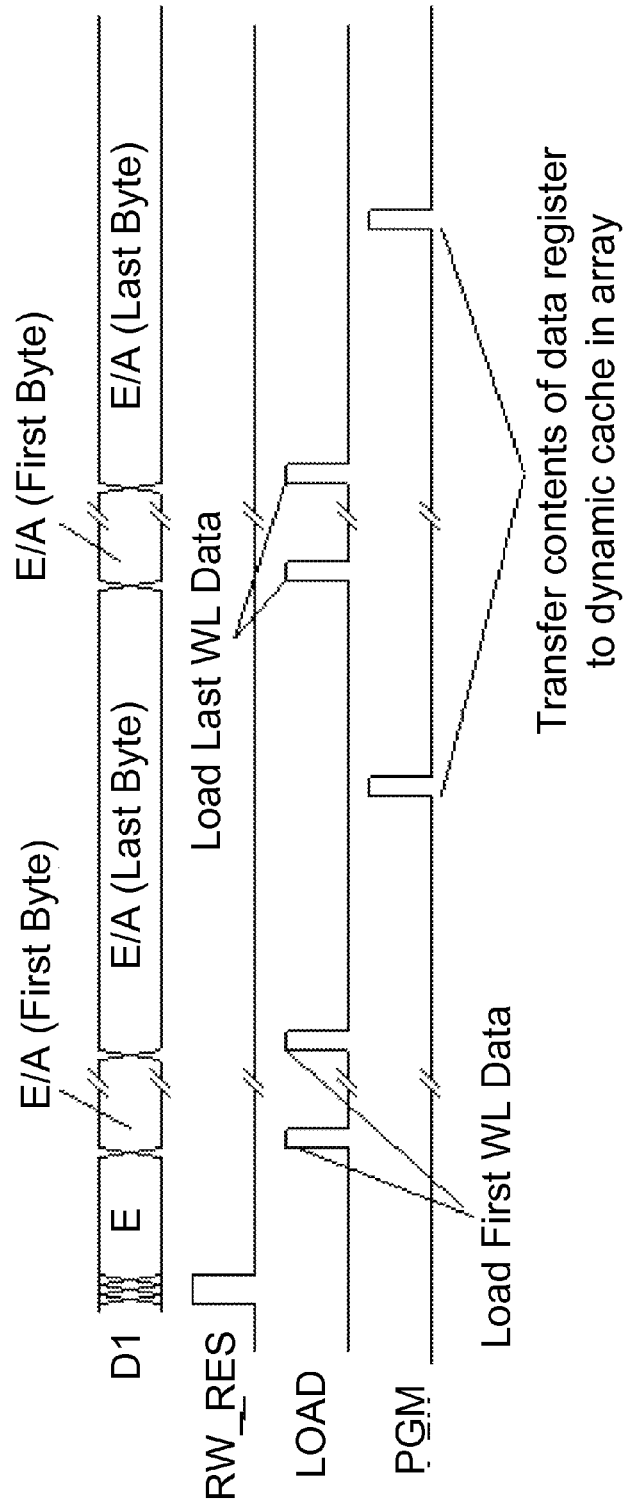

FIG. 6B is a diagram showing a set of Sample/Hold Multiple-WL SLC PGM patterns timing waveforms in accordance with the 1-bit static PB circuit shown in FIG. 5A of both HiNAND1 and HiNAND2 arrays according to an embodiment of the present invention.

Figure 6C:
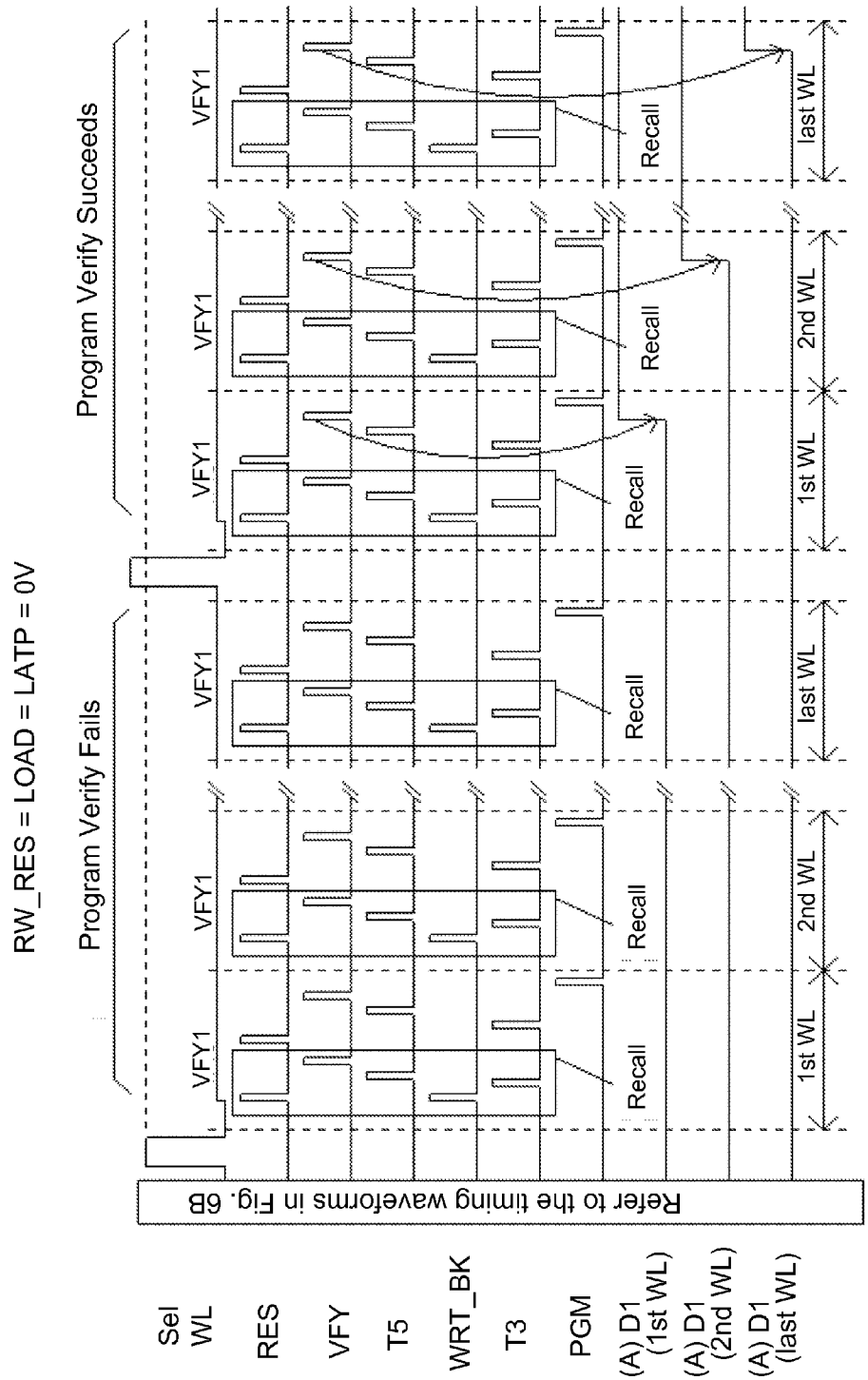

FIG. 6C is a diagram showing a set of set biased conditions of Multiple-WL and All-GBL SLC simultaneous PGM timing waveforms in accordance with the 1-bit static PB circuit shown in FIG. 5A.

Figure 6D:
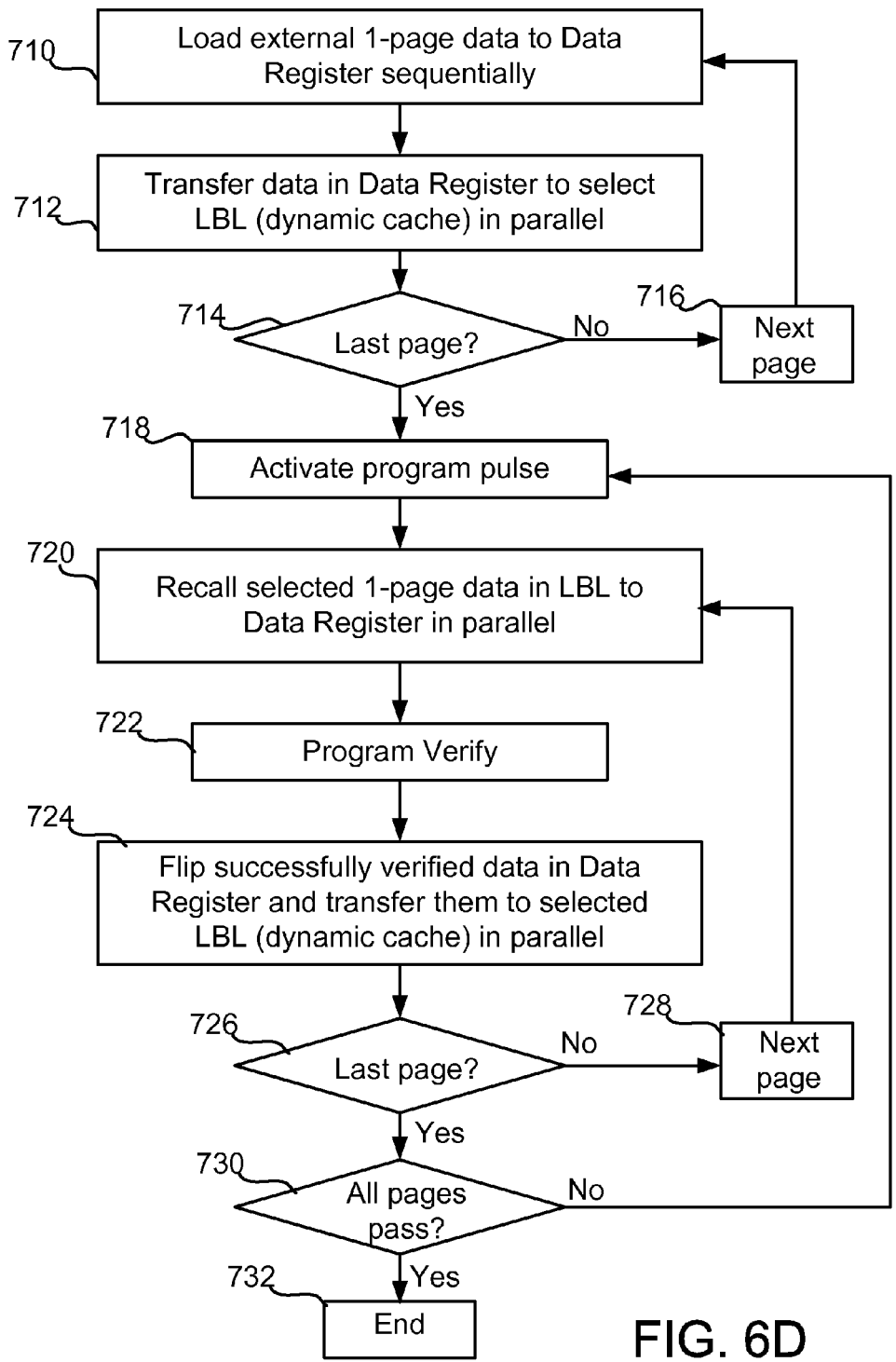

FIG. 6D is a flow chart showing a method for the preferred Multiple-WL and All-GBL SLC simultaneous Program operation in accordance with the preferred PB circuit shown in FIG. 5A.

Figure 7A:
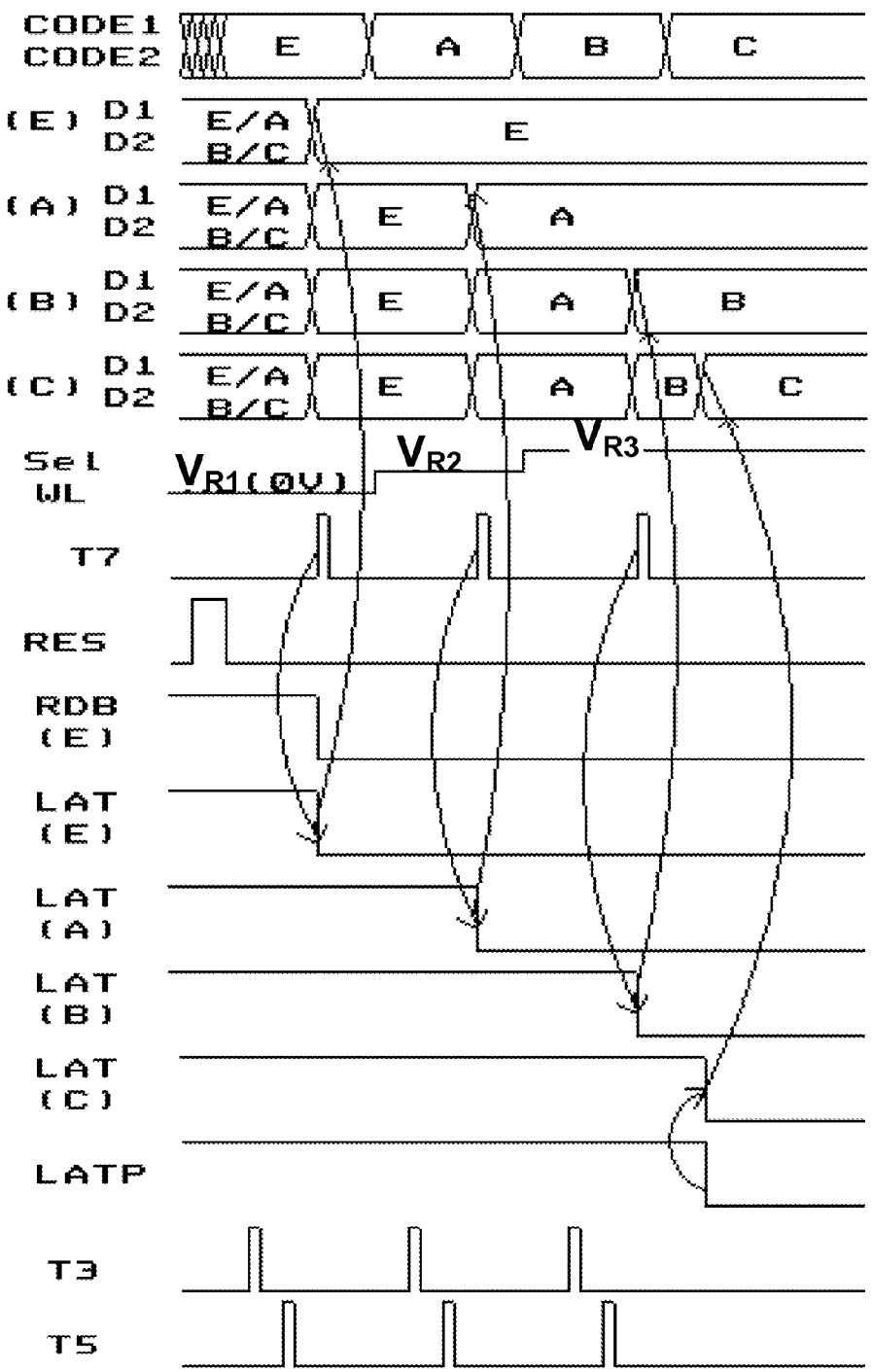

FIG. 7A is a diagram showing a set of MLC Read timing waveforms for performing the preferred Multiple-WL and All-GBL MLC simultaneous Read operation in accordance with the multi-bit static PB circuit shown in FIG. 5B of both HiNAND1 and HiNAND2 arrays according to an embodiment of the present invention.

Figure 7B:
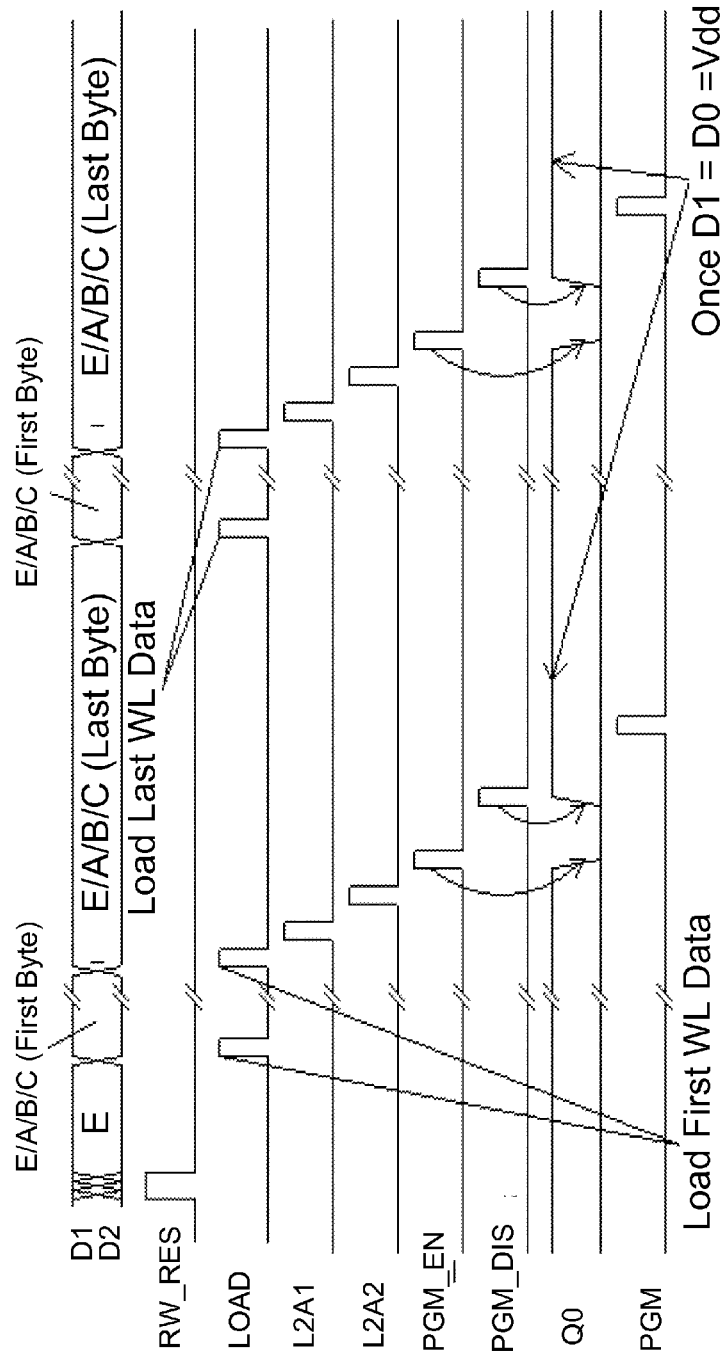

FIG. 7B is a diagram showing a set of Sample/Hold Multiple-WL PGM patterns timing waveforms for the preferred Multiple-WL and All-GBL MLC simultaneous Program Patterns operation in accordance with the multi-bit static PB circuit shown in FIG. 5B.

Figure 7C:
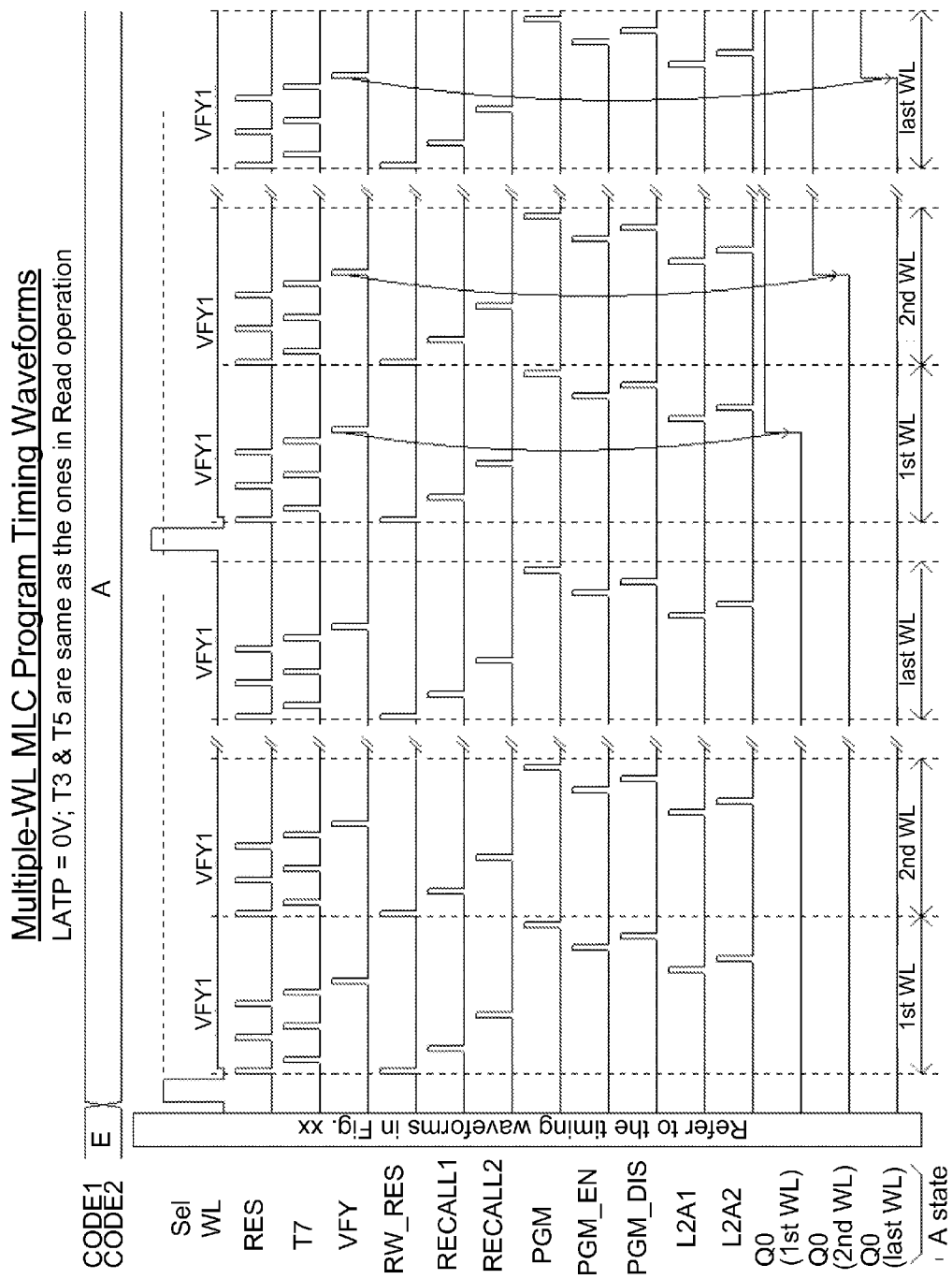

FIG. 7C is a diagram showing a set of biased conditions of Multiple-WL and All-GBL MLC simultaneous PGM timing waveforms in accordance with the preferred PB circuit shown in FIG. 5B.

Figure 7D:
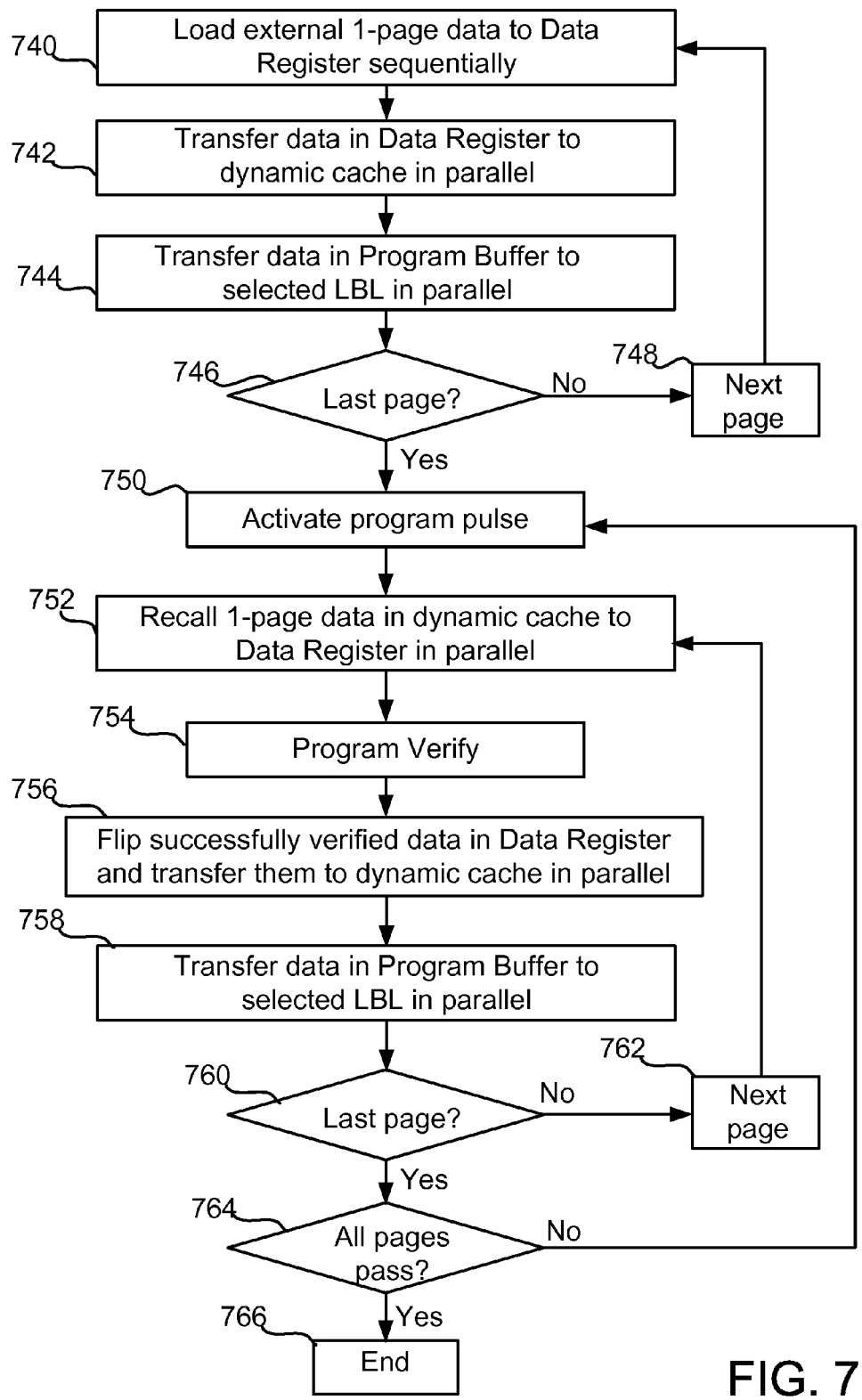

FIG. 7D is a flow chart showing a method for the preferred Multiple-WL and All-GBL MLC simultaneous Program operation in accordance with the multi-bit static PB circuit shown in FIG. 5B.

FIG. 8 is a diagram showing a preferred set of bias voltage conditions of array control signals for Multiple-WL & All-GBL simultaneous Read operation based on the HiNAND1 array shown in FIG. 2A according to a specific embodiment of the present invention.

FIG. 9 is a diagram showing a preferred set of bias voltage conditions of array control signals for Multiple-WL & All-GBL simultaneous Read operation based on the HiNAND2 array shown in FIG. 2B according to a specific embodiment of the present invention.

FIG. 10 is a diagram showing a first preferred set of bias voltage conditions of array control signals for Multiple-WL & All-GBL simultaneous Program operation based on the HiNAND1 array shown in FIG. 2A according to a specific embodiment of the present invention.

FIG. 11 is a diagram showing a second preferred set of bias voltage conditions of array control signals for Multiple-WL & All-GBL simultaneous Program operation based on the HiNAND1 array shown in FIG. 2A according to a specific embodiment of the present invention.

FIG. 12 is a diagram showing a first preferred set of bias voltage conditions of array control signals for Multiple-WL & All-GBL simultaneous Program operation based on the 2D HiNAND2 array shown in FIG. 2B, regardless of SLC, MLC, TLC and XLC storages, according to another specific embodiment of the present invention.

FIG. 13 is a diagram showing a second preferred set of bias voltage conditions of array control signals for Multiple-WL & All-GBL Simultaneous Program operation based on the 2D HiNAND2 array shown in FIG. 2B, regardless of SLC, MLC, TLC and XLC storages, according to yet another specific embodiment of the present invention.

FIG. 14 is a diagram showing a preferred set of bias voltage conditions of 2D or 3D HiNAND2 array for a preferred Multiple-WL & All-GBL simultaneous Erase operation using Channel-Erase scheme, regardless of SLC, MLC, TLC and XLC storages, according to an alternative embodiment of the present invention.

FIG. 15 is a diagram showing a preferred set of bias voltage conditions of 2D or 3D HiNAND2 array for a preferred Multiple-WL & All-GBL simultaneous Erase operation using GIDL Erase scheme, regardless of SLC, MLC, TLC and XLC storages, according to another alternative specific embodiment of the present invention.

FIG. 6 is a simplified circuit diagram showing a 3D HiNAND2 array with 2-transistor divided-GBL/LBL device and U-shaped vertical-channel String according to an embodiment of the present invention.

Figure 17:
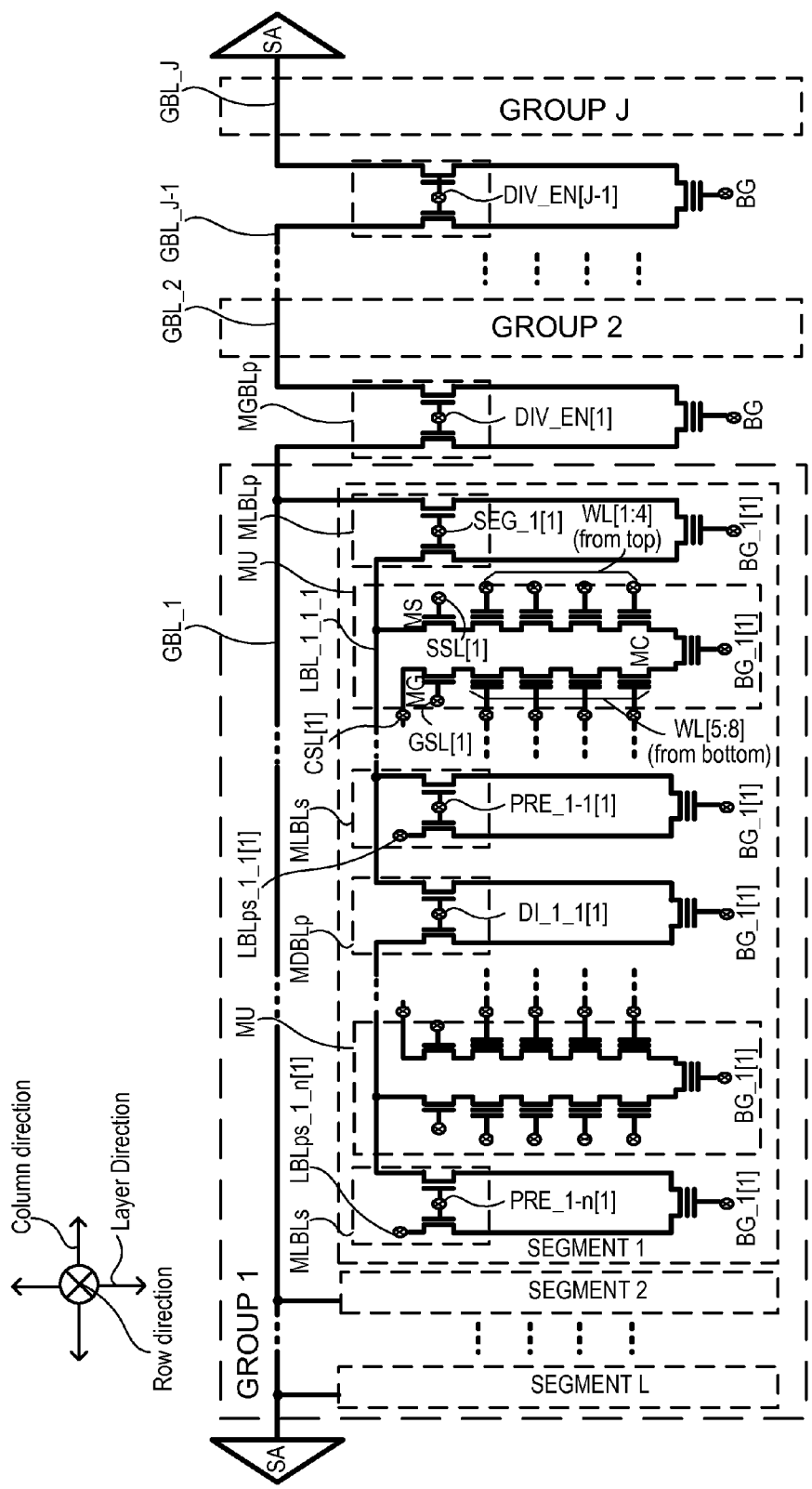

FIG. 17 is a simplified circuit diagram showing a 3D HiNAND2 array with 3-transistor divided-GBL/LBL device and U-shaped vertical-channel String according to another embodiment of the present invention.

Figure 18:
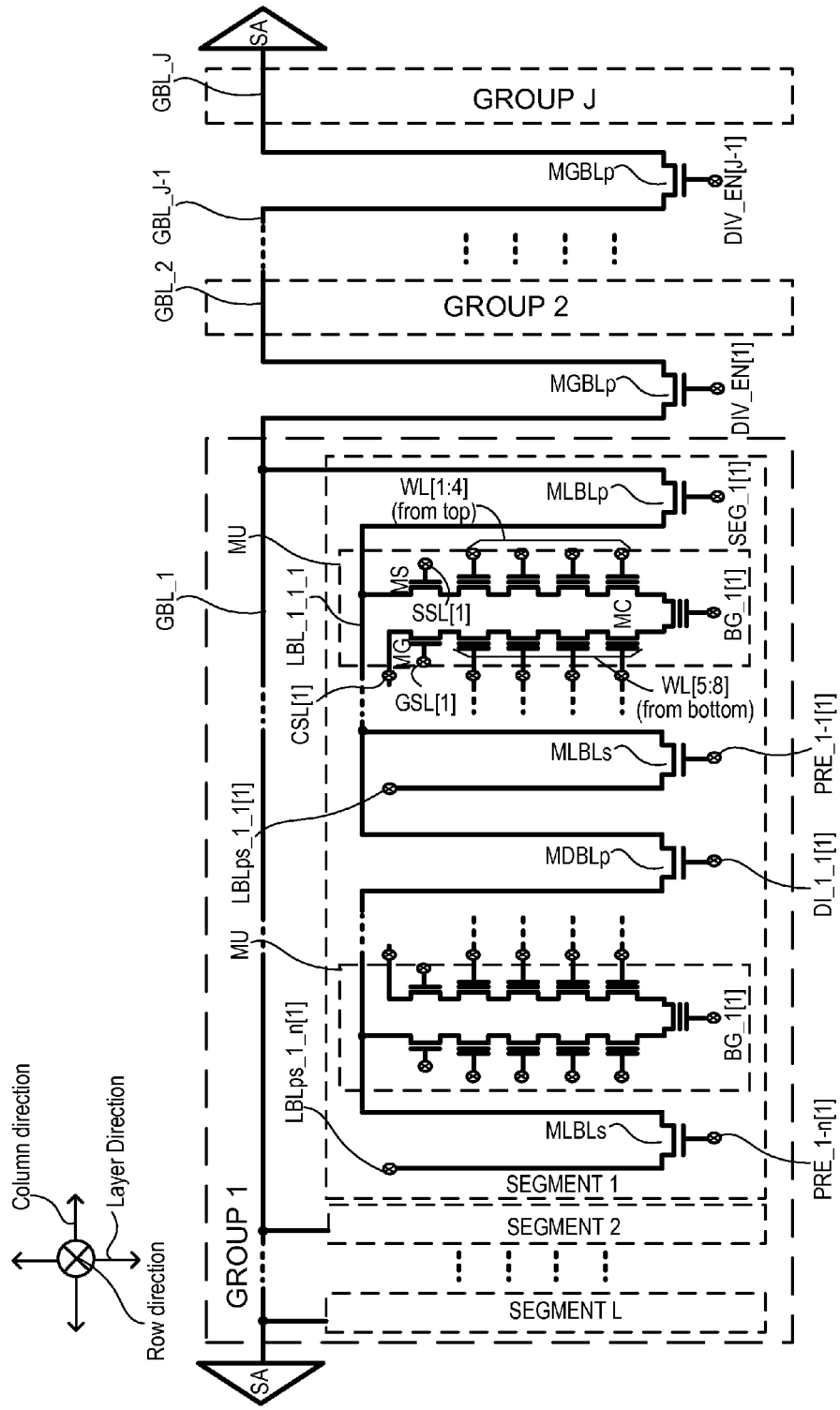

FIG. 18 is a simplified circuit diagram showing a 3D HiNAND2 array with 1-transistor divided-GBL/LBL device and with U-shaped vertical-channel String according to yet another embodiment of the present invention.

Figure 19:
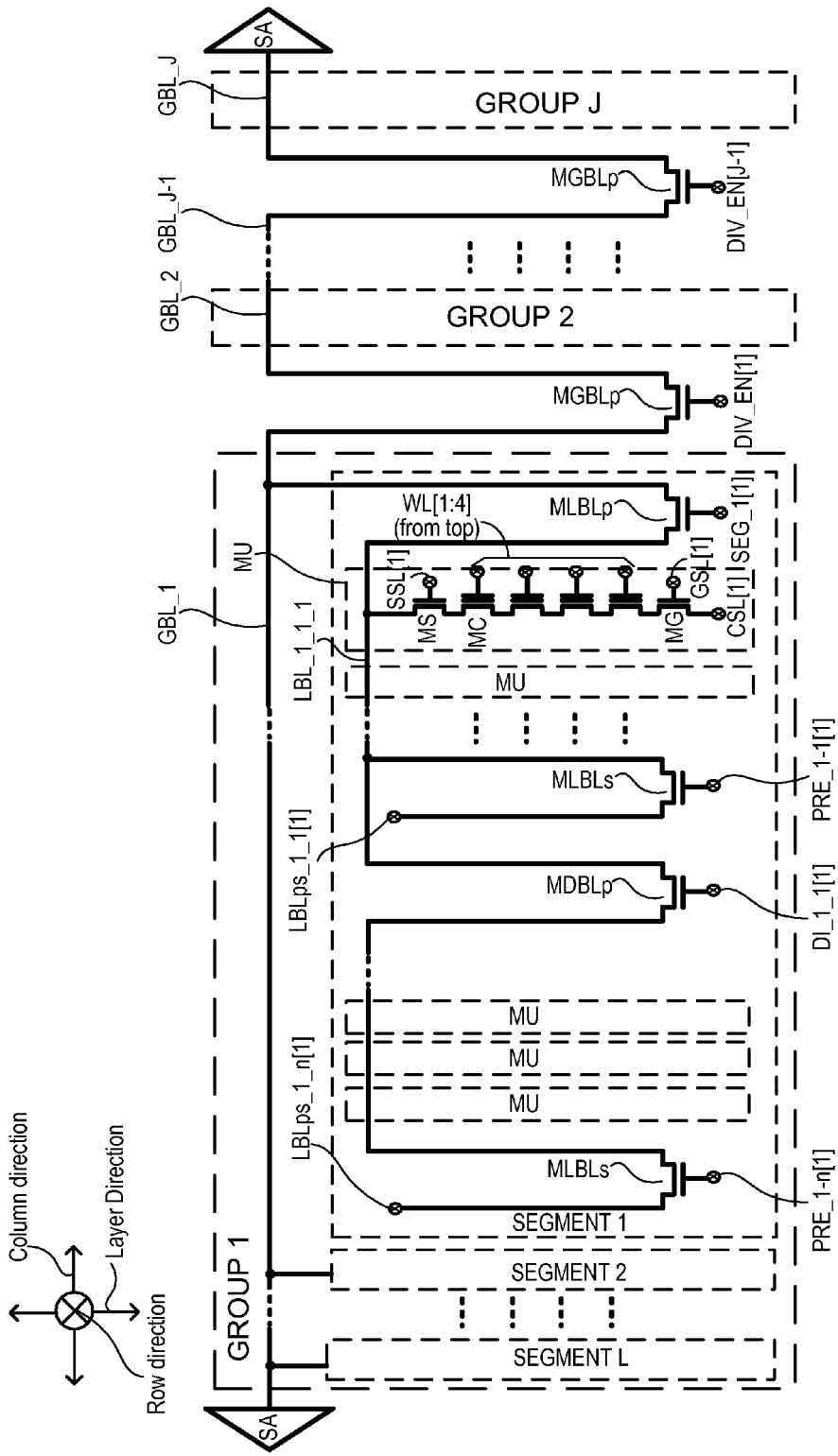

FIG. 19 is a simplified circuit diagram showing a 3D HiNAND2 array with 1-transistor divided-GBL/LBL device and with straight vertical-channel String according to still another embodiment of the present invention.

Figure 20:
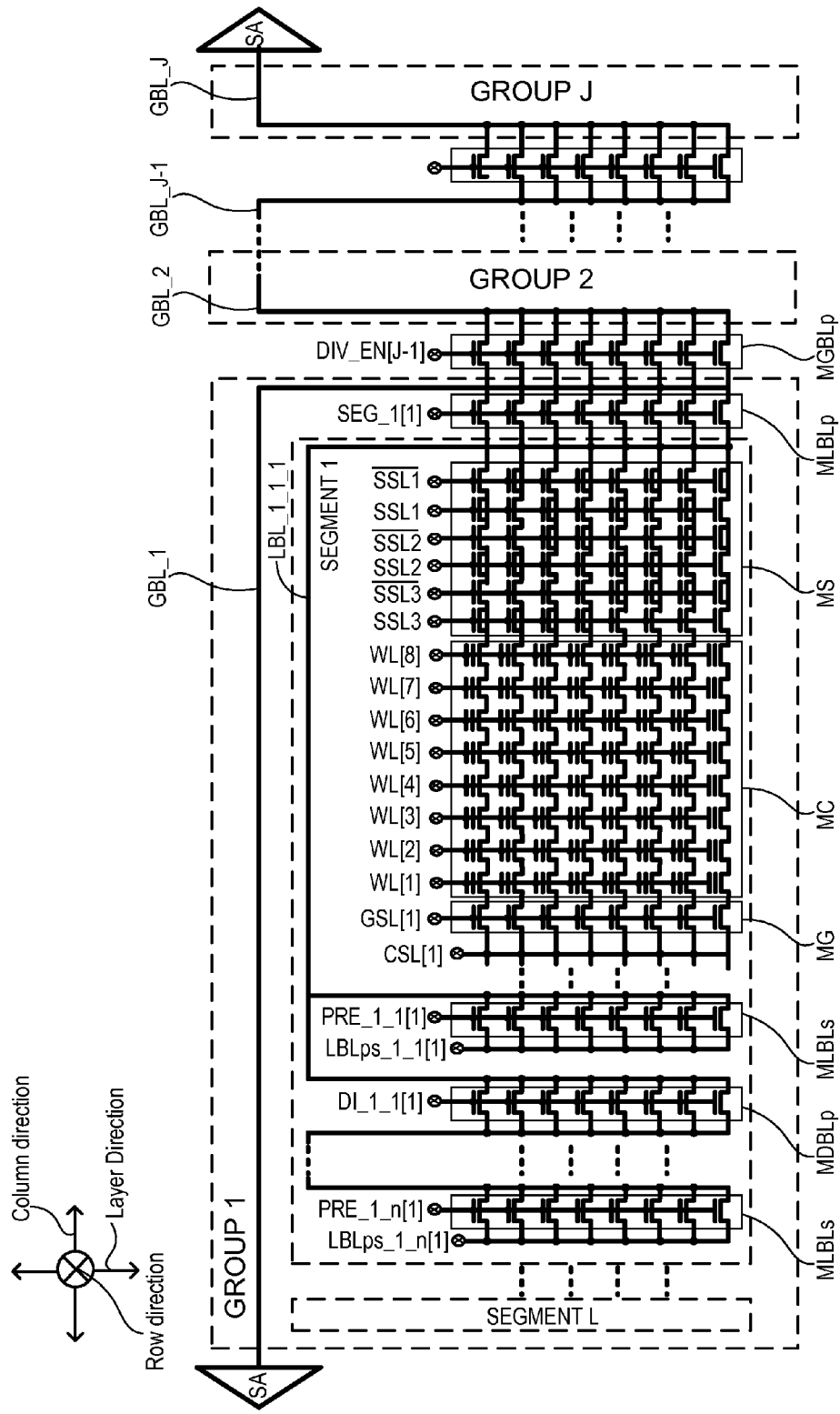

FIG. 20 is a simplified circuit diagram showing a 3D HiNAND2 array compatible with vertical-gate NAND cell string scheme according to a specific embodiment of the present invention.

FIG. 21 is a diagram showing six decoding logics for eight layers of the vertical String selected-transistors of the 3D vertical-gate HiNAND2 array structure of FIG. 20 according to a specific embodiment of the present invention.

The above diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims. Note, all above 3D HiNAND2 arrays have 2-sided Sense Amplifier (SA) and multiple-level hierarchical BL structures. All of them can be turned into 3D HINAND2 with 1-sided SA and multiple-level broken-BL hierarchical structures so that the preferred concurrent charge-sharing, precharge, and discharge in Read and Verify operations can be performed with faster speed and less-power consumption.

5. DETAILED DESCRIPTION OF THE INVENTION

In the following detailed description of the present invention, reference is made towards the accompanying drawings, flow charts, diagrams, and tables that form a part hereof and in which is shown, by way of illustration, specific embodiments in which the invention may be practiced. In the drawings, like numbers describe substantially similar components throughout the several views and embodiments. These embodiments are described in sufficient detail with a goal to enable those skilled in the art to practice the invention. Other embodiments may be made without departing from the scope of the present invention. Additionally, the following detailed description is not to be taken in a limiting sense, and the scope of the present invention is defined only by the appended claims and equivalents thereof. In other instances, well-known structures and devices are shown in block diagram form, rather than in detail, in order to avoid obscuring the present invention.

Please note, if used, the labels left, right, top, bottom, middle, higher or lower level X or Y-direction, column or row direction, horizontal or vertical direction both in drawings or mentioned in description, have been used for convenience purposes only and are not intended to imply any particular fixed direction. Numerical denotation using J, L, K, M, N, m, n, is also for convenience purpose and corresponding examples of these numbers, such as 1, 2, 3, 8, 16, 32, 64, 256, etc are not intended to limit the scope of the present invention defined by the appended claims. Instead, they are used to reflect relative locations and/or directions between various portions of a circuit object or schematic diagram.

Unlike prior-art 2D NAND has only one 1-level unbroken and tight 2λ metal1 global bit line (GBL) architecture extending vertically (or in column direction, or Y-direction) a long way from each array top to bottom with a heavy BL capacitance along with a plurality of horizontal metal0 Vss lines, in general, embodiments of the present invention provide a HiNAND array preferably including 1-level or 2-level hierarchical structure with broken and tight 2λ metal2/metal1 GBLs and tight metal1 local bit lines (LBLs) along with a plurality of horizontal metal0 Vss and power lines. Throughout this specification, a NAND array with 1-level broken metal1 GBL is termed as HiNAND1 array, while a NAND array with 2-level broken metal2 GBL and broken metal1 LBL is termed as HiNAND2 array (compared with the conventional NAND array with 1-level unbroken and tight 2λ metal1 GBL).

The length of each metal2 or same metal1 GBL is formed to be much longer than the length of each metal1 LBL line in HiNAND array so that the DRAM-like Charge-sharing sensing scheme for the preferred Multiple-WL and All-BL Simultaneous operations can be reliably realized with low power consumption and low latency.

For the preferred Multiple-WL and All-GBL simultaneous Program operation, a precharged $V_{inhibit}$ voltage on all selected, smaller, broken metal1 LBLs in HiNAND2 array or a broken metal1 GBL line in HiNAND1 array is required for power saving. The $V_{inhibit}$ voltage is preferably set to be larger than Vdd for HiNAND array and is generated from a $V_{inhibit}$ pump circuit and is then coupled to the selected LBL and GBL capacitors through a selected horizontal metal0 GBLps line in HiNAND1 or metal0 horizontal LBLps line in HiNAND2 array. The precharge current will be too high when the precharged voltage is greater than Vdd and GBL and LBL capacitance are also too large. And that is why a broken smaller LBL or broken GBL line is required for lowering the precharge current for charging to $V_{inhibit}$ in this preferred Multiple-WL and All-GBL simultaneous Program operation based on HiNAND arrays.

Conversely, for the preferred Multiple-WL and All-GBL simultaneous Read and all Verify operations such as Program-Verify or Erase-Verify, a precharged $V_{inhibit}$ voltage or Vdd voltage on all selected large broken metal1 GBL lines in HiNAND1 array or a large broken metal2 GBL line in HiNAND2 array is required for a fast, reliable DRAM-like BL Charge-sharing sensing scheme implemented in this preferred HiNAND array.

Besides multiple-level broken-BL hierarchical structures, some other novel circuits or techniques such as Recall and Sensing, Dynamic Cache Registers and Dynamic PB formed inside 2D HiNAND array to store the programmed data patterns will be disclosed and explained throughout this specification. In addition, all above mentioned multiple-level broken-BL hierarchical structures, operating schemes and biased conditions for the 2D HiNAND array circuits can be extended into the 3D HiNAND array circuits with a super fast, lower-power Program and Read operations.

Figure 1A:
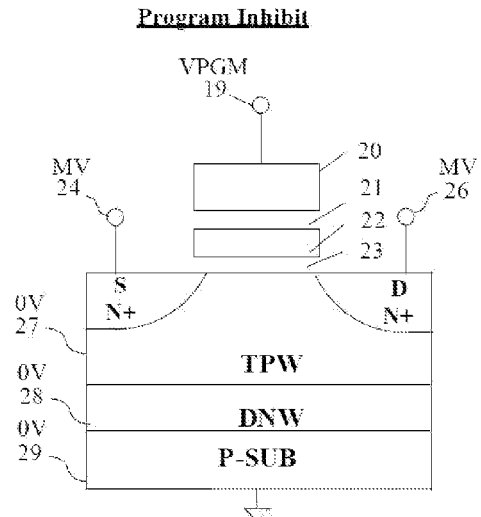
FIG. 1A is a cross-sectional view of a 2D NAND memory cell with channel biased condition at MV=$V_{inhibit}$ for Program-Inhibit (PI) according to an embodiment of the present invention.

FIG. 1A shows a cross-sectional view of one 2-poly, NMOS, 2D NAND cell subjected to a preferred non-SBPI's program-inhibit bias condition according to an embodiment of the present invention. As shown, the cell, referred as the 2-poly HiNAND cell in this invention, is formed inside the TPW 27, within the DNW 28 on top of P-substrate 29, structurally the same as conventional NAND cell. In an alternative embodiment, the 2D HiNAND cell can also be a 1-poly MONOS cell using a charge-trapping layer made from Nitride for data storage. In another alternative embodiment, this HiNAND cell can be made of either 2-poly floating-gate transistor with poly1 layer 20 on top of ploy2 layer 22 separated by a thin oxide layer 21. Poly2 layer is separated from the channel by another thin oxide layer 23 in between. Further, the cell can also be made of a 1-poly charge-trapping layer NMOS transistor (not shown).

FIG. 1A shows that the 2-poly HiNAND cell is subjected to a biased (charged) voltage of MV in both drain node 26 and source node 24 for Program-Inhibit. In particular, the gate 19 is applied with word line Vpgm voltage a while the MV at cell channel is at program-inhibit $V_{inhibit}$ voltage which is greater than Vdd, for example $V_{inhibit}$=7V. One advantage of adopting HiNAND broken-BL hierarchical structure is to allow the easiest setup of a low-power, least WL-pass disturbance, using multiple schemes for Program and Program-Inhibit operations including the enhanced SBPI (ESBPI) and direct non-SBPI as well as the conventional SBPI scheme to achieve high-yield and superior programming of 2D and 3D NAND flash memory.

Conventionally, more than 7V is generated in channels of the non-selected NAND cells through the coupling effect of rising WL-gate 20V with an initial floating Vdd-Vt voltage, which is about 1V when Vdd=1.8V. But when adopting HiNAND architecture, this 7V or greater can be generated directly from a $V_{inhibit}$ pump circuit and then directly coupled to the channels of unselected programmed NAND cells in multiple selected WLs and pages simultaneously by using the preferred low-power non-SBPI scheme as disclosed in the present invention. With $V_{inhibit}$ voltage being directly supplied to the channels of non-selected NAND cells, thus this non-SBPI $V_{inhibit}$ method is very effective with high Program and Program-Inhibit (PI) yield.

In an embodiment, a low-power ESBPI scheme is adopted to use a bias voltage more than Vdd but preferably below $V_{inhibit}$ of 7V. Since ESBPI uses $V_{inhibit}$ higher than Vdd as used by conventional NAND, thus the PI yield should be much higher and more reliable. Again using the ESBPI method, the bias voltage is also preferably generated from a pump on chip that is not coupled from the PB on top of NAND array. Thus the HiNAND architecture based on these HiNAND cells can still use the low-voltage PB as prior-art NAND design. Since the charged bias voltage is less than 7V, thus coupling effect similar to SBPI is still required.

Besides above two preferred PI methods, the third SBPI scheme using Vdd as program-inhibit voltage like the prior-art NAND can still be used for the present 2D HiNAND architecture for Multiple-WL and All-GBL simultaneous Program operation. Note, all above three methods, the SB effect to increase non-selected NAND cell channel voltage from the rising WL is still valid.

For those program-inhibit HiNAND cells, the channels are coupled directly with $V_{inhibit}$ from a $V_{inhibit}$ pump circuit through a preferred metal0 LBLps in HiNAND2 array or from a metal0 GBLps line from HiNAND1 array, rather than from PB. The Vt of Program-Inhibit cells would not be increased. If the Vt is E-state, then the program-inhibit cell's Vt should remain at E-state. Similarly, when A-state, B-state and C-state cells get program-inhibited, then they should stay at their respective initial A-state, B-state and C-state without being increased to next higher states.

In an embodiment, FIG. 1A shows the Non-SBPI biased conditions associated with the HiNAND cell: gate node Vg (19)=Vpgm=15V-25V, source node Vs (24) and drain node Vd (26) are at MV=$V_{inhibit}$~7V (Note, $V_{inhibit}$ is directly supplied by a selected LBLps or GBLps lines). $V_{TPW}$ (27)=0V, $V_{DNW}$ (28)=Vdd, and Vp-sub (29)=0V. In another embodiment, FIG. 1A also shows the ESBPI biased conditions: gate node Vg (19)=Vpgm=15V-25V, source node Vs (24) and drain node Vd (26)=$V_{inhibit}$, Vdd<$V_{inhibit}$<7V (Note, $V_{inhibit}$ is directly supplied by a selected LBLps or GBLps lines). $V_{TPW}$ (27)=0V, $V_{DNW}$ (28)=Vdd, and Vp-sub (29)=0V.

Figure 1B:
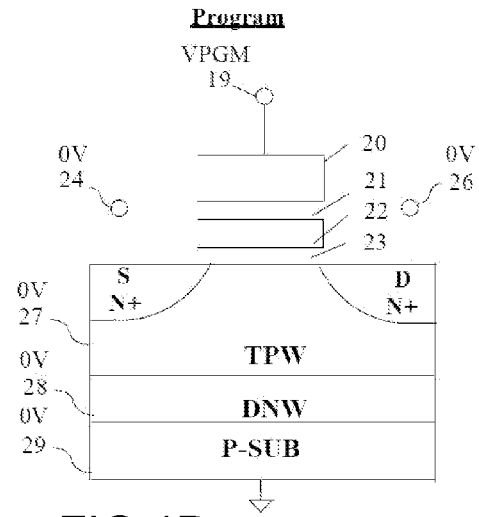
FIG. 1B is a cross-sectional view of a 2D NAND memory cell with channel biased condition at Vss=0V for Program according to an embodiment of the present invention.

FIG. 1B shows a preferred set of program bias conditions of 2D HiNAND cell for one or multiple-WL Program operations in 2D NAND flash cell. Again, the cell structure and device physics are the same for 2D HiNAND cell or 2D NAND cell and is also kept the same for 3D cell, too, in Read, Program, Erase, Program-Inhibit conditions without any process and design changes. After a low-power FN-channel Program operation that takes about 250 µS per SLC, 2D HiNAND cell's programmed Vts is increased from its initial negative erased-state (E-state) of Vte (≤-0.7V) to three desired positive programmed states such as A, B, C for a MLC cell or 7 positive states for one TLC cell and 15 positive states for one XLC cell.

As shown in FIG. 1B, the following Program bias conditions associated with the 2D HiNAND cell: gate node Vg (19)=Vpgm=15V-25V, source node Vs (24) and drain node Vd (26) are at 0V, $V_{TPW}$ (27)=0V, $V_{DNW}$ (28)=Vdd, and Vp-sub (29)=0V. Based on the conventional NAND cell but with new concept of broken global or local bit lines hierarchical structure, the HiNAND array architecture is provided in the present invention for achieving many advantages in power reduction, reduced latency, and increased speed in Program and Read operations.

Figure 1C:
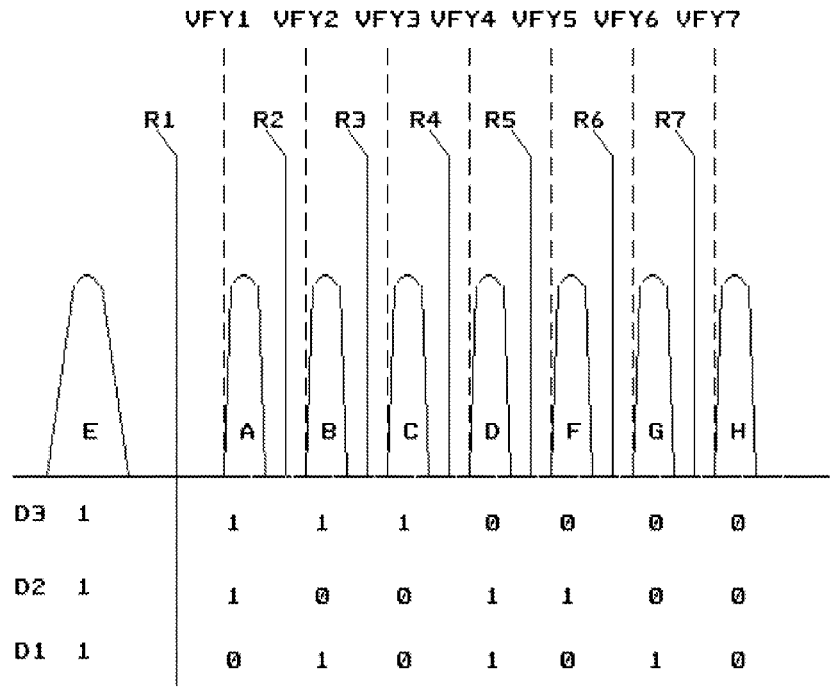
FIG. 1C is a diagram of 3-bit 8-Vt distribution of TLC-type storage for NAND memory cell according to an embodiment of the present invention.

FIG. 1C shows an exemplary eight Vt distributions of one TLC 2D or 3D HiNAND cell with 8 binary state assignments of 111, 110, 101, 100, 011, 010, 001 and 000 for 3 bits of one TLC data denoted as D3, D2 and D1. The E-state is termed as LSB state, H-state is the MSB state, and A-state to G-state are termed as 6 CSB states of one TLC cell. The eight states from LSB to MSB include E, A, B, C, D, F, G and H states from left to right. Many other eight TLC state assignments can also be accepted for both 2D and 3D HiNAND cell and array.

As shown, there are 7 verification voltages such as VFY1 to VFY7 as a regular 2D and 3D NAND with 7 corresponding Read voltages such as R1 to R7 for one selected WL in prior-art NAND's one-WL Program scheme but for multiple selected WLs for HiNAND's multiple-WL novel Program scheme. There are plenty of different VFYn and $V_{Rn}$ setups for multiple-state Vt for one 2D or 3D NAND cells of prior-art NAND. All these prior-art single-WL VFYn and $V_{Rn}$ setups can be adopted by HiNAND but extended into multiple-WL VFYns and $V_{Rn}$s with the same biased conditions on the same row address in all selected 64 WLs either in one consolidated Block or 64 dispersed WLs in 64 dispersed Blocks of HiNAND array. For a SLC storage, only 2 states of E-state and A-state are used with n=1, 2, while a MLC storage, 4 states of E, A, B and C are used. Similarly, for 15 states of XLC of larger assignments is used for both 2D and 3D HiNAND.

In today's 2D NAND spec, a SLC program time is about 250µs, a MLC program time is about twice of SLC, a TLC program time is about 3× of SLC of 750µs, and is 1.75 ms for a TLC Program, referred to N-bit cells for respective SLC, MLC, TLC, or XLC. In one-WL page Program, the program sequence starts from the bottom N-bit 2D NAND cells of WL[64] next to a top String-select transistor MG to the top N-bit 2D NAND cell WL[1] next to a bottom String-select transistor of MS per WL at a time.

More detailed six steps of one-WL Program in conventional 64-cell String of a 2D NAND is summarized below:

1st-step: Loading programmed-data cycle. The desired maximum program data in unit of one single physical WL of page with N GBLs are loaded into multiple N-bit Dynamic PBs and NX multiple Dynamic page buffers, serially or in parallel. The Program operation is then either performed in two ways: a) 1-cycle All-BL page Program scheme; b) 2-cycle of ½-BL Odd and Even logic pages Program scheme.

2nd-step: All 64 WL voltages of one selected Block pre-setting cycle. All gate lines of 64 selected WLs and two String-select transistors in one selected NAND Block are preset to the $1^{st}$-stage of the desired biased voltage such as Vpass of 10V with $V_{SSL}$=Vdd (bottom string-select transistor MS's gate) and $V_{GSL}$=Vss (top String-select transistor MG's gate) to avoid BL leakage in one selected NAND Block.

3rd-step: GBL $V_{inhibit}$ and Vss Precharging cycle of one selected WL. All N-bit GBL lines are coupled to the desired $V_{inhibit}$ and Vss in one selected WL in accordance with the desired page data stored in each PB at top of NAND array prior to Program operation.

4th-step: Single-WL simultaneous Program cycle. Only one selected WL in the selected Block is then coupled to a ramping voltage of Vpgm (15V-25V) for one iterative program pulse with a width ranging from 10 µs to 20 µs. The remaining 63 unselected WLs voltage are kept unchanged at Vpass of 10V. Different PI methods such as SB, LSB and EASB are used for Program. There are many un-selected Vpass voltages proposed by many prior-art NANDs. These different Vpass voltages include Vpass1, Vpaas2 to VpassJ. The voltages of Vpass1 to VpassJ vary from as low as Vss to Vdd to Vpass.

5th-step: Single page or WL Program verification cycle. All N-bit GBL capacitors are precharged to Vdd-Vt from top N-bit PB for 1-cycle All-GBL Read or 2-cycle ½-GBL Read. The precharged voltage of Vdd-Vt in each metal1 GBL is $V_{GBL}$=Vdd-Vt=0.7V to 1.0V. In this cycle, a slow and high pre-charged GBL current happens. A check of N-bit or ½N-bit data comparison is performed between the desired WL programmed data stored in the static-PG from system with the programmed data read out from one selected WL. If data comparison is matched, then Program is ended. If fails, then the Program and Program-Verify iteration are continued to the preset loops.

6th-step: Repeat single-WL Program and Program-Verify operation until the program time spec is over. The iterative single-WL Program and Program-Verify are performed only when the programmed data fails to meet the desired stored data in PB. The data can be SLC, MLC, TLC, and XLC or even the analog data with more than 16 Vt states per cell.

The present invention provides embodiments one- or multiple-WL and All-BL simultaneous Program operations for 2D HiNAND array, where the number of steps and the function of each step are different from above series of steps. Details will be found throughout this specification and particularly in subsequent paragraphs in accordance with FIG. 2A and FIG. 2B.

Figure 1D:
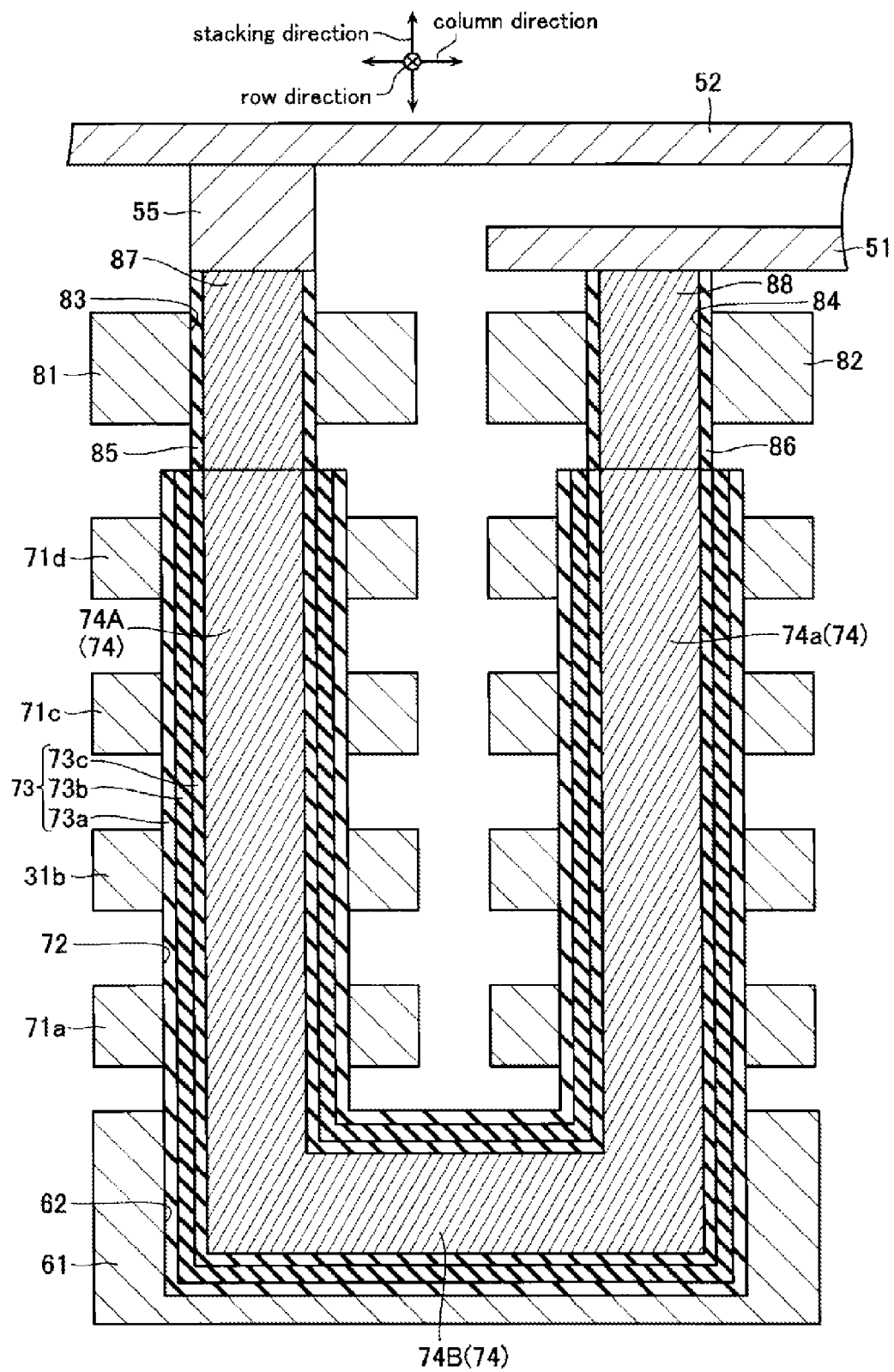
FIG. 1D is a cross-sectional view of a memory unit device configuration of a conventional U-shape vertical-channel 3D memory String that comprises eight 3D NAND cells.

FIG. 1D is a cross-sectional view of memory unit device configuration of a conventional U-shape vertical-channel 3D memory String that comprises eight 3D NAND cells. As shown, one U-shape 3D NAND 8-cell String is configured with one separate drain-string-select transistor 81 and one source-string-select transistor 82 respectively coupled at two ends. Layer 51 is a Vss metal0 line running in row direction of memory array and layer 52 is a metal1 bit line (BL), running in column direction and perpendicular to the metal0 Vss line. This 3D NAND String is formed on U-shaped body 74 with eight cells, such as 71d, 71a, etc including a gate insulation layer 73 being stacked in stacking direction. Additionally, a back-gate transistor 61 with same gate material including back-gate hole 62 is formed on the same body 74B(74) at the bottom of the stack. The blocking insulation layer 73a, charge-trapping layer 73b, and tunnel insulation layer 73c are shared by all 8 cell transistors and the back-gate transistor 61. But the drain and source NMOS string-select transistors 81 and 82 are respectively using the non-charge-trapping layers 87 and 88 with gate insulation layer 85 and 86 in between. The drain and source side holes 83 and 84 are formed respectively to penetrate the gates 81 and 82. The non-charge-trapping layer 87 of the drain-string-select transistor 81 is connected to the metal1 layer 51 via another metal layer 55 in the stack direction. The detailed description of the memory unit device can be referred to a vertical-channel 3D NAND scheme shown in U.S. Pat. No. 8,169,826 B2, titled with "Nonvolatile Semiconductor memory Device", and incorporated fully for references.

Throughout the disclosure of the specification, it will be seen that a preferred HiNAND array architecture with broken GBL or LBL scheme can be applied to convert the above U-shape vertical-channel 3D NAND structures to a 3D HiNAND structure for many advancements in Multiple-WL and All-BL Program, Read, and Program-Verify operations. The number of 3D NAND cells in a String can be flexibly extended from 8 cells shown in FIG. 1D to 16, 32 or even 64 for more area reduction.

Figure 1E:
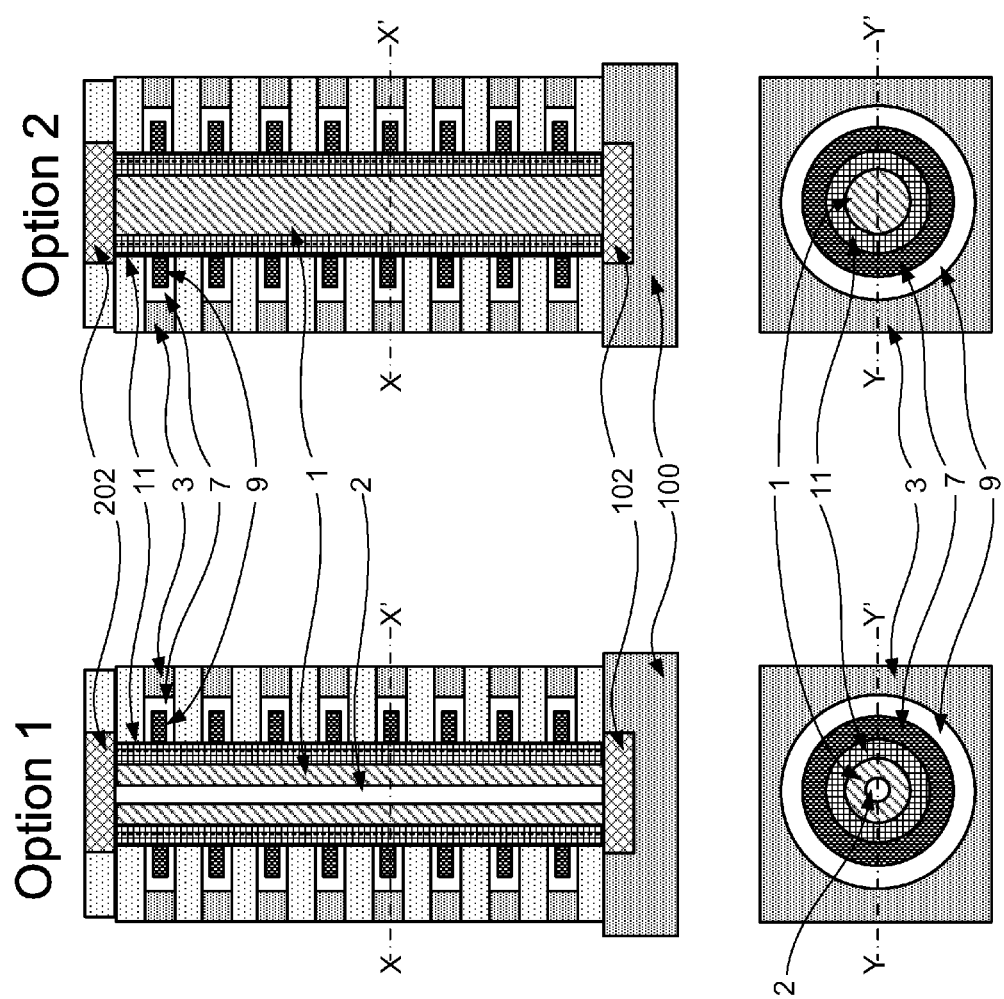
FIG. 1E shows respective side cross-sectional view and top cross-sectional view of two optional device configurations of an alternative conventional vertical-channel 3D NAND memory String.

Similarly, other known vertical 3D NAND structures can also be turned into a 3D HiNAND1 or HiNAND2 broken-BL array structure for Multiple-WL and All-BL operations. The same techniques disclosed here in this application can be also applied to different configurations of alternative 3D NAND structures. For example, FIG. 1E shows respective side cross-sectional view and top cross-sectional view of two conventional device configurations of an alternative vertical-channel 3D memory String. As shown in right side of the figure, an option2 configuration for a conventional 3D vertical NAND string is formed on substrate 100 with a lower electrode 102 below channel 1 and an upper electrode 202 over the channel 1 having a pillar shape perpendicular to the substrate 100. A plurality of control gate electrodes 3 formed over a stack of multiple device levels around the pillar shaped channel 1. A blocking dielectric 7, having a C-shape in the side cross-sectional view, is located adjacent to and surrounded by the control gate electrodes 3. A plurality of discrete charge-trapping segments 9 is respectively disposed in the opening portion of the C-shaped blocking dielectric 7 and coupled around the channel 1 via a surrounding tunnel dielectric 11. For the option 1 configuration shown in left side of the figure, the channel 1 is hollow inside which is filled with an insulation fill material 2. The top cross-sectional view reveals clearly the relative positions of the channel 1 (as well as fill material 2), the tunnel dielectric 11, the charge-trapped segments 9, and the blocking dielectric 7. The upper electrode 202 is the equivalent local metal1 line laid out to connect each vertical-channel 3D NAND String and the lower electrode 102 is connected to metal0 CSL line. The details of the vertical-channel 3D NAND cell technology shown above can be referred to U.S. Pat. No. 8,461,000, titled with "Method of Making Ultrahigh Density Vertical NAND Memory Device", incorporated fully as references. Based on the above 3D NAND cell String configuration by introducing a scheme with broken metal2 GBL, a broken metal1 LBL, metal0 for CSL, and metal0 LBLps line, a novel 3D HiNAND broken-BL hierarchical structure can be easily made for performing preferred Multiple-WL and All-GBL simultaneous Erase, Erase-Verify, Program, Program-Verify, and Read operations according to embodiments of the present invention. Details of the 2D (and 3D) HiNAND broken-BL hierarchical structure can be found throughout the specification and particularly below.

FIG. 2A is a circuit diagram of a 2D HiNAND1 array including 1-level broken-BL hierarchical structure for multiple-WL and All-GBL simultaneous Erase, Erase-verify, Program, Program-Verify, and Read operations according to a specific embodiment of the present invention. As shown, the 2D HiNAND1 array has 1-level broken-BL metal1 lines and one 2-sided page buffer (PB). In an embodiment, the 2D HiNAND1 array preferably comprises J HiNAND1 Groups, such as Group 1 to Group J, arranged in column (or Y)

direction of a 2D matrix of NAND cells. The J broken-metal1 BLlines form J capacitors $C_{GBL}$ in series divided by J−1 NMOS transistors, MGBL, where J is an integer selected from 8, 16, or greater. In other words, between any two adjacent $C_{GBL}$ capacitors of two adjacent Groups, there exists one bridge NMOS MHV device of MGBL transistor to connect two adjacent divided metal1 $C_{GBL}$ lines or capacitors. For total J HiNAND1 Groups, there are total J−1 divided $M_{GBL}$ transistors but J broken-GBL divided capacitors such as $C_{GBL\_1}$ to $C_{GBL\_J-1}$ per one column of the 2D HiNAND1 array.

Each HiNAND1 Group is further divided into L Segments in Y-direction (column direction) by L−1 Segment-select transistors, MDBLp, connected by shorter metal1 line within. The L Segments include Segment 1 to Segment L from top to bottom connected by L shorter broken metal1 lines (local capacitors such as CGBL_1_1 to CGBL_1_L) in each Segment. Furthermore, each HiNAND Segment is preferably divided further into K Blocks connected by K shorter metal1 lines in series in column direction. Each HiNAND1 Block further comprises N-bit NAND Strings that are cascaded in X-direction (row direction). Each HiNAND1 String comprises m NAND cells in series and sandwiched by one top and one bottom String-select transistors, MS and MG, respectively, where m=8, 16, 32, 64, 128 or any selected integer.

In addition, one end of each bit line for each Segment is connected to a corresponding metal0 power line, GBLps, along the X-direction through a corresponding NMOS transistor, MLBLs. This GBLps line is used for either precharging the local broken metal1 shorter Segment GBL line with a voltage up to $V_{inhibit}$ as explained above but also used for discharging it to Vss after program.

From top static-PB (Page-Buffer) viewpoint, all J HiNAND1 Groups with J $C_{GBL}$ capacitors are connected in series from the top Group 1 capacitor $C_{GBL1}$ directly and then through J−1 $M_{GBL}$ bridge transistors and J−1 metal1 $C_{GBL}$ capacitors to reach the bottom and last $C_{GBLJ}$ capacitor. From circuit viewpoint, the top static-PB of HiNAND1 array would have the smallest RC loading because only one 1×$C_{GBL}$ capacitor but zero resistance when reading the top Group 1 WL data without a need going through one transistor resistor MGBL at all with all with J−1 transistors MGBL being shut off in non-conduction state by setting control signals DIV_EN[1]= . . . =DIV_EN[J−1]=Vss during the Group 1 Read and Program operations. In contrast, in HiNAND1 array, the largest RC loading on each broken GBL line of each bit of static-PB when one WL is read out from Group J, which suffers the highest capacitances of J×$C_{GBL}$ capacitors and J−1 resistances of J−1 MGBL transistors by setting control signals DIV_EN[1]= . . . =DIV_EN[J−1]≥Vdd+Vt+$\Delta V_{margin}$ to fully turn on the J−1 MGBL transistors to allow full-passage of BL voltage among L Segments of J Groups.

The precharge and discharge of each $C_{GBL}$ capacitor can still be realized by connecting each broken $C_{GBL}$ line (corresponding to each Segment) to each corresponding metal0 power line LBLps through each corresponding divided BL transistor MLBLp by setting control signals SEG_1[1]= . . . = SEG_1[L]=Vdd or a higher Vread voltage.

In summary, HiNAND1 array is a circuit with 1-level broken Group and Segment GBL hierarchical structure. Although there only one metal1 line used to divide each long GBL line into broken ones for Groups and Segments, the preferred multiple-WL and All-GBL simultaneous Erase, Erase-Verify, Program, Program-Verify, and Read operations can be performed in either Consolidated or Dispersed Blocks for SLC, MLC, TLC, and XLC storages. More details about these operations would be explained throughout the specification and particularly in several paragraphs below in accordance with a 2-level broken-BL hierarchical HiNAND2 array circuit shown in FIG. 2B.

FIG. 2B is a circuit diagram of a 2D HiNAND2 array including 2-level broken-BL hierarchical structure for multiple-WL and All-GBL simultaneous Erase, Erase-Verify, Program, Program-Verify, and Read operations according to another specific embodiment of the present invention. This diagram is merely an example, which should not unduly limit the scope of the claims herein. One of ordinary skill in the art would recognize many other variations, modifications, and alternatives. As shown, FIG. 2B is a specific embodiment of HiNAND2 array circuit with a 2-level broken-BL hierarchical structure. The HiNAND2 array includes J Groups, such as Group 1 to Group J, of broken GBL lines associated with J broken metal2 $C_{GBL}$ capacitors located at topological higher level1 throughout each HiNAND2 column. Between any two adjacent metal2 $C_{GBL}$ capacitors of two adjacent Groups, there exist one NMOS GBL-divided transistor MGBL (similar to that in HiNAND1 array circuit, see FIG. 2A). For total J HiNAND2 Groups, there are total J−1 GBL-divided transistors MGBL respectively separating total J broken metal2 capacitors, such as $C_{GBL\_1}$ to $C_{GBL\_J}$, per one 2D HiNAND2 column.

Along Y-direction of the HiNAND array, each HiNAND2 Group is further preferably divided into L similar Segments, such as Segment 1 to Segment L, equally or unequally. Each Segment is connected by one local broken metal1 LBL line which is located one-level lower than the top level metal2 GBL line (or $C_{GBL}$ capacitor) to form a shorter local capacitor, $C_{SEG}$. Furthermore, each HiNAND2 Segment (associated with each $C_{SEG}$) is further divided into n sub-segments of K Blocks, such as Block 1 to Block K for sub-segment 1, Block K+1 to Block 2K for sub-Segment 2, . . . , till Block K×(n−1)+1 to Block K×n for sub-Segment n, by n−1 DBL-divided NMOS transistors, MDBLp. Correspondingly each sub-Segment is associated with a broken-LBL metal1 line that has a parasitic capacitor $C_{LBL}$, which is the smallest capacitance unit configured to be pre-charged up to $V_{inhibit}$ voltage for multiple-WL Program operation. Each HiNAND2 Block further includes N-bit NAND Strings, extending from left to right across whole HiNAND2 array in X-direction. Each HiNAND2 String includes M NAND cells connected in series and sandwiched by one top and one bottom String-select transistors, MS and MG, respectively, where typically M=64 in FIG. 2B but can be other integer numbers such as 16, 32 or 128. The preferred HiNAND2 String architecture and process and layout basically is identical to prior-art 64-cell NAND String in terms of cell size and the basic Erase, Program and Read conditions.

From 1-sided top N-bit PB viewpoint, all J HiNAND2 Groups with J $C_{GBL}$ capacitors are connected in series starting from the top Group 1 $C_{GBL1}$ capacitor directly, then through J−1 MLBLp LBL-divided transistors per GBL column to the bottom last Segment $C_{SEGJ}$ capacitor through n MDBLp Segment-divided transistors per Segment.

From circuit viewpoint, the top N-bit PB of the HiNAND2 array would be associated with the smallest RC loading because only one 1×$C_{GBL}$ capacitor but zero resistance along the path when reading the top Group 1 WL data without a need going through one transistor resistor MGBL at all with all J−1 transistors $M_{GBL}$ being shut off in non-conduction state by setting control gate signals DIV_EN[1]= . . . =DIV_EN[J−1]=Vss during the Group 1 Read and Program operations. In contrast, in HiNAND2 array would be associated with the largest RC loading on each GBL line of each bit of the static PB when one WL is read out from bottom Group J, which suffers the highest capacitances of J×$C_{GBL}$ capacitors and J−1 resistances of J−1 transistors MGBL by setting control gate signals DIV_EN[1]=...=DIV_EN[J−1]≥Vdd+Vt+$\Delta V_{margin}$ to fully turn on J−1 transistors MGBL to allow full-passage of BL voltage among L Segments of J Groups.

In 1-level BL structure, for J−1 broken-GBL metal1 lines per one GBL column, there is no any pull-down transistor device connected to Vss and power lines. While in the 2-level BL structure, each metal2 $C_{GBL}$ capacitor or divided metal2 GBL line can connect via one dedicated pull-down transistor to a horizontal (X-direction) bus (e.g., LBLps 1[1] for Segment 1) located at a level even lower than metal1 LBL lines. In an embodiment, as shown in FIG. 2B, to save the whole HiNAND2 silicon area, this pull-down device like each MLBLs transistor is removed. Instead, the precharge and discharge of each broken-Group $C_{GBL}$ capacitor can still be realized by connecting each $C_{GBL}$ to each corresponding local metal1 LBL line through each corresponding LBL-select transistor MLBLp per Segment by setting control signals SEG_1[1]=...=SEG_1[L]=Vdd and by connecting the local metal1 LBL line (or multiple metal1 broken-LBL lines via corresponding LBL-select transistors MLBLs for all sub-segments) to a common metal0 LBLps power line.

In the following sections, the detailed Multiple-WL and All-BL Read and Program operations for the HiNAND2 array circuit (FIG. 2B) will be explained with reference to HiNAND1 shown in FIG. 2A in accordance with the preferred set of bias conditions shown in FIG. 8 of the present specification.

As explained before, this HiNAND2 array has 2-level broken-GBL hierarchical structure. In an embodiment, the single level long metal1 GBL line used in conventional NAND array has been replaced by a top level metal2 line that is purposely divided into J broken and equal $C_{GBL}$ capacitors. In a specific embodiment, each metal2 broken GBL line length and capacitance can be flexibly divided not equally. For example, the last one metal2 broken GBL line associated with Group J is preferably made much longer than that associated with the first metal2 broken-GBL line associated with Group 1 because Group J is the farthest Group relative to the 1-sided static PB at top of the HiNAND2 array. Thus the dilution of stored charge to the PB would be the worst case. Thus, if it is designed to have larger $C_{GBL}$ capacitance for the farthest Group J, it can have more charges so as to have less dilution at PB. In other words, one option of HiNAND array is to have longer broken GBL line for Group J.

The HiNAND2 array architecture is divided into J Groups by inserting J−1 NMOS MHV (~7V) Group-divided transistors MGBL into each long GBL metal2 line. In other words, the conventional one long global metal1 GBL metal line is elevated to a metal2 line and then is divided by J−1 transistors MGBL into J metal2broken GBL lines respectively associated with J GBL capacitors (denoted as $C_{GBL\_1}$ to $C_{GBL\_J}$ capacitors) per HINAND column.

Each MHV transistor MGBL acts as a bridge device between two adjacent $C_{GBL}$ capacitors associated with the same broken metal2 line. The top end of each metal2 $C_{GBL1}$ capacitor is directly connected to one corresponding input and output (I/O) of N-bit PB (Page-Buffer). The J value is preferably set to be 16 or 8 but not more than 16 for a reliable DRAM-like charge-sharing Read operation and for cutting the power consumption to 1/16 for one-WL and All-GBL Read of HiNAND2 array.

In an embodiment, there are L lower-level, smaller local metal1 LBL lines or capacitors, $C_{SEG}$, per each corresponding top-level metal2 $C_{GBL}$ capacitor. In other words, the length ratio of the local LBL line to GBL line per Group is defined as: Ratio(length)=GBL/LBL=L.

Accordingly, each Group within the HiNAND2 array is divided into L Segments, from Segment 1 to Segment L, laid out in Y-direction. Each Segment in any Group has one dedicated local metal1 bit line associated with a $C_{SEG}$ capacitor. Furthermore, each $C_{SEG}$ capacitor is divided into n broken-LBL metal1 lines by n−1 LBL-divided transistors MDBLs with their gates commonly tied to a control signal DI_1_1~n[1], ..., or DI_1_1_n[L], depending on it is in which Segment, 1 through L. Each broken-LBL metal1 line is associated with a smallest parasitic capacitor, $C_{LBL}$, connected to K Blocks in parallel. In an embodiment, every local LBL in each Segment, e.g., Segment 1, of Group J connects to one horizontal (X-direction) metal0 power line LBLps_J[1] (see FIG. 2B) via a pull-down transistor MLBLs. In another embodiment, every metal1 broken-LBL line in each sub-segment in Segment 1 of Group J is connected commonly to the metal0 power line LBLps_J[1] respectively via separate pull-down transistor MLBLs. In yet another embodiment (not shown in FIG. 2B), two mirrored Segments (of Group J) share one horizontal metal0 power line LBLps_J[L/2]. In this case, there are total L/2 LBLps_1 lines per Group (J) such as LBLps_J[1] to LBLps_J[L/2].

In the example of FIG. 2B, the preferred HiNAND2 array has an optimal value of L<4 for a tradeoff between the precharged supply program-inhibit $V_{inhibit}$ current and number of LBL-divided transistors MLBLs per Group. For example, if L=4, that means one Group contains four Segments so that minimum four rows of MLBLs transistors per Group are required for multiple WL Read operation. Of course, when each Segment is divided into n sub-segments for a preferred advantage of faster simultaneous multiple WL Program operation, n−1 more rows of MLBLs transistors are needed per Group. But one LBLps_J power line can be shared by two adjacent Segments and also shared by n sub-segments within each Segment for area reduction.

Each MLBLs transistor will be used to precharge charges up to $V_{inhibit}$ voltage~7V during Program and selectively discharge to Vss after Program operation from LBLps_J metal0 line to each corresponding $C_{LBL}$ capacitor that is initially preset to Vss voltage.

In addition, each MLBLs transistor has second usage to precharge and discharge charges of Vdd in both metal1 $C_{LBL}$ and metal2 $C_{GBL}$ through the corresponding MLBLs and MLBLp transistors per one Segment during Multiple-WL and All-BL Program and Read operations when control signals PRE_J and SEG_J are set to Vdd and LBLps_J is set to Vdd in an one-shot pulse.

Each HiNAND2 Jth Group comprises N metal2 GBL lines such as GBL_J[1] to GBL_J[N], extending in X-direction and laid out in parallel to word lines (WLs). Each long BL column comprises J broken metal2 $C_{GBL}$ lines (or capacitors) and laid out in Y-direction perpendicular to WLs. Only the top metal2 $C_{GBL}$ lines are connected directly to N Inputs/outputs of a top circuit block comprising of one N-bit static-PB, one N-bit Multiplier and one N-bit Sense Amplifier (SA).

In an embodiment, each broken $C_{GBL}$ metal2 line of each Segment from Segment1 to Segment L within each HiNAND2 Group is laid out in such a way with a preferred capacitance or length ratio R=$L_{LBL}$/$L_{GBL}$<1/16, where $L_{LBL}$ is the length of a metal1 LBL line, while $L_{GBL}$ is the length of a metal2 GBL line. Therefore, by applying a preferred DRAM-like BL charge-sharing technique at least to the farthest Jth Group for performing Multiple-WL and All-GBL Read operation in unit of one full physical WL or a full page on this HINAND2 array, the precharge voltage (current) can be reduced by above similar ratio.

Firstly, detailed operation of the preferred DRAM-like charge-sharing technique for one-WL and All-BL HiNAND2 Read will be explained below. Similarly, the same technique can be easily extended to Multiple-WL and All-BL Read.

For typical NAND array with one-level BL structure, there are two schemes of Read operation. One scheme is called as 1-cycle All-BL Read, the other scheme is called as 2-cycle Odd/Even Read. In this HiNAND2 array with multiple-level BL hierarchical structure, the All-BL Read scheme is changed to All-GBL or All-LBL Read scheme. The All-BL Read scheme is a Voltage-sensing scheme that requires a precharge of $V_{GBL}$ prior to voltage sensing. The advantage of the voltage sensing scheme is low-power consumption but is prone to fail due to the proximity noise coupling effect happening between adjacent BLs and adjacent WLs.

A typical All-GBL Read method based on conventional NAND uses a voltage-sensing and precharge-GBL scheme. It is like a 1-cycle Read from one full physical WL or page of the NAND array. All $C_{GBL}$ capacitors are first precharged to Vdd-Vt prior to cell sensing. Subsequently, upon sensing, the precharged voltage of Vdd-Vt of each $C_{GBL}$ is then either discharged to Vss for those selected NAND cells in On-state or retains the precharged Vdd-Vt for those NAND cells in Off-state in one or more selected WLs applied with WL Read voltage $V_{Rn}$. The advantage of this voltage-sensing scheme is no DC current flow, thus Read power consumption is smaller. But the disadvantage is higher rate of producing fault data bits due to the severe coupling noise generated between two adjacent BL-BL and WL-WL.

The WLs and BLs bias conditions of the selected String in the selected Block are listed as: a) Read voltage for a select WL=$V_{Rn}$, n=1 for SLC Read but n=3 for MLC Read; b) $V_{R1}$=0V for a SLC Read to distinguish one erased E-state and one programmed A-state; c) $V_{R1}$=0V, $V_{R2}$=2.5V and $V_{R3}$=4V for 4-state MLC Read, where $V_{R2}$ is used to distinguish an A-state and a B-state and $V_{R3}$ is used to distinguish a B-state and a C-state; d) $V_{GBL}$=0.7V-1.0V is precharged to all metal1 GBL lines initially prior to reading by shutting off NAND Strings; e) $V_{GBL}$ retains 0.7V-1.0V, if the selected NAND cell's Vt is above $V_{Rn}$, thus no conduction of cell current when $V_{Rn}$ is applied to one selected WL along with M−1 non-selected WLs=Vpass=6V (assuming it is a M-cell NAND String); and f) $V_{GBL}$ is discharged to 0V, if the selected NAND cell's Vt is below $V_{Rn}$, thus a conduction of cell current happens to pull down the precharged GBL of 0.7V-1.0V.

Another typical All-GBL Read method in conventional NAND uses current-sensing and non-precharge-GBL scheme. The disadvantage of this current sensing scheme is high read power consumption because of DC current flow. But the advantage is an immunity of severe coupling noise generated between the adjacent BL-BL and WL-WL, thus the data is more solid. Unfortunately, each NAND String's equivalent resistance could reach up to 1-10 MS2 due to 100 nA String current. Thus, a current-sensing scheme for NAND String Read operation has more design difficulties and challenges than voltage-sensing scheme.

Yet another typical Read operation in conventional NAND uses Odd/Even-GBL Read scheme. Under this type of Read operation, it is like a 2-cycle Read from one full physical WL or page of NAND array. The whole physical WL is alternately divided into 2 logic SLC pages with halves of all GBLs based on odd/even numbered BLs. One half GBLs are denoted as GBLo lines and the other half GBLs are denoted as GBLe lines. The idea of this scheme is to use the unselected interlaced GBLs as a shielding GBL. For example, when reading all GBLo lines, then all GBLe lines are either biased at Vss or Vdd-Vt as the shielding GBLs to protect the signal development of all GBLo from corruption due to the coupling noises from discharging between BL-BL.

Recently, the shielding voltage of GBLe or GBLo lines is preferably biased to be Vdd-Vt, rather Vss, the value of Vdd-Vt is set about 0.7V to 1.0V, so that WL coupling SBPI scheme is used to eliminate or mitigate the Vpgm WL stress with superior P/E cycles on those unselected, programmed cells located in the shielding GBLs. However, this 2-cycle Odd/Even GBL voltage-sensing scheme consumes more power because one time precharge of the whole non-broken $C_{GBL}$ is required.

The WLs and BLs bias conditions of the selected String in the selected Block are listed as following: a) Read voltage for a select WL $V_{Rn}$, n=1 for SLC but n=3 for MLC; b) $V_{R1}$=0V for a SLC to distinguish E-state and A-state; c) $V_{R1}$=0V, Vr2=1V, $V_{R2}$=2.5V and $V_{R3}$=4V for MLC, where the $V_{R2}$ is used distinguish A-state and B-state and $V_{R3}$ is used distinguish B-state and C-state; d) $V_{GBLo}$=0.7V-1.0V or 0V for GBLo shielding effect when GBLe lines are selected for half-WL Read; e) $V_{GBLe}$=0.7V-1.0V 0V for GBLe shielding effect when GBLo lines are selected for half-WL Read; f) $V_{GBLo}$=0V, if the selected NAND cell's Vt in GBLo is below $V_{Rn}$, thus a conduction of cell current; g) $V_{GBLo}$=0.7V-1.0V, if the selected NAND cell's Vt in GBLo is above $V_{Rn}$, thus no conduction of cell current; h) $V_{GBLe}$=0V, if the selected NAND cell's Vt in GBLe is below $V_{Rn}$, thus a conduction of cell current; and i) $V_{GBLe}$=0.7V-1.0V, if the selected NAND cell's Vt in GBLe is above $V_{Rn}$, thus no conduction of cell current.

In an embodiment, Multiple-WL and All-GBL simultaneous Read operation with a preferred DRAM-like charge-sharing technique in HiNAND2 array is provided in the present invention with reference to a preferred set of biased conditions, as shown in FIG. 8. In HiNAND2 array, both All-GBL and Odd/Even GBL schemes can be adopted for Read operation. But All-GBL Read scheme is preferably adopted over Odd/Even GBL Read scheme for achieving the superior performance and reliability. Therefore, only details about the All-GBL Read scheme would be provided. One step further, Multiple-WL and All-BL Read scheme is proposed below to achieve 10-fold or even 100-fold improvements in both Read and Program operations over conventional NAND by using 2 metal lines only for this 2-level broken-BL hierarchical structure without changing the existing cell structures of NAND cell and conditions for operating Read, Program, and Erase. In addition, the HiNAND2 circuit die size at least is kept the same as the conventional NAND because only few NMOS divided devices are added in the conventional long and heavy GBL that has hundreds or thousands of NAND cells in one GBL column. Thus many advantages of the HiNAND2 array with 10× to 100× performance improvements over conventional NAND are achieved without causing bigger die size, regardless of 2D or 3D NAND technologies.

Note, HiNAND2 All-GBL Read scheme is a new kind of All-BL Read scheme. Although it still uses a precharge method for all GBL without the division into two alternative GBLe and GBLo groups, the precharged capacitance is cut down to 1/16 of $C_{GBL}$ of conventional NAND. Correspondingly, the voltage sensing data is multiplied 2-3 folds first and then fed to latch-type SA and further amplified by a DRAM-SA operation technique. Details of the charge-sharing, sensing voltage multiplication, and SA amplification can be found in U.S. patent application Ser. No. 14/283,209, filed on May 20, 2014 and U.S. patent application Ser. No. 14/316,936, filed on Jun. 27, 2014, all fully incorporated as references for all purposes.

For example, All-GBL lines of HiNAND2 array are pre-discharged to Vss through one MHV(~7V) device MGBLs through LBLps power line, which is made of similar String-select NMOS MHV transistor of MS or MG of the HiNAND1 array shown in FIG. 2A. Since the MHV device has a thinner gate oxide compared to a HV (20V) of transistor used in the conventional NAND, plus the broken-GBL capacitance is only 1/16 of unbroken-GBL capacitance, thus the discharge and charge speed of broken GBL capacitance is at least about 8-fold faster due to the smaller conducting transistor's resistance.

As an example, a set of bias conditions of HiNAND2 One-WL & All-GBL simultaneous Read operation are listed here, which is like a 1-cycle Read from one full physical WL or page of HiNAND2 array. For one selected page in the selected Block, the WLs and BLs bias conditions include 1) Read voltage for a select $WL=V_{Rn}$, n=1 for SLC Read, but n=1, 2, 3 for MLC Read; 2) $V_{R1}$=0V for a SLC read to distinguish E and A state; $V_{R1}$=0V, $V_{R2}$=2.5V, and $V_{R3}$=4V for a MLC read. 3) $V_{R2}$ is used to distinguish A-state and B-state. $V_{R3}$ is used to distinguish B-state and C-state.

The whole concept of the HiNAND2 Read operation is to use charge-sharing scheme like DRAM along with the WL-voltage. The precharge is still needed for this HiNAND All-GBL Read, but not to precharge the long and heavy unbroken GBL capacitor in the conventional NAND to Vdd-Vt that would consumes too much precharge-power due to each big GBL capacitance of 3-5 pf, instead, to precharge each broken metal2 $C_{GBL}$ capacitance in the HiNAND2 array which can be reduced to only 1/16 of original big GBL capacitance of 3-5 pf to become about 0.1875 pf~0.3125 pf in layout. Thus the precharge current can be also reduced to 1/16 if the precharged voltage is same as Vdd-Vt. For HiNAND charge sensing, the precharged voltage is preferably changed to Vdd for more stored charges with a bigger signal for more reliable charge-sharing operation. The HiNAND2 Multiple-WL and All-GBL Read operation is divided into eight operation steps/cycles in accordance with various biased conditions shown in FIG. 8 and FIG. 9 of the specification as well as the HiNAND2 array circuit shown in FIG. 2B of the specification.

Step 1: To simultaneously predischarge the voltages of all broken N×LBL/N×GBL capacitors to multiple mixed power/Vss lines denoted as a LBLps line in one or multiple Segments in one or multiple Groups.

In an embodiment, the HiNAND2 array includes preferably only one power line of LBLps per one Segment within one Group for saving silicon area. Thus there are several ways to pre-discharge each broken $C_{GBL}$ and associated $C_{SEG}$ capacitors. For example, each Group has J Segments, thus it has J LBLps lines. Any charges stored in each $C_{SEG}$ can be easily discharged through each corresponding connection device MLBLs by setting its gate signal PRE_1[J] to Vdd and connecting corresponding LBLps line to ground Vss. The charges stored in each bigger $C_{GBL}$ per Group can have 1 to J discharged paths through 1 to J MLBLs transistors to corresponding 1 to J LBLps lines. But more MLBLs transistors, more PRE_1[J] control lines have to be coupled to Vdd, thus more power consumption is resulted. Additionally, each broken $C_{GBL}$ capacitance is set to be only 1/16 of each conventional unbroken long and heavy $C_{GBL}$, thus one LBLps line is selected for discharging a selected one $C_{GBL}$, one $C_{SEG}$, and one corresponding selected NAND String.

Thus the selected PRE, SEG, SSL control signals are coupled to Vdd and the LBLps to Vss as seen in the first column of table in FIG. 9. If the Segment 1 of Group1 are selected, then $V_{PRE\_1[1]}=V_{SEG\_1[1]}V_{SSL[1]}$=Vdd and $V_{LBLps[1]}$=Vss. The signals corresponding to rest J−1 Segments $V_{PRE\_1[J]}=V_{SEG\_1[J]}=V_{SSL[1]}$=Vss and $V_{LBLps[1]}$=Vss. Since the discharge current is flowing through each corresponding MHV transistor MLBLs simultaneously and collectively, thus the discharge time is as fast as 100 ns or less for all selected LBL and GBL lines and capacitors.

Step 2: To precharge one selected local smaller $C_{SEG}$ and one associated $C_{GBL}$ per column, where $C_{SEG} \ll C_{GBL}$. Several embodiments of the precharging method for HiNAND2 Multiple-WL and All-BL Read operation are provided.

In an embodiment, Read operation is to randomly read out data preferably from All-GBL and J-WLs simultaneously based on only one same selected WL address per Segment per Group, where J≤16. The HiNAND2 array architecture allows total J pages of data to be read simultaneously out from J different Groups but on the basis of one WL per one Group. In other words, a multiple-WL randomly Read scheme means each selected WL in different Segment and Groups remain at a same position in corresponding selected NAND String with a same address. Different address multiple-WL Read scheme is possible if the Block's WL address can be locked in for the random-select ones.

In another embodiment, Read operation is to read multiple WLs simultaneously and preferably from one Segment of one or more Groups. In this embodiment, the HiNAND2 scheme flexibly allows read more than one WL from one or more selected Segments within one or more Groups simultaneously. For example, it allows to read L pages (WLs) of data simultaneously from L Segments (one WL per one Segment basis) of the selected Groups which are laid out near top PB with much less $C_{GBL}$ loading for more reliable charge-sharing SA operation.

The preferred precharge happens on N shorter LBL metal1 $C_{SEG}$ capacitors that have only 1/16 of each broken $C_{GBL}$ capacitance. These N LBL lines include LBL_1[1] to LBL_1[N] in the selected multiple Segments per Group. Unlike Vdd-Vt precharge voltage for prior-art NAND through a 20V long-channel device with a very slow precharge time (~5 μs), the precharged LBL voltage is preferably set to be Vdd of 1.8V for the HiNAND2 array through a MHV (7V) transistor MLBLs by setting the gate control signals PRE and SEG to Vread>Vdd so that a full Vdd passage to N $C_{SEG}$ capacitors, as shown in the second column of table in FIG. 8. Other associated signals such as the selected SSL, LBL, and GBL are set to Vdd but the unselected SSL, LBL, and GBL are set to Vss. Vdd voltage greater than 1.8V can be used as well but the precharged power consumption would be increased accordingly.

In addition to precharge the selected LBLs and GBL lines (or capacitors), the selected and unselected WLs in the selected Block in the selected Segments of a selected Group are also preferably precharged to $V_R$ and Vread respectively and simultaneously to save total time delay of Read operation. $V_R$ voltage is Read voltage for distinguish E-state or A-state of a selected NAND cell. Vread voltage typically is set to be around 6V. The Vread voltage for unselected WLs is called Vpass.

As a result, the precharge time of the selected $C_{SEG}$ and $C_{GBL}$ can be completed within 100 ns, which is very fast. But Vpass precharge time for unselected WLs is much longer up to few μs. Thus among all cycle time of the BL and WL precharge step, the Vpass precharge time is the bottleneck.

Note: The voltage of Vdd-Vt–0.9V in prior-art NAND at Vdd=1.8V. Table 1 shows a comparison of precharge step performed respectively for conventional NAND and HiNAND2.

TABLE 1

| Comparison of precharge | Conventional NAND | HiNAND2 |
|---|---|---|
| Precharged voltage | 0.9 V (1X) | 1.8 V (2X) |
| Precharged capacitance | 100% = N × $C_{GBL(unbroken)}$ | 6.25% = N × $C_{GBL(broken)}$ + N × $C_{LBL(broken\ or\ non-broken)}$~N × (1/16)$C_{GBL(unbroken)}$ |
| Precharged BL current ratio: CV | 100% (1-WL & All-GBL) | 1.25% (1-WL & All-GBL) |
| Precharged BL current ratio: CV | 100% (1-WL & O/E GBL) | 6.25% (1-WL & All-GBL) |
| Precharged GBL time | 100% | ~2% (negligible) |
| Precharged WL time (one block) | 100% | 100% |
| Precharged WL time (16 blocks) | 100% | 6.25% |

Note:
WL precharge time means Vpass precharge time on 63 unselected WLs for a 64-NAND String. The simultaneous precharge on multiple selected WLs of the selected Blocks tremendously saves time delay for this cycle of Read operation.

Alternatively in another embodiment, as shown in FIGS. 2A and 2B, each Segment is further divided into n sub-Segment by n−1 NMOS 1-poly transistors. Thus each LBL metal1 line is divided into n broken-LBL metal1 line associated with an even smaller parasitic capacitor $C_{LBL}$. In this case, the precharged voltage through independent power line LBLps_J per Segment, the precharge operation can be performed on each sub-Segment independently and simultaneously for multiple sub-Segments in different Segments of one or more Groups to a higher voltage up to $V_{inhibit}$~7V for taking advantage of further reduced power in precharging step while still has sufficient voltage level after charge-sharing that can be amplified by the Multiplier in the PB to a value close to 1V for proper charge-sensing by Latch SA.

Step 3: To discharge $C_{SEG}$ and $C_{GBL}$ on one or multiple selected WLs with $V_R$. After all N×LBL associated N×GBL broken lines (or capacitors) are fully precharged to 1.8V simultaneously, the desired set of various control voltages of GSL, SSL and 64 WLs are respectively applied for one selected WL and multiple unselected WLs per selected one or more Blocks in the selected Segments and Groups for a preferred Multiple-WL & All-GBL simultaneous Read or Program-Verify operation with all LBL-select transistors MLBLp (connected between the LBLs and GBLs) being at off-state.

For example, for a SLC Read, then the selected WL=0V, and unselected 63 WLs=Vpass=6V and GSL[1]=Vread but SSL[1]=Vdd. For part of N×$C_{SEG}$, the precharged voltage will start to discharge from initial 1.8V to Vss if the corresponding NAND cells' Vt=Vte<−0.7V, an E-state, within a predetermined discharge time. For the remaining part of N×$C_{SEG}$ their precharged voltage will not discharge and retain its initial 1.8V if the corresponding NAND cells' Vt>0, which is A-state.

Thus, after the Step 3 of Multiple-WL & All-BL Read operation, the LBL lines in the selected Segments and the broken GBL lines in the selected Groups will trap respective Vss and 1.8V voltages in accordance with the stored NAND data pattern on the selected WL of the selected Block in the selected Segment in the selected Group of this HiNAND array. After J-WL & All-BL Read, either 1.8V or Vss will be stored separately in all N×GBL_1 to N×GBL_J capacitors in accordance with the stored data in multiple WLs when all DIV_EN[1]==DIV_EN[J−1]=Vss.

The comparison of the discharged time between HiNAND2 and conventional NAND are summarized in Table 2 below. Note the discharge happens not only on 1-WL & All-GBL of one selected Block in accordance with one WL data but also happens on Multiple-WL & All-GBL in accordance with J WL data. The final read data patterns are stored in J isolated broken $C_{GBL}$ capacitors before being dumped to PB. Note: The voltage of Vdd-Vt=0.9V in prior-art NAND at Vdd=1.8V.

TABLE 2

| Comparison of discharge | NAND | HiNAND2 |
|---|---|---|
| Initial voltage before discharge | 0.9 V (1X) | 1.8 V (2X) |
| Discharged capacitance | 100% = N × $C_{GBL(unbroken)}$ | 6.25% = N × $C_{GBL(broken)}$ + N × $C_{SEG}$~N × (1/16)$C_{GBL(unbroken)}$ |
| Discharged GBL/LBL current | 1X | 1X |
| Discharged GBL/LBL time for 1-WL and All-GBL scheme | 100% | <12.5% |
| Discharged GBL/LBL time for 16-WL and All-GBL scheme | 100% | <1% |

In this discharge operation, the HiNAND2 architecture has almost one-order of improvement over state-of-art NAND in 1-WL & All-GBL Read. Assuming M(J)=16 in FIG. 8, then 16-WL & All-GBL discharging time is almost zero as compared to the conventional NAND. This is a big saving in NAND Read time.

For example, a typical SLC discharged time is about 100 for one WL read. For 16-WL read, then the total discharge time is about 1600. For this HiNAND2 simultaneous multiple-WL & All-GBL Read operation, the total discharging time is nearly 0. This is a dramatic improvement in NAND Read time record.

Step 4: To perform charge-sharing operations of $C_{SEG}$ and $C_{GBL}$ for the multiple-WL & All-GBL Read operation.

In an example with J=16 (or 16 Groups in the HiNAND array), after the previous discharge cycle, 16 respective $C_{GBL}$ capacitors that store the isolated voltages of 0V or 1.8V in accordance with the corresponding stored data in 16 selected WLs in 16 NAND Groups of the HiNAND2 array according to an embodiment of the present invention. These 16 $C_{GBL}$ capacitors are lined up from bottom to up of each GBL column such as GBL_J in bottom Group J to GBL_1 in top Group 1. Any two adjacent $C_{GBL}$ capacitors are isolated by 15 off-state NMOS GBL-select transistors such as MGBL15 to MGBL1 from GBL bottom to GBL top, which is directly connected to N-bit PB.

The charge-sharing step/cycle (Step 4) can be divided into 15 sequential sub-steps for 16-WL and All-BL simultaneous Read or Program-Verify operation. Note, the simultaneous Multiple-WL & All-BL Read or Program-Verify operation means at least the following three steps: step 1 for pre-discharging LBL/GBL, step 2 for precharging LBL/GBL, and step 3 for discharging LBL/GBL can be performed simultaneously. Thus the time delay has been cut to be almost negligible in HiNAND2 as compared to the conventional NAND. But from the Step 4 to Step 8 in FIG. 8 and FIG. 9, the remaining operation steps cannot be performed simultaneously because only one shared PB and GBL path to the PB. The 16-WL data stored in respective $C_{GBL}$ capacitors have to be sent to the PB in sequence that starts from top Group 1, followed by Group 2, . . . , and lastly, Group J, which is Group16 in the present example.

In a first sub-step, only the N×$C_{GBL}$ of GBL_1[1]= . . . =GBL_1[N] in top Group 1 would be evaluated in top N-bit PB with N-bit Multiplier and N-bit SA. The rest of N×$C_{GBL}$ capacitors in Group 2 to Group 16 would be completely isolated from each other during the read or data evaluation cycle of Group 1 to avoid data contention in each long GBL line.

In the Group 1 data evaluation Read cycle, actually, no charge-sharing occurs with other $C_{GBL}$ capacitors of the rest 15 Groups. Thus the voltages of Vss and Vdd (1.8V) are 100% to be coupled into the PB for data evaluation without degradation. Thus, the biggest signal of Vdd and Vss are sensed by the PB when the selected WL data is read.

Once the first N-bit $C_{GBL}$ voltages have been loaded in parallel into the only one Voltage-multiplier in the N-bit PB on top of the HiNAND2 array for data evaluation, the voltage of first N-bit $C_{GBL}$, GBL_1[1], . . . , GBL_1[N], has to be discharged to Vss first. In other words, GBL_1[1]= . . . =GBL_1[N] are reset to Vss before second N-bit $C_{GBL}$ capacitors that store new voltages of second WL data to be transferred.

But before turning on second N-bit $C_{GBL}$ capacitors of GBL_2[1] to GBK_2[N] to connect to the first N-bit $C_{GBL}$ capacitors GBL_1[1] to GBK_1[N], the N×MLBLp have to be shut off first to isolate the selected Block in Group 1 from the selected Block in Group 2 by setting signal SEG_1[1] to Vss before setting the divided transistor gate signal DIV_EN [1] to Vread to connect N×GBL_1[2] to N×GBL_1[1]. But because the connection is preferably only happening between N×GBL_1[2] to N×GBL_1[1]. The rest connections of N×GBL_1[2] to N×GBL_1[16] are still kept isolated from each other. Thus, the rest of divided transistor MGBL gate voltages are set to be Vss, such as DIN_EN[2]=DIN_EN[3]= . . . =DIN_EN[15]=Vss.

Since the voltages of each GBL_1[2] is either Vss and Vdd of divided transistor 1.8V to share with the identical $C_{GBL}$ of each GBL_1[1] with Vss, then the final voltages would be Vss and 0.9V stored in both GBL_1[1] and GBL_1[2] with the gate signal DIV_EN[1]=Vread=6V.

The final charge-shared voltages of either Vss or 0.9V for the second N-bit $C_{GBL}$ capacitors would be coupled to N-bit Multiplier and N-bit SA in the N-bit PB on top for data evaluation. The sensed voltage of 0.9V from Group 2 is the second largest signal of a second sub-step of the Multiple-WL and All-BL Read and Program-Verify operations.

Since the VREF in SA is dynamically set to be ½ of sensing voltage. In Group 2 the sensing voltage is 0.9V. Thus, the VREF=0.45V. This ΔV=0.45V is big enough without a need of amplification by the Multiplier. Thus, the multiplier function can be temporarily disabled to allow the direct coupling of 0.9V and Vss from each GBL to one input of each corresponding SA to skip the Multiplier function in between. This whole operation can be controlled by the on-chip State-machine once it detects the data either from Group 1 or Group 2.

Once Group 2 WL data are successfully evaluated by the PB and data is sent out to NAND memory system, all capacitors of GBL_1[1] to GBL_1[N] and GBL_2[1] to GBL_2 [N] have to be reset to Vss for the third WL data evaluation read out from Group 3, subsequently in a third sub-step. Similarly, the Read and Program-Verify or evaluation of the third WL or page in Group 3 repeat the processes as explained above.

The voltages of Vss and 1.8V of third N-bit $C_{GBL}$ capacitors from GBL_3[1] to GBL_3[N] would be shared by both GBL_1[1] to GBL_1[N] and GBL_2[1] to GBL_2[N] capacitors with initial Vss voltage. Thus the voltages would become ⅓ due to charge-sharing in 3 identical broken $C_{GBL}$ by setting divided transistor gate signal DIV_EN[3] to DIV_EN[15]=Vss. Similarly, both SEG_1[1] and SEG_1 [2] signals are set to Vss to have the selected Blocks of Group 1 and Group 2 being isolated from Group 3 during the third WL data evaluation. The final WL sensed voltages of Group 3 are either 1.8V/3=0.6V (high) or Vss (low). Since 0.6V is still a large reliable signal for SA, thus the Multiplier function can be skipped again during Group 3 WL-page evaluation.

The above sub-steps of multiple-WL and All-GBL Read and Program-Verify operations will be repeated and finalized when the last NAND page-data in Group16 is completed. Since the sensed voltage of GBL_J will be getting smaller and smaller when more $C_{GBL}$ capacitors to share the 1.8V and 0V, using a Multiplier to increase the weak signal of GBL_J is required. In this 16-group HiNAND2 array, each Multiplier is enabled to function between each corresponding SA and $C_{GBL}$ after Group 4. The Multiplier is configured to amplify GBL signal $V_{GBL}$ at least 3 times to be sensed reliably by a DRAM-like latch-type SA (see reference patent application Ser. No. 14/283,209, commonly assigned).

All Multiplier operation and chare-sharing operation can be completed within 200 ns. Thus, the true bottleneck of Multiple-WL and All-GBL Read operation speed is the time delays during precharge and discharge of broken GBL capacitor. As shown above, these two time delays are dramatically reduced when the simultaneous Multiple-WL and All-GBL and chare-sharing Read scheme under the HiNAND2 array with preferred 2-level broken-BL hierarchical structure.

Step 5: To perform a voltage amplification of sensed $V_{GBL}$ by using one preferred Multiplier that is associated with one SA within the N-bit PB on top.

In an specific embodiment, in the HiNAND2 architecture, a Multiplier is configured to bear an amplification factor that is at least greater than 2 but preferred to be no greater than 5, as a tradeoff as an optimal multiplier with desirable operating time and reliable SA operation. Each Multiplier is preferred to include 3 or more capacitors being configured either in series or in parallel with multiple timing control clocks to allow the capacitors to multiply the finally sensed voltages coupled to each GBL capacitor on top of HiNAND2 array. For example, for the voltages sensed from Group 10 is 1.8V/ 10=0.18V. This signal is too weak to be reliably evaluated by each corresponding Latch-type SA. Thus, the Multiplier function is preferably enabled to have an amplification factor of 3 to increase 0.18V by 3 times to 0.54V for the subsequent reliable evaluation of the SA.

The required amplification of the SA has to take consideration of the mismatched characteristics of paired inputs of MOS transistors of each SA. The details can refer to the explanation of a Multiplier circuit of FIG. 2A in later sections of the specification.

Step 6: To perform the data evaluation at Multiplier's output port by using a DRAM-like, Latch-type SA.

Again, this Latch-type SA has two inputs connected to one sensed voltage coupled from each GBL capacitor and one input coupled to a VREF with a preferred programmable values. Similarly, this SA has one clocked PMOS device coupled to Vdd and one clocked NMOS device coupled to Vss for 2-stage amplification and is commonly used in DRAM SA operation. Thus the details of this operation will be skipped here and can refer to the U.S. patent application Ser. No.

14/283,209, filed May 20, 2014, commonly assigned and incorporated by references herein for all purposes.

Step 7: To load each sensed N-bit WL data into on-chip N-bit Cache memory. This operation is essentially a final step of each Multiple-WL and All-GBL Read (or Program-Verify) operation.

Step 8: To read page (WL) data through this Cache, which can be sent to off-chip Flash controller sequentially. Once the first WL page-data is sent out to Cache memory, the second WL from Group 2 to last 16th WL from Group 16 would be sent sequentially in the form of fast pipeline format. In particular, the above operations associated with step 2) through step 6) are repeated. In the NAND spec today, the fastest read data rate is 2.5 ns 8×I/O in DDR2 operation. The time for sending out a small page is 512B. It takes about 1.28 µs (2.5 ns/B×512B/page=1.28 µs/page). For a large 8 KB page data per one physical WL, it will take 20.48 µs (1.28 µs×16=20.48 µs).

But the averaged NAND spec of a SLC page (WL) Read is 25 µs, 75 µs for a 4-state MLC Read, 175 µs for an 8-state TLC Read, and is about 375 µs for a 16-state XLC Read. Thus, for the Multiple-WL and All-GBL Read operation, the dramatic reduction in Read latency can flexibly provide a most powerful simultaneous Read and Program operation in ALL NAND Groups. It just needs a well planning of operating HiNAND2 array controlled by the on-chip smart State-machine or CPU.

Figure 3:
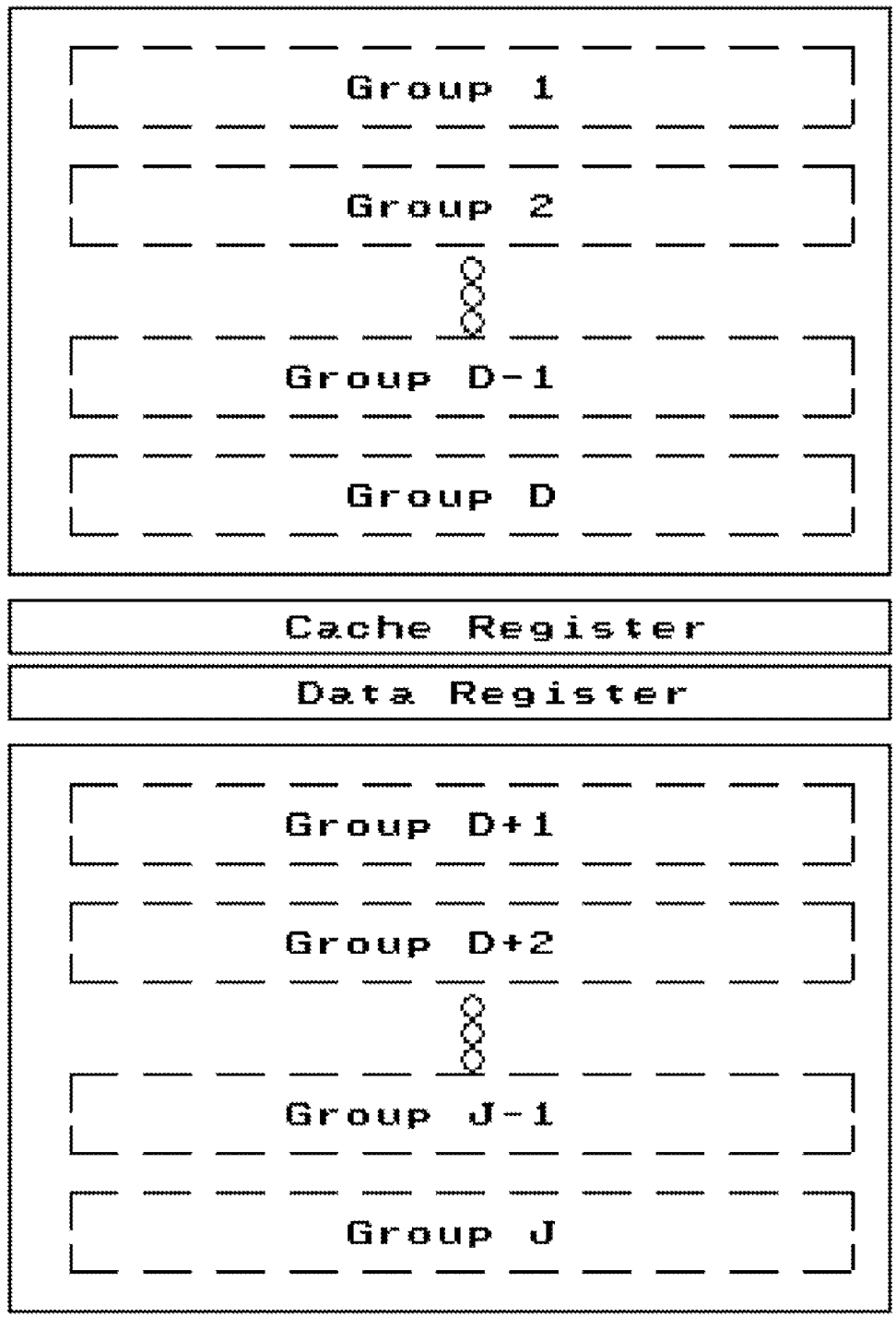
FIG. 3 is a block diagram of a Page Buffer circuit for both the HiNAND2 and HiNAND1 arrays according to embodiments of the present invention.

FIG. 3 is a block diagram of a Page Buffer circuit for both the HiNAND2 and HiNAND1 arrays according to embodiments of the present invention. This diagram is merely an example, which should not unduly limit the scope of the claims herein. One of ordinary skill in the art would recognize many other variations, modifications, and alternatives. As shown, a preferred embodiment of a N-bit Static PB is configured to be inserted in a middle position between a first set of Groups (1 to D) and a second set of Groups (D+1 to J). This middle Static PB can be applied to both HiNAND2 and HiNAND1 arrays with two sets of N-bit outputs from Static Data Registers to respectively connect the first set and second set of N-bit HiNAND Groups. In a specific embodiment, the HiNAND array, either HiNAND2 or HiNAND1, is divided into two equal N-bit sub-arrays that are mirrored in Y-direction but with half-density separated by the middle Static N-bit PB. The middle Static PB includes one static N-bit Cache Register and one static N-bit Data Register. The definition of Static PB means that the data bits are made of real latch circuits that can hold data forever as long as no power loss. Conversely, the Dynamic Data or Cache Registers are made of either broken GBL lines or broken LBL lines to hold the Program-bit pattern of Program-Inhibit voltage patterns in the HiNAND array of the present invention.

As illustrated in previous sections, from one middle PB prospect, the farthest Group is Group J in the lower HiNAND sub-array (with the second set of Groups) and Group 1 in the upper HiNAND sub-arrays (with the first set of Groups). If these two farthest Groups, Group 1 and Group J, are made with the same equal length of the broken GBL line and Segment LBL line as Group D−1, Group D, Group D+1, and Group D+2 that near the middle Static PB, then they suffer the highest loss of charge-sharing signal voltage level when sensed by the middle Static PB. Therefore, the minimum capacitance of each broken GBL or LBL is determined by the worst-case charge-sharing effect in the farthest Groups such as Group J and Group 1 if all GBL and LBL metal lines are made with an equal length or capacitance.

Each bit of N-bit PB has two set of N-bit outputs. The first set N-bit outputs are connected to the upper HiNAND sub-array from Group D up to Group 1 which is the farthest Group and the second output is connected to the lower HiNAND sub-array from Group D+1 to Group which is another farthest Group. This HiNAND array with a middle Static PB scheme has an advantage of owning two Groups with faster operation speed and lower operation power, such as Group D and Group D+1, and one N-bit PB for both upper and lower HiNAND sub-arrays. Thus, the silicon area is reduced and the preferred DRAM-like Charge-sharing sensing scheme and Recall to restore the programmed WL patterns can be executed more efficiently than 1-sided Static PB. The disadvantage is the metal2 broken GBL has to pass across the middle PB to reach the first set of Group D to Group 1 and the second set of Group D+1 to Group J in this HiNAND2 array.

FIG. 4A is a simplified circuit diagram of a HiNAND2 array of FIG. 2B performing Sample & Hold (S/H) functions of a Multiple-WL TLC Program operation according to a specific embodiment of the present invention. As an example, the HiNAND array has been divided into 8 Groups. Each Group large metal2 GBL capacitor (or GBL line) is divided into 8 Clusters of 4-Segment metal1 capacitors through 8 divided GBL transistor of MLBLp. Each broken Group metal2 line has eight 4-Segment metal1 capacitors connected in parallel. Each 4-Segment Cluster includes one Segment being assigned to be one Dynamic Page Buffer (PB) and three Segments being assigned to be Dynamic Cache Registers. The assignments are preferably rotated among these 4 Segments. FIG. 4A shows that the first Segment of Cluster 1 in the dispersed eight Groups is assigned to be one Dynamic PB but the next three Segments are assigned to be three corresponding Dynamic Cache Registers for storing one corresponding 3-bit TLC data. The S/H functions can be also applied to HiNAND1 as well with minor modifications but the description is skipped here.

In this example, N GBL columns are being divided into 8 broken Groups of 8 equally-segmented N-bit large metal2 capacitors, $C_{GBL}$, such as GBL_1[1] to GBL_1[N] in Group 1 and GBL_8[1] to GBL_8[N] in Group 8 through 7 N-bit divided GBL transistors, MGBL, with 7 gates tied to 7 respective signals of DIV_EN[1] to DIV_EN[7].

In other words, each Group's GBL metal2 line forms a metal2 capacitor, $C_{GBL}$, and is connected to 32 Segments with 32 lower-level metal1 capacitors $C_{SEG}$. Each Segment is termed as one Dynamic Register comprising one metal1 capacitor $C_{SEG}$ in series with one Segment divided transistor MLBLp with its gate tied to a SEG signal in accordance with FIG. 2B. Totally, there are 32 MLBLp transistors with their gates tied to 32 respective SEG_1 to SEG_32 per $C_{GBL}$ per Group.

Each Group $C_{GBL}$ is connected 32 Segments, thus 32 Dynamic Registers. The capacitance of each $C_{GBL}$ is 32 times of each $C_{SEG}$ in 2D HINAND array in this example. In other words, $C_{GBL}=32\times C_{SEG}$.

Referring to FIG. 4A, in each Group, 4 out of 32 adjacent Dynamic Registers are formed as one TLC storage center with a preferred job Rotation Assignment as each 3-bit TLC data program operation is performed. In one TLC storage center, one of four metal1 $C_{SEG}$ capacitors with a Cluster is circled and assigned to be a Dynamic PB for temporarily storing 1-bit of "0" of Program code or "1" of Program-Inhibit code. Three out of four $C_{SEG}$ capacitors belonging to the same Cluster marked with dash-box are termed as 3-bit Dynamic Cache Registers for storing one 3-bit TLC programmed data in one physical NAND cell in one selected WL. The "0" of the programmed code is converted into 0V but "1" of the program-inhibit code is converted into a $V_{inhibit}$ voltage level as the storage charges stored in each $C_{SEG}$ capacitor. In the HiNAND2 array of the present invention, the preferred $V_{inhibit}$ voltage is defined as $Vdd \leq V_{inhibit} < 10V$, and typically $V_{inhibit} = 7V$. Similarly, 3-bit of each TLC data, data "0" is also being converted into 0V and data "1" is converted into the $V_{inhibit}$ voltage level as the storage charges stored in 3 respective $C_{SEG}$ capacitors of 3 Dynamic Cache Registers marked with same dash-box.

The detailed biased voltages of all key control signals for 2D HiNAND array are set in accordance with the fourth step of multiple-WL and All-GBL simultaneous Program and Recall operations shown in FIG. 10, FIG. 11, FIG. 12, and FIG. 13 of this specification. Table 3 below summarizes TLC Rotation assignment of four $C_{SEG}$ capacitors. The first TLC Rotation assignment is shown in FIG. 4A.

TABLE 3

| | TLC Rotation assignment of 4 $C_{SEG}$ capacitors | | | |
|---|---|---|---|---|
| | first $C_{SEG}$ capacitor | second $C_{SEG}$ capacitor | third $C_{SEG}$ capacitor | fourth $C_{SEG}$ capacitor |
| $1^{st}$ assignment | Dynamic PB | Dynamic Cache | Dynamic Cache | Dynamic Cache |
| $2^{nd}$ assignment | Dynamic Cache | Dynamic PB | Dynamic Cache | Dynamic Cache |
| $3^{rd}$ assignment | Dynamic Cache | Dynamic Cache | Dynamic PB | Dynamic Cache |
| $4^{th}$ assignment | Dynamic Cache | Dynamic Cache | Dynamic Cache | Dynamic PB |

For a MLC Recall and Program operation, then only three $C_{SEG}$ capacitors are required for three Rotation assignments as summarized below in Table 4.

TABLE 4

| | MLC Rotation assignment of 3 $C_{SEG}$ capacitors | | |
|---|---|---|---|
| | first $C_{SEG}$ capacitor | second $C_{SEG}$ capacitor | third $C_{SEG}$ capacitor |
| $1^{st}$ assignment | Dynamic PB | Dynamic Cache | Dynamic Cache |
| $2^{nd}$ assignment | Dynamic Cache | Dynamic PB | Dynamic Cache |
| $3^{rd}$ assignment | Dynamic Cache | Dynamic Cache | Dynamic PB |

For a SLC Recall and Program operation, then only two $C_{SEG}$ capacitors are required for two Rotation assignments as summarized in Table 5 below.

TABLE 5

| | SLC Rotation assignment of 2 $C_{SEG}$ capacitors | |
|---|---|---|
| | first $C_{SEG}$ capacitor | second $C_{SEG}$ capacitor |
| $1^{st}$ assignment | Dynamic PB | Dynamic Cache |
| $2^{nd}$ assignment | Dynamic Cache | Dynamic PB |

Referring again to FIG. 4A, all Dynamic Cache Registers are rotationally assigned in only 3 $C_{SEG}$ capacitors of Group 1 for superior restoring each TLC programmed data back to the 3-bit Static PB registers on top of HiNAND array. But all Dynamic PB Registers are also rotationally assigned to all selected WLs in all selected Groups. Note, each Segment Dynamic Data Register or Dynamic Cache are preferably made of metal1 LBL lines with $C_{SEG}$ capacitors corresponding to respective Segments with one dedicated precharge transistor and precharge power line as seen from on enlarged figure with gate tied to SEG_32[2]. The precharged transistor is MBLs with gate tied to PRE and supply line is LBLps. Since the details have been explained in previous pages of this application, thus it is skipped here for simplicity of description.

FIG. 4B is a simplified circuit diagram of a HiNAND2 array of FIG. 2B performing Sample & Hold functions of a Multiple-WL TLC Program operation according to another specific embodiment of the present invention. As shown, the assignment of 4-Segment metal1 capacitors are rotated with the last Segment of Cluster 8 in the dispersed eight Groups being assigned to one Dynamic PB and the first three Segments of Cluster 8 being assigned to be three corresponding Dynamic Cache Registers for storing another one corresponding 3-TLC data. Note, all Dynamic Cache Registers are also rotationally assigned in only 3 $C_{SEG}$ capacitors in Group 1 similar as FIG. 4A.

In summary, both FIG. 4A and FIG. 4B show a first preferred option of Multiple-WL and All-GBL simultaneous Program operation being performed in only one selected Group, Group 1, not dispersed in eight Groups, Group 1 through Group 8. Similarly, all 8 WLs can be selected in any only one Group among Group 1 through Group 8. This can be referred as Consolidated Multiple-WL and All-BL simultaneous Program operation because the selected Multiple WLs are only from one selected Group.

FIG. 4C is a simplified circuit diagram of a HiNAND2 array of FIG. 2B performing Sample & Hold functions of a Multiple-WL TLC Program operation according to another specific embodiment of the present invention. As shown, the assignment of 4-Segment metal1 capacitors are rotated with the first Segment of all eight Clusters in Group 1 being assigned to one Dynamic PB and the next three Segments in each Cluster being assigned to be three corresponding Dynamic Cache Registers for storing another one corresponding 3-TLC data.

FIG. 4D is a simplified circuit diagram of a HiNAND2 array of FIG. 2B performing Sample & Hold functions of a Multiple-WL TLC Program operation according to another specific embodiment of the present invention. As shown, the assignment of 4-Segment metal1 capacitors are rotated with the first Segment of all eight Clusters in Group 8 being assigned to one Dynamic PB and the next three Segments in each Cluster being assigned to be three corresponding Dynamic Cache Registers for storing another one corresponding 3-TLC data.

FIG. 4C is and FIG. 4D show a second preferred option of Multiple-WL and All-GBL Simultaneous Program being performed in all 8 dispersed groups, Group 1 through Group 8. In other words, 8 program WLs are selected from Group 1 through Group 8 one WL per one Group, respectively and simultaneously. This can be referred as Dispersed Multiple-WL and All-BL Simultaneous Program operation because the selected Multiple WLs are dispersed in multiple selected Groups.

Note, when Group number is larger than the totally allowed selected multiple WLs, then only Multiple-WL out of all total Groups are selected for Multiple-WL and All-BL Program per each program pulse. The Multiple-WL Program will be continued and it will end until all desired WLs in HiNAND groups being programmed. The detailed description of FIG. 4C and FIG. 4D are skipped because their operations are substantially the same as FIG. 4A and FIG. 4B.

In summary, FIG. 4A and FIG. 4B show the first preferred Consolidated Multiple-WL and All-GBL simultaneous Program with different Rotation assignments, while FIG. 4C and FIG. 4D show the second preferred Dispersed Multiple-WL and All-GBL simultaneous Program. Alternatively, a mixed Consolidated and Dispersed of Multiple-WL and All-GBL simultaneous Program operations can be also implemented in the HiNAND array design but preferably keeping all Dynamic PBs in Group D and Group D+1 when a middle PB architecture is used as shown in FIG. 3.

FIG. 5A is a circuit diagram of 1-bit static PB circuit that comprises one Multiplier circuit, one 1-bit Sense Amplifier circuit and one 1-bit SLC Data Register, along with one Y-pass circuit, One Cache Register, one I/O Control and multiple I/O [1:X] pins for Multiple-WL and All-GBL Simultaneous SLC operations for both HiNAND1 and HiNAND2 arrays according to an embodiment of the present invention. As shown, the 1-bit SLC-static PB 500 includes one Multiplier 502, one 1-bit SA 504, and one 1-bit SLC Data-Register/ PGM-Buffer 506 along with one Y-pass circuit 510, One Cache Register 512, one I/O Control 514, and multiple I/O [1:X] pins 522 for J-WL and All-GBL Simultaneous SLC operations for both HiNAND1 and HiNAND2 arrays. Note, in this SLC circuit, Data-Register and PGM-Buffer are combined into one PB 500. The Data-Registers used to store the stored voltages of each smaller $C_{SEG}$ or each bigger $C_{GBL}$ capacitors. In contrast, each bit of PGM-Buffer is used to store 1-bit Program and Program-Inhibit data pattern in DL from eternal I/O or from the stored $C_{SEG}$ and $C_{GBL}$ capacitors.

Furthermore, each SLC Data Register 506 includes one 1-bit Program Buffer and each SA 504 includes one DRAM-like SA with two inputs. One input is connected to Multiplier's amplified output signal OUTP and another input is connected to reference signal VREF.

The DRAM-like sense amplifier operations are like analog-to-digital convention with 2-cycle amplification steps such as Vdd clock and Vss clock. In particularly, the 1-bit Static PB 500 includes one Multiplier 502 associated with each GBL line for Multiple-WL and All-BL Read, Program-Verify, and Erase-Verify operations. The Multiplier 502 is used to amplify each detected GBL voltage $V_{GBL}$ if it is smaller than 0.4V as developed at each of top GBL nodes of N GBL lines GBL_1[1] through GBL_1[N]. The amplified voltage signals then are respectively passed to N corresponding BLP nodes. The decision with or without including the Multiplier 502 between Latch-type SA 504 and GBL sensing node of the present HiNAND2 array is determined by the location of selected Group and signal voltage levels of the detected at GBL node.

As explained earlier in this description, the sensed voltage level from GBL_1[1] in top Group 1 and GBL_J[1] of bottom Group J after DRAM-like Charge-sharing effect will have different voltage dilutions if each GBL capacitance is equally divided in length. In the case of the equally-divided GBL capacitor, the Charge-sharing design is based on the farthest Group J which has the lowest Charge-sharing sensed voltage level due to all J GBL capacitances are counted into the dilution and will be used as the base line for implementing Multiplier worst-case amplification below.

The best-case Charge-sharing of GBL is Group 1 that has only one $C_{GBL}$ capacitor, thus achieving the highest sensed GBL voltage $V_{GBL}$ level without any dilution with the rest of J−1 GBL capacitors in J−1 Groups in each GBL column. As a result, Group 1 or even Group 2 in HiNAND array can be designed to send the highly sensed GBL voltage directly to the corresponding SA 504 bypassing the Multiplier 502.

The input or the detecting node of Multiplier 502 is BLP node. One major advantage of this HiNAND2 design over conventional NAND design is the voltage control of BIAS signal, which is coupled to gate of a 20V HV long-channel NMOS transistor MN6, shown in FIG. 5A. In prior-art NAND design, the BIAS signals have to be well controlled to be 2.3V to provide a stable 0.7V-1.0V GBL precharge-voltage due to its high Vt value. It also needs to provide another lower gate voltage for helping the discharge of GBL line and then provide another higher voltage to fully pass the Vdd to GBL line as Program-Inhibit voltage.

Since there is no need of GBL precharge in this HiNAND2 Read operation, a fine-tune 2.3V supply is not needed. Additionally, the discharge of each LBL line and its associated broken GBL line is nothing to do with BIAS. The BIAS signal is just Vdd, thus another HV voltage supply is not needed either. The only needed voltage is Vread=6V to allow the full Vdd=1.8V passage from GBL from upper Groups with higher diluted, sensed $V_{GBL}$ voltages.

In one embodiment of this HiNAND design, the preferred high $V_{GBL}$ voltage is between 1.8V and Vss from Group 1, between 0.9V and Vss from Group 2, between 0.6V and Vss from Group 3, between 0.45V and Vss from Group 4, and between another gradually decreased value of 0.1125V (1.8V/16=0.1125V when reading from Group 16 if 16 dispersed WLs in 16 dispersed Groups are selected) and Vss from Group 16. In worst case Read from Group J, the Multiplier 502 is required to amplify $V_{GBL}$ to more than 0.4V at OUTP node for a reliable sensing via Latch-type DRAM-like SA 504.

In another embodiment, the precharged $C_{SEG}$ voltage is $V_{inhibit}$ which is set o be much higher than 1.8V. For example, if $V_{inhibit}$=Vdd, then $V_{GBL}$ voltage is 0.1125V (1.8V/16=0.1125V) when reading from the Group 16 in worst case. If $V_{inhibit}$=7V, a bigger $V_{GBL}$ voltage of −0.4375V is sensed at BLP node. Thus, Multiplier is not needed at all.

Now, the Multiplier operation will be explained below in accordance with the circuit shown in FIG. 5A. As shown, the input and output nodes of the Multiplier circuit 502 are denoted as BLP and OUTP respectively. As mentioned above, the need of a Multiplier circuit for the HiNAND is an option, all depending how many WLs can be selected for Read, Program-Verify and Erase-Verify operations. As a design thumb of rule, more WLs for simultaneous operations, then more the dilution of sensed $V_{GBL}$ voltage so that Multiplier is more likely needed.

The amplified voltage at OUTP node is the outcome of the Multiplier 502 after N-cycle amplification operations on input voltage detected at BLP node. The amplification factor by the Multiplier is N, where N≥2 or any larger integer number, depending on the required minimum $\Delta V_{GBL}$ value and speed and area trade off for the reliable sensing of the DRAM-like SA 504 connected to the OUTP node.

Referring to FIG. 5A, Multiplier 502 with a larger N for a larger $V_{GBL}$ that will result in a larger silicon area and more sensing cycles of sample and hold on capacitors such as C[0]-C[N] are required. Practically, too many cycles of sample and hold operations on Multiplier's capacitor, C[N], to accomplish the final desired $V_{GBL}$ is not preferable for this fast multiple-WL Read and Verify operations.

Every capacitor of C[0] through C[N−1] is connected to two NMOS LV pass transistors. All capacitors of C[0] through C[N−1] are connected in series from the top node of OUTP to the bottom node connected to IN[N]. The value of each capacitor of C[0] through C[N−1] can be made the same or different values. The type of capacitor is preferably made of poly1-poly2 and specially made metal capacitors without a Vt drop for a full coupling effect for this Multiplier's operation.

For example, the top (poly2) plate of the capacitor, C[1], is connected to two LV NMOS transistors. One transistor is MN[1] with its left input node connected to a common input node BLP, its gate is tied to T[1], and its right output node connected to IN[1]. The other LV NMOS transistor, TP[1], with its drain node connected to IN[1], its source node connected to Vss, and its gate tied to TP[l]. The bottom (poly1) plate of C[l] is connected to the top (poly2) plate of C[2] not explicitly shown in FIG. 5A. The top common sensing line of BLP is connected to a pull-up 20V NMOS device of MN6 with its gate tied to BIAS signal and its drain node is connected to each corresponding GBL, which is equivalent to be GBL_1[1:N] in HiNAND array.

Similarly, the top (poly2) plate of the last capacitor, C[N−1], is connected to another two similar LV NMOS transistors. One transistor is MN[N−1] with its left input node connected to a common input node BLP, its gate tied to T[N−1] and its right output node connected to IN[N−1]. The other LV NMOS transistor, TP[N−1] with its drain node connected to IN[N−1], its source node connected to Vss, and its gate tied to TP[N−1].

Similarly, the top plate of the first capacitor, C[0], is connected to another LV NMOS transistor MN[0] with its left input node connected to a common input node of BLP, its gate tied to T[0] and its right output node connected to OUTP of the Multiplier. The bottom plate of C[0] is connected to IN[1]. The Multiplier operation for amplifying input at BLP to OUTP is divided into 4 steps. Step 1: Setting BIAS=Vdd+Vt+$V_{margin}$(0.5V) to allow the full passage of sensed voltage at GBL node with PGM=Vss to shut off the program path. Step 2: First sampling the $V_{GBL}$ voltage at BLP node and store it at C[0] capacitor by setting the following conditions, T[0]≥Vdd+Vt, T[1]= . . . =T[N]=0V, TP[1]=Vdd, and T3=0V. Step 3: Repeat second sampling till N samplings of $V_{GBL}$ voltage at BLP node and store them to the respective capacitors of C[1] to C[N−1] one by one serially by setting the following conditions to boost the sensed voltage at OUTP node: T[0]=0V, T[1]≥Vdd+Vt, TP[1]=0V, TP[2]=Vdd, TP[2]=0V, and T3=0V. Step 4: One-shot T3 clock to latch the final sensed GBL voltage at Q[i] node of SA 504 and one VREF voltage at the opposite node of QB[i] of SA 504 for NAND cell data evaluation. It needs T5 clock to further amplify the ΔV between Q[i] and QB[i] nodes.

The fully developed digital signal will be coupled to the gates of two NMOS MN10 and MN11 transistors of the corresponding Program-Buffer 506. And later the sensed data will be transferred to each corresponding Latch (INV0 and INV1) of each Program Buffer 506.

For 1-bit Static PB shown in FIG. 5A, it contains one 1-bit Multiplier 502, one 1-bit SA 504, one 1-bit Data Register 506 that further comprises one 1-bit static Program Buffer 550 and one 1-bit static Data Buffer 540. The 1-bit Static PB can only store 1-bit of sensed data at a time from HiNAND array or 1-bit desired programmed from I/O Control circuit 514.

The detailed operations of Data Buffer 550 and Data Buffer 240 in FIG. 5A are illustrated below in accordance with the preferred Multiple-WL and All-GBL SLC operations.

SLC Data Buffer (DB) 550 includes one Data Latch (DL) made of INV0 and INV1 with one pair of D1 and D1B nodes. Referring to FIG. 5A again, to set and reset this DL, following bias conditions can be applied to: a) VFY with one-shot pulse when Q[i]=Vdd to set D1=Vdd, where Q[i] is one of the input node of SA 504; b) RW_RES with one-shot pulse to set D1=Vdd; c) RWT_BK with one-shot pulse to set D1=Vss; d) LATP with one-shot pulse when Q[i]=Vdd to set D1=Vdd, where Q[i] is one of the input node of SA; e) one-shot data loading when conditions of LOAD=Vdd or Vread and Q[i]=LATP=RECALL=RW_RES=Vss.

The 1-bit data is sequentially loaded in corresponding one bit of DL in SLC Data Register 506 from I/O Control circuit 514 through Y-pass circuit 510. Additionally, prior to data-in loading, one-shot of RW_RES to set all D1=Vdd is required.

The final data in DL is subject to each loading data bit from I/O. The D1 is kept to initial Vdd if the corresponding loaded data bit is "1" and D1 is set to Vss if the loaded data bit is "0."

SLC data loading cycle of Multiple-WL Program operation is further illustrated below by referring to FIG. 5A. During the data-in loading, the required voltage polarity at GBL node is identical to D1 node. If the data-in D1=1, that means the cell should be performed Program-Inhibit scheme to keep at E-state, thus $V_{GBL}$=Vdd or Vdd-Vt. But when data-in D1=0, that means the NAND cell should be programmed toward an A-state. As a result, the corresponding $V_{GBL}$=0V.

The 1-bit of the Program and Program-Inhibit data pattern per one WL is sequentially supplied to each DL with PGM=Vss. The data loading is performed sequentially in unit of Byte of 8 I/Os or words if 16 I/Os per system clock along with the increment of Y-pass counter to select the right 8 GBLs per one system clock. For one largest physical WL size of 128 KB of NAND today with 8 I/Os, it will take total 128K system clocks just to complete one whole SLC data for one single whole physical WL.

Unlike conventional 1-WL Program, this preferred Multiple-WL Program needs to quickly transfer one whole WL N-bit data to on-chip N-bit $C_{SEG}$ capacitors once one whole WL data loading is completed. This N-bit DL loading to N-bit corresponding $C_{SEG}$ capacitors or Dynamic Cache Registers at the designated areas in Group 1 can be done by one-shot pulse PGM clock (PGM≥Vdd) applied on the gates of N MN20 transistors with enough time elapse associated with the right address logic to select the corresponding Dynamic Cache Registers. In this case, $V_{BIAS}$≥Vdd.

The program-data loading is to connect D1P to GBL through BLP. An INV2 is needed to prevent each DL's data D1 from being corrupted when a highly low capacitive node of D1 is connected to a highly capacitive node of corresponding GBL and BLP.

For a case of 16-WL and All-BL simultaneous Program operation with a largest 128 KB per WL size, then totally 16×128K=2,048K system clocks are required to complete 16 WLs data transferring from I/Os to the detonated $C_{SEG}$ capacitors in preferred Group 1 in accordance with FIGS. 4A-4D. For example, DDR2-NAND with 5 ns clock cycle has two loadings, then total 2,048K clock cycles will take 5,120 ms roughly.

Therefore, Multiple-WL Program data loading is serially performed from I/Os to the selected N-bit $C_{SEG}$ capacitors through N-bit SLC Data Register and right address selection of the corresponding multiple N-bit $C_{SEG}$ Dynamic Cache Registers.

Multiple-WL SLC Program-Verify operation can be also illustrated by referring to FIG. 5A. The is an iterative data-out operation from one selected WL at a time but the data and voltage polarity is opposite between D1 node and GBL node. For example, if GBL node is at 0V, that means the verified cell passing the Program-Verify, thus it should be prevented from the subsequent program pulses. Thus D1 is set to Vdd, thus D1P=Vdd, and BLP=GBL≥Vdd-Vt to inhibit program. Conversely, if the verified $V_{GBL}$=Vdd, thus the cells' Vt not passing the verified Vt with R1=0V for a SLC verification. Thus the D1B is set to Vdd but D1P=Vss, thus GBL is reset to Vss. The cells will get programmed.

This Program-Verify operation needs one full-cycle like Read operation to precharge all selected $C_{SEG}$ or $C_{GBL}$ capacitors with a $V_{inhibit}$ voltage level initially and then discharged to Vss level or retaining the precharged $V_{inhibit}$ level. The final settled voltage patterns on $C_{SEG}$ or $C_{GBL}$ capacitors will be sensed and amplified by Multiplier 502 and SA 504. The details should be same as previous HiNAND Read operation. During this multiple-WL Program-Verify cycle, the following bias conditions with LATP=RECALL=RW_RES=PGM=RW_RES=Vss are set to prevent the leakages from happening on two nodes D1 and D1B of each DL.

Similarly during the Recall cycle, all N DIs are reset to D1=0V prior to Recall operation. Referring to FIG. 5A again, the Recall is performed to sense the stored voltages at CsEG capacitors in Group 1. Thus, this operation is not intended to read any NAND cells in any WLs. This operation is to sense the stored voltage in smaller N $C_{SEG}$ capacitors or larger N $C_{GBL}$ capacitors in the corresponding Dynamic Cache Registers per row and then restore into the Static Data Buffers in PB. As a result, the restored voltage back to D1 should be same phase as the voltage at GBL. In other words, if $V_{GBL}$=0V, then D1=0V, then D1=0V to remain its initial state. If $V_{GBL}$=high and is amplified to a full Vdd at Q[1] node of SA 504, then D1 is reset to Vdd by applying one-shot of VFY signal to the gate of transistor MN17 to set D1B to Vss. Thus the stored program data patterns are successfully restored back into N Data Registers 506.

FIG. 5B is a circuit diagram of multi-bit static PB circuit for HiNAND array that allows to store e-bit NAND multiple-state page data for Multiple-WL and All-BL Simultaneous (MLC, TLC, XLC, . . . ) operations according to an embodiment of the present invention. As shown, the multiple-bit static PB 600 includes one Multiplier 602, one multi-bit SA 604, and one Data-Register 606 along with one Y-pass circuit 610, One Cache Register 612, one I/O Control 614, and multiple I/O [1:X] pins 622 for J-WL and All-GBL Simultaneous SLC operations for both HiNAND1 and HiNAND2 arrays. The Data-Register 606 includes one e-bit Matching logic circuit 630, one independent eData-Register, 340, and one shared Program-Buffer 650. For a MLC Program, e=2, for a TLC Program, e=3 and for a XLC Program, then e=4. The e-bit Matching circuit, 630, is added to the multiple-bit static PB 600 for this Multiple-WL and All-BL simultaneous Program operation. Additionally, an on-chip Code-generator circuit 608 is added to the multiple-bit static PB 600. It generates e outputs of CODE1 to CODEe. For example, e=4 for 4 MLC codes from 00 to 11, e=8 for 8 TLC codes from 000 to 111, and e=16 for 16 XLC codes from 0000 to 1111. The codes can be easily generated from an on-chip State-machine.

Basically, the detailed operations of Multiplier circuit 602 and SA circuit 604 in FIG. 5B are identical to the counterparts of Multiplier 502 and SA 504 in FIG. 5A, thus the descriptions are skipped here for simplicity. The control of LATP signal in FIG. 5A has been replaced by a reversed signal LAT to set the opposite leg of one latch made of INV2 and INV3 in Data-Buffer 640 in FIG. 5B as oppose to latch made of INV0 and INV1 in FIG. 5A.

Referring to FIG. 5B, similarly, the major function of Program-Buffer is to generate and store the Program and Program-Inhibit MLC/TLC/XLC data patterns. When the read NAND MLC/TLC/XLC data matches the stored MCL/TLC/XLC data, then MTACH node is Vdd to turn on MN23 with a condition of setting I[i] and VFY to Vdd so that QOB node is at Vss and BLP at Vdd to send the Vdd-Vt MLC program-inhibit voltage to the corresponding GBL lines to prevent MLC over-program.

Prior to Multiple-WL simultaneous Program, one-shot of RW_RES is applied to the gate of MN13 to set D1B node to Vss but D1 node to Vdd to allow an easier loading into DA made of INV2 and INV3 in Data-Buffer 340 of each data-in bit from 320 bus from I/O Control 614.

Basically, Multiple-WL and All-BL Read and Program-Verify operations of the present invention is more powerful and more flexible to allow both Read and Program-Verify performed simultaneously on more than one selected WLs from more than one selected Segments from more than one Groups of the HiNAND. But there is only one N-bit PB connected to N×$C_{GBL}$. The single PB and N $C_{GBL}$ capacitors are designed to be shared by all selected WLs in the HiNAND array. This HiNAND2 with one N-bit PB is referred as HiNAND2-1PB-N scheme.

In an embodiment, the above Multiple-WL & All-GBL Read and Program-Verify operations are based on a evenly divided HiNAND2 array with 16 or less NAND Groups. In addition, the layout of a N-bit PB is being placed on top of HiNAND2 array with Group 1 at top and Group 16 at the bottom and Group 2 to Group 15 placed in between in the gradually increasing order from top to the bottom. All N broken metal2 GBLs in 16 Groups are laid out in such a way with N outputs connected to the top N-bit PB. Group 1 is the HiNAND group that is closest to the PB. When reading any single WL from Group 1 to the PB, it experiences the fastest and smaller RC delay of one $C_{GBL}$ with zero $M_{GBL}$ resistor. Conversely, when reading any page or WL from the bottom Group16, it suffers longest RC delay of 16 $C_{GBL}$ capacitors and 15 $M_{GBL}$ resistors. As a result for this preferred Multiple-WL and All-GBL scheme, the total broken GBL RC delays from the fastest Group 1 to the slowest Group 16 varies widely due to the widely uneven RC charge-sharing nature in above HiNAND2 array layout arrangement that has one full N-bit PB placed in top end of HiNAND2 array. This is named as a HiNAND2-1PB-N scheme.

In an alternative embodiment, a HiNAND2-2PB-N scheme has two identical N-bit PBs with top N-bit PB being connected to the first N-bit GBL_1 capacitors of Group 1 and bottom N-bit PB being connected to the last N-bit GBL_16 capacitors of Group 16. In between, there are 14 broken capacitors such as N-bit GBL_2 to N-bit GBL_15 as explained in previous HiNAND2-1PB-N scheme with only one N-bit PB placed on the top. Other control signals such as LBLps lines, CSL lines, PRE lines and DIV-EN lines and SEG lines, the numbers of MLBLp and MLBLs transistors remain the same without changes.

In this novel HiNAND architecture with two N-bit PBs, the Group 16 RC delay read by the bottom N-bit PB will be same as the Group 1 read by top N-bit PB in 1-cycle All-GBL Read as explained above. The N-bit different data can be stored separately in both top and bottom N-bit PBs. As a result, the slowest read latency happens on the Group 8 and Group 9. In this architecture, more evenly RC delay and power consumption is being achieved for this more powerful Multiple-WL and All-BL read and program scheme.

In another alternative embodiment, a HiNAND2-2PB-N/2 scheme has two identical N/2-bit PBs with one top N/2-bit PB being connected to the first N/2-bit Odd/Even GBL_1 capacitors of Group 1 and the bottom N/2-bit PB being connected to the last N/2-bit Even/Odd GBL_16 capacitors of Group 16. In between, there are similar 14 broken capacitors such as N-bit GBL_1 to N-bit GBL_15 as explained in previous HiNAND2 array with only one N-bit PB placed on the top. Other control signals such as LBLps lines, CSL lines, PRE lines and DIV-EN lines and SEG lines, the numbers of MLBLp and MLBLs transistors are not changed.

In this novel HiNAND architecture with two N/2-bit PBs, the Group 16 RC delay read by the bottom N/2-bit PB will be same as the Group 1 read by top N/2-bit PB but in 2-cycle of ½-GBL read from same side of N/2-PB as explained above.

As a result, the slowest All-GBL read latency still happens on the Group 8 and Group 9. In this new architecture, it is preferred to read one selected full WL page data from one end of PB because the true bottleneck of delay of reading one full WL is not the 2-cycle or 1-cycle of charge-sharing delay. The different delay of 1-cycle and 2-cycle of charge-sharing is less than 200 ns, which is negligible.

The bottlenecks of read delays are $C_{SEG}$ and $C_{GBL}$ charge and Discharge delays of one full page or physical WL. For HiNAND2-2PB-N, HiNAND2-2PB-N/2, and HiNAND2-1PB-N scheme the data-pattern trapped in the selected Blocks and determined by the corresponding PB is almost same, regardless of one PB or two PB. Note, although one-side N-bit PB is being divided into two-side two N/2-bit PBs, the charge and discharge operations are still performed in one full physical WL or page of all above HiNAND2 arrays.

As a result more evenly and flexible read latency arrangement and power consumption can be achieved for this more powerful Multiple-WL and All-BL HiNAND Read and Program scheme.

In yet another alternative embodiment, simultaneous reading Multiple-WL and All-GBL data from one selected Block per Segment of multiple Segments within one NAND Group, particularly in top Group 1 or bottom Group 16 for the structures of HiNAND2-1PB-N, HiNAND2-2PB-N/2, and HiNAND2-2PB-N scheme, are illustrated below in accordance with the circuit shown in an embodiment of HiNAND2 array shown in FIG. 2B.

In a specific embodiment, the eight steps of Read operation described in earlier sections of the specification in accordance with FIG. 8 and FIG. 9 are still applicable to the HiNAND2-1PB-N Multiple-WL and All-BL Read scheme based on Group 1 of HiNAND2 array circuit shown in FIG. 2B with n=1. In the embodiment, the HiNAND2-1PB-N scheme includes a) Total L Segments in Group 1, thus L $C_{SEG}$ capacitors such as LBL_1_1 to LBL_1_L; b) K Blocks for each of the L Segments; c) Capacitance ratio of $C_{SEG}/C_{GBL}$ of about 1/16 to read one selected WL data in one of the Segment in Group 1 which is kept the same as the ratio arrangement to read one selected WL-data from Group 16 to the top PB for using a same amplification factor of the same Multiplier; and d) The reduced precharge current because only one $C_{SEG}$ per Segment needs to be precharged for this Multiple-WL and All-GBL Read operation. Total L $C_{LBL}$ capacitors associated with L Segments need to be simultaneously precharged for this simultaneous Multiple-WL and All-GBL Read operation within Group 1. L $C_{SEG}$ capacitors includes LBL_1_1[1] to LBL_1_1[N] for Segment 1 to LBL_1_L[1] to LBL_1_L[N] for Segment L.

The first step of multiple-WL and All-GBL Read from Group 1 only is to simultaneously predischarge the voltages of all $C_{SEG}$ capacitors in Segment 1 such as LBL_1_1[1] to LBL_1_1[N] to all $C_{SEG}$ capacitors in Segment L such as LBL_1_L[1] to LBL_1_L[N] respectively through LBLps_1[1] to LBLps_1[L] lines simultaneously and separately in L Segments of Group 1 by setting the following biased conditions: a) PRE_1[1]= . . . =PRE_1[L]=Vd; b) LBLps 1[1]= . . . =LBLps 1[L]=Vss; c) SEG_1[1]=Vdd but SEG_1[2]= . . . =SEG_1[L]=Vss to predischarge N GBL_1 to Vss; and d) DIV_EN[1]=Vss.

Note, setting SEG_1[2] to SEG_1[L]=Vdd can also help pre-discharge $C_{GBL}$ faster but would require more power consumption. It is preferred to use only one LBLps to discharge $C_{GBL}$ in Group 1 by turning on one SEG_1[1]=Vdd but keeps the rest of SEG_1[2]= . . . =SEG_1[L]=Vss. Setting) DIV_EN[1]=Vss is to isolate all capacitors of GBL_2[1] to GBL_2[N] in Group 2 from the discharging capacitors of GBL_1[1] to GBL_1[N] in Group 1. Other groups from Group 2 to Group 16 are at don't-care state during this Group 1 Read operation. This pre-discharge step can be completed within 100 ns. Thus this step is not the bottleneck of this preferred Read operation.

The second step of multiple-WL and All-GBL Read from Group 1 only is to precharge all N selected local $C_{SEG}$ capacitors per one Segment such as LBL_1_1[1] to LBL_1_1[N] in Segment 1 to LBL_1_L[1] to LBL_1_L[N] in Segment L simultaneously. The precharged voltage is preferably set to be Vdd (1.8V) by setting the following bias conditions: a) PRE_1[1]= . . . =PRE_1[L]=Vread=6V in one-shot pulse; b) LBLps_1[1]= . . . =LBLps_1[L]=Vdd=1.8V; c) SEG_1[1]= SEG_1[2]= . . . =SEG_1[L]=Vss; d) SSL[1]=Vdd and GSL[1]=Vss to prevent leakage to respective LBLps_1[1] to LBLps_1[L/2]; e) WL(selected)=$V_R$, but WLs(unselected)= Vread=6V; and f) DIV_EN[1]=Vss to isolate the capacitors of GBL_2[1] to GBL_2[N] in Group 2 from the discharging capacitors of GBL_1[1] to GBL_1[N] in Group 1. Other groups from Group 2 to Group 16 are at don't-care states during this Group 1 Read. This precharge step can be completed within 100 ns. Thus this step is not the bottleneck either of this preferred Read operation.

Now, the preferred precharge happens only on N shorter LBL metal1 lines within Group 1 not including N $C_{SEG}$ capacitors in other Groups so that only 1/J of broken $C_{GBL}$ capacitance is subjected to the precharging not the total $C_{GBL}$ capacitance from all Groups as shown in previous Read operation (see FIG. 9 based on FIG. 2B). Thus the precharge step in the Multiple-WL and All-GBL Read from Group 1 or Group 2 consumes much less power but with much faster speed.

In order to make sure the number of Segments to be flexibly selected for Read in multiple Groups, one latch circuit per one Segment needs to be implemented in each Group.

In addition to precharge the selected LBL capacitors, similarly the selected in the selected Segments in Group 1 are also preferably precharged to $V_R$ WL Read voltage and the unselected WLs are applied to a Vread voltage simultaneously to save total time delay of this second 1-cycle Multiple-WL and All-GBL Read operation. The Vread voltage typically is set to be around 6V. The Vread voltage for unselected WLs is called a pass voltage.

As a result, the precharge time of the selected $C_{SEG}$ and $C_{GBL}$ can be completed within 100 ns, which is very fast. But charging the pass voltage time for unselected WLs is much longer of few micro-seconds, thus in this BL and WL precharge cycle period, the delay in charging the pass voltage to unselected WLs is one of the key bottleneck.

The third step of multiple-WL and All-GBL Read from Group 1 only is to discharge the $C_{SEG}$ capacitors on one or more selected WLs=$V_R$. The voltages of all local trapped N $C_{SEG}$ capacitors are simultaneously either discharged to Vss or retained at 1.8V fully determined by the stored page data in one selected WL per Segment in Group 1.

For example, for a SLC Read, then the selected WL is set to $V_R$=0V, and 63 non-selected WLs are set to Vpass=6V. GSL [1]=Vread but SSL=Vdd. Part of the N $C_{SEG}$ capacitors start to discharge from initial 1.8V to Vss within a predetermined discharge time if the corresponding NAND cell Vt=Vte<−0.7V, which is E-state. The remaining part of the N $C_{SEG}$ capacitors retain its initial precharged voltage of 1.8V if the corresponding NAND cells Vt>0, which is A-state.

Thus, after above steps of the Multiple-WL & All-BL Read operation of this HiNAND2 array, the selected Segments' LBL lines and the selected Groups' broken GBL lines will trap respective either Vss or 1.8V voltages in accordance with the stored NAND data pattern on the selected WL of the selected Block in the selected Segment in the selected Group (Group 1) of this HiNAND array. After J-WL & All-BL Read, either 1.8V or Vss will be stored isolately or separately in all N×LBL_1 to N×LBL_J capacitors in accordance with the stored data in multiple WLs when all DIV_EN[1]=...=DIV_EN[J−1]=Vss. Note the discharge time of each smaller $C_{SEG}$ capacitor is about J-fold (e.g, J=16) faster than to discharge each bigger $C_{GBL}$ capacitor performed in a Read operation with the same 64-NAND cell string (see FIG. 9 in association with FIG. 2B).

The fourth step of multiple-WL and All-GBL Read from Group 1 only is to perform a charge-sharing cycle between each $C_{SEG}$ capacitor and each $C_{GBL}$ capacitor in Group 1 for the multiple-WL & All-GBL Read operation.

In order to avoid data contention in each $C_{SEG}$ and each $C_{GBL}$, the data in each $C_{SEG}$ will be transferred to the common $C_{GBL}$ one by one from different Segments in Group 1. As well arranged above, the capacitance ratio $C_{SEG}/C_{GBL}<1/16$, thus the amplification of Multiplier can be kept the same as previous read from all Groups. The details would be skipped here for description simplicity.

In this case the charge-sharing of different Segments with one common $C_{GBL}$ is fully random in nature. Since charge-sharing takes a very short time, thus this step is not the bottleneck of this preferred Multiple-WL and All-GBL Read operation from the same Group 1. The rest steps of multiple-WL and All-GBL Read from Group 1 only are substantially the same as ones shown in FIG. 8 and FIG. 9 for reading multiple WLs from Multiple Groups, thus the detailed descriptions are also skipped here for simplicity.

Note, the above two kinds of Multiple-WL and All-GBL Read operations show the first example is to read multiple WLs from Multiple Groups and the second example is to show to read multiple-WL from Group 1 for HiNAND2-1PB and from Group 16 as well as for HiNAND2-2PB-N or HiNAND2-2PB-N/2, etc.

Other combinations of Multiple-WL and All-GBL Read operations are possible. For example, read Multiple WLs from all Groups along with read Multiple WLs from Group 1 and Group 2 and even from Group 2 and Group 15 as well by properly arranging the capacitance ratio of $C_{SEG}/C_{GBL}$. All above mentioned or non-mentioned Multiple-WL and All-GBL read should be all covered by this invention without a limitation, regardless of 2D or 3D NAND flash.

In operating the Multiple-WL and All-BL Read, the storages differences would make the read flow different. In an example of Multiple-WL and All-BL SLC Read, each WL stores the SLC 2-state data. Therefore, all selected Blocks are applied with same set of biased voltages for one selected WL=0V and 63 unselected WLs=Vread, SSL=Vdd and GSL=Vdd. As a result, the discharge of precharged 1.8V or higher $V_{inhibit}$ voltage are performed simultaneously on all the selected WLs in the selected Blocks in same selected Segments in different Groups or in the selected Blocks in different Segments but same Group 1 or Group 16.

Since the selected LBL capacitors of the selected Segments are either discharged or retain precharged charges simultaneously by the selected WL, the read data of selected multiple WLs will be ready at the same time and the data patterns are stored in the corresponding $C_{SEG}$ capacitors. Later, each WL's $C_{SEG}$ data is serially loaded from the selected Blocks into each corresponding Cache memories of the PB.

In an example, the PB preferably has at least 2 rows of N-bit Cache memories, Cache1 and Cache2, to allow proper handling of reading J-WL data (J=16) either from same Segments of 16 different Groups or from 16 different Segments within a same Group. The two Cache memories are preferably operating in pipe-line manner and are controlled by on-chip State-machine.

The N-bit Cache1 memory is directly connected to the outputs of a N-bit SA. The inputs of the N-bit Cache2 are connected to the outputs of the N-bit of Cache1. After the completion of simultaneous discharging operations of 16-WL read, any one of the 16-WL can be selected to be transferred to the Cache1. Once the loading of a first WL data is completed, the second WL data is transferred to Cache1 by the rising-edge of clock, but the contents of the first WL data is transferred to from cache1 to Cache2 by a falling-edge of a clock to avoid the data contention.

Thus, total 16-WL and All-GBL SLC data can be sequentially read out one by one into Cache1 and then sent to I/O to the off-chip Flash controller through Cache2 in a fast pipeline fashion with only requirement of a small PB size. The number J of WLs being associated with a simultaneous Multi-WL Read and number K of WLs being associated with a simultaneous Multi-WL Program can be different. For a Read charge-sharing concern, the J is kept ≤16 but K can be larger than J because multiple-WL simultaneous Program do not have charge-sharing steps. Thus the thumb of rule in HiNAND2 array is K>J. K even can be set to be like K=2×J or 4×J, etc.

In an example of Multiple-WL and All-BL 4-state MLC for 16 WLs simultaneous Read, there are one erased-state of E state and three programmed states of A, B and C with the stored Vt values, Verify values, and Reference values in accordance with the drawings shown in FIG. 1C. The similar approach can be extended into 8-state TLC and 16-state XLC Read.

The SLC Read is like the R1 Read (see FIG. 1C), which $V_{R1}$=0V is applied to the all 16 selected WLs. The E-state data of 16 WLs are ready and stored on each corresponding broken $C_{GBL}$ capacitance and $C_{SEG}$ capacitance if 16 WLs are located in 16 different Groups. Now, the reading of these 16 WLs will be performed sequentially from Group 1 to Group 16 if HiNAND2-1PB-N is used.

In one option, the first-WL data in Group 1 is transferred to the N-bit Cache1. Then, the same location (WL address) of the second-WL in different Segment is also read out and transferred to same PB buffer with the first-WL data being transferred to Cache2. All the subsequent 14 WLs' data would be serially transferred to Cache1 in pipeline manner during the previous WL data being transmitted to I/O. Thus, after 16 clocks, total 16 SLC data are being transferred to Flash controller for subsequence calculation of MLC.

Next, a higher $V_{R2}$ is applied to all 16 WLs for data evaluation to get A-state data (see FIG. 1C). Again, 16 WLs of A-state data would be serially sent out to Flash controller for subsequent MLC data calculation. Before sending out these 16-WL data, a 4-bit divided-by-2 D-Flipflop can be used to encode these 16 data per 16 WLs. Any 0-data being sensed in each State will clock the state-advance of this 4-bit Flipflop. Any 1-data would not clock into the next level. As a result, the 16-WL data per State can be converted into 4-bit MLC data. Thus, only 4×16=64 clocks as the conventional MLC Read of 16-WL data can be achieved.

In another embodiment, this Multiple-WL and All-GBL SLC Read operation can be extended into preferred Multiple-WL and All-GBL Program and Program-Verify operations under the same HiNAND2 array circuit. Before performing any HiNAND2 Program operation, the flash cells have to be erased to a negative E-state first. In prior art, the Erase operation is performed in unit of a Block. The Block size can be 1

Mb up to 4 Mb, depending on the specs and applications. And the typical Block erase time ranges from 2 ms to 5 ms.

A typical Block includes 64 NAND-cell Strings. That means a String of a Block is comprised of 64 WLs. The Block Erase operation is simultaneously performed on all 64 WLs by grounding all 64 WLs such as $V_{WL1}=V_{WL2}=\ldots=V_{WL64}$ to Vss with a common TPW being set to 20V. All these 64 WLs are in the one physical String and one physical Block. It is referred as Consolidated Block.

But to simultaneously program these 64 WLs in a Consolidated Block with a size of 8 KB per WL in one physical Block like above Erase operation is totally impossible under the conventional NAND architecture in the past 25 years.

Unlike the conventional NAND with Consolidated Blocks, these 64 WLs are preferably dispersed in 64 different Blocks as one WL per Block with a same cell-String location within the preferred HiNAND2 array architecture. This kind of Block is referred as Dispersed Block of the present invention. Accordingly, the conventional 64-WL Erase operation in one physically Consolidated Block is preferably changed to simultaneously erase 1-WL per Dispersed Block within a scheme of 64-WL in 64 physical Blocks. As a result, both Erase and Program operations can be preferably performed on 1-WL per Block basis but simultaneously on 64 WLs respectively in 64 Blocks. Therefore, a 64-fold program-time reduction for one physical page can be achieved with this Dispersed-Block structure.

An embodiment of the present invention using higher $V_{inhibit}$ voltage to replace Vdd in a non-SBPI method is also adopted here for achieve a superior program-inhibit (PI) function but along with a new set of WL biased conditions. The reason of using $V_{inhibit}$ voltage and Vss for Program-Inhibit and Program is to get a higher initial Inhibit voltage of Vpass−Vt in the NAND channels of unselected programmed cells. The conventional SBPI method uses Vdd as low as 1.8V. The $V_{inhibit}$~7V would have about 5.2V higher initial voltage at the unselected LBL lines, which is passed to the flash channels of unselected programmed cells. By applying Vpass=10V to those unselected WLs with corresponding NAND cells at the highest programmed Vt=5V (For state C in MLC cell), the NAND channel' voltage is about 10V−5V=5V, which is still much higher than Vdd prior to ramping the selected WL's gate to Vpgm of 20V. Additionally, this preferred Program scheme allows for one random-WL program per Dispersed Block, thus all NAND cells in any WLs can be selected for Program along with the remaining WLs with proper biased voltages (see Table 6 below).

Due to WL-WL coupling effect, the channel voltage of unselected program cells can still be boosted from initial 5V to about 10V. Thus, the final channel PI voltage is much higher than conventional NAND to have a superior PI performance. For example, it is much less affected by, at the worst-case scenario, 0V channels presented on both adjacent BLs of a programmed cell.

Again, referring to FIG. 2B, as the $V_{inhibit}$ voltage is coupled from only one selected LBLps power line through the selected N MLBLs and N MS transistors by setting gate signals of PRE=SSL to $V_{inhibit}$+Vdd+A, $V_{margin}$ and setting NAND cells' gate to Vpass=10V on the unprogrammed WLn+1 (up to WL64) to reach the NAND cells' channels in the selected WLn. Note: the order of WLs are defined from the String top to bottom such as WL1, WL2, WLn-1, WLn, WLn+1, WL63, WL64 for a 64-cell NAND String. The selected WL is denoted as WLn. The unprogrammed WLs are WLn+1 up to WL64 and the programmed WLs are from WL1 to WLn−1.

TABLE 6

| HiNAND2 operation | $WL_1$ | $WL_{n-2}$ | $WL_{n-1}$ | $WL_n$ | $WL_{n+1}$ | $WL_{64}$ | TPW | Block # | LBL Select | LBL unselect |
|---|---|---|---|---|---|---|---|---|---|---|
| WL Program voltage | Vdd | Vdd | $V_{pass}$ | $V_{pgm}$ | $V_{pass}$ | $V_{pass}$ | 0 V | 1-64 | 0 V | 7 V |
| WL Erase voltage | F | F | F | 0 V | F | F | 20 V | 1-64 | F | F |
| WL Read voltage | $V_{read}$ | $V_{read}$ | $V_{read}$ | $V_R$ | $V_{read}$ | $V_{read}$ | 0 V | 1-64 | 1.8 V | 0 V |

Note:
Vread = 6 V, Vpgm = 15 V-25 V, Vpass = 10 V, F = Floating, $V_R$ = Read WL MLC voltages.

In addition, all SEG, PRE, SSL, GSL, CSL, LBLps, DIV_EN[J] are left at floating to avoid the gate-oxide breakdown due to the common bulk of TPW=20V. All NMOS select transistors (which are made of same devices) MLBLp, MS, MG, and MLBLs are configured to sustain the preferred PI operation with higher $V_{inhibit}$ voltage.

In the conventional NAND array architecture, if $V_{inhibit}$ voltage is coupled directly from GBL lines, the program-inhibit current consumption is too high. But in this preferred 2-level BL-Hierarchical HiNAND2 structure, the $V_{inhibit}$ voltage is generated from a central $V_{inhibit}$ pump circuit and is only coupled to 16 selected LBLps horizontal power lines on a basis of one LBLps line per Dispersed Block. Thus, the capacitances of these 16 LBLps lines are much smaller so that the power consumption to couple the $V_{inhibit}$ voltage to NAND cell channels is drastically reduced as compared to the required high current consumed in each long and heavy GBL capacitor when using Vdd in PI operation.

The program Vpass gate-disturbances in the selected String for either the case of using Consolidated Block or the case of using Dispersed Block are the same. Therefore, the advantage of low-power consumption of using $V_{inhibit}$ scheme for simultaneous Multiple-WL and All-GBL Program and Erase operations is not achieved at the expense of NAND memory reliability, power, and silicon area.

Two embodiments of Block Erase in this HiNAND2 array are illustrated below. In a specific embodiment, total 64 WLs are arranged in one HiNAND2 physical Consolidated-Block so that the Erase operation is executed in unit of 64 WLs in one physical Consolidated-Block simultaneously but the Program operation can only be performed in 1-WL per Block base. The saving of WL Program cannot be benefited from this scheme.

In another specific embodiment, total 64 WLs are arranged in 64 HiNAND2 Dispersed-Blocks so that both the Erase operation and the Program operation can be executed in unit of 64 WLs simultaneously in the Dispersed-Block scheme, resulting in a big saving in Block's program and read time.

In this HiAND2 Program operation, there are at least two preferred PI schemes: Case1) using Vdd as an $V_{inhibit}$ coupled from N long broken GBL lines and PB and Case2) using 7V as $V_{inhibit}$ coupled from N short LBL lines and only 16 LBLps lines coupled from one $V_{inhibit}$ pump circuit. The values of N can be 8 KB=8,192 or 16 KB=16,384 for one physical page or WL in HiNAND2 (same as conventional NAND) array.

Case1: Each WL data of Vss-program and Vdd-inhibit voltages are coupled directly from a N-bit PB to one selected N-bit Block at a time. These Vss and Vdd voltages are passed to the selected channels through N selected broken GBLs, through N selected MLBLp transistors in on-state to N broken LBL lines and then to N Selected NAND Strings through N first String-select transistors MS in on-state and N second String-select transistor MG in off-state to prevent the String leakage. All this Vdd-inhibit and Vss programmed voltages are then latched or trapped in the selected N $C_{SEG}$ capacitors in the selected Segment and Group in accordance with the WL data stored in the N-bit PB. After this medium $C_{SEG}$ capacitors are precharged with one-shot of Vdd-inhibit and Vss, the N gates of LBL-select transistors MLBLp are then being shut off by setting SEG signal to Vss to trap Vdd-inhibit and Vss. This precharged process takes time less than 200 ns to 3 μs, depending on the Block location or distance of the selected broken $C_{GBL}$ from the PB.

After the first trapping of Vdd-inhibit voltage in the first $C_{SEG}$ capacitor of the first selected WL and the selected Block, the remaining 63 $C_{SEG}$ capacitors for 63 WL in 63 dispersed Blocks in the 63 dispersed Segments either in one Group or different Groups are then to trap the similar Vdd-inhibit and Vss voltages in 63 $V_{inhibit}$ precharge cycles. Since the conventional NAND architecture does not have this 2-level broken-BL hierarchical structure array, thus the trapping of multiple pages of $V_{inhibit}$ and Vss voltages cannot be realized. Conversely, multiple trappings of $V_{inhibit}$ and Vss voltages can be realized in this HiNAND2 array, thus the Multiple-WL and All-BL Program scheme can be easily executed to save 64-fold reduction in program time if each String includes M=64 WLs.

Case2: In this case, all selected $C_{SEG}$ capacitors are precharged with 7V-inhibit voltage initially by coupling the selected 64 LBLps lines (respectively associated with 64 Segments in dispersed Groups) to 7V with PRE being set to 7V+Vt+$V_{margin}$, where $V_{margin}$~0.5V. For this case, PRE signal is at Vpass~10V.

The precharge cycle is similar for charging N broken $C_{GBL}$ capacitors with Vdd-inhibit and Vss voltages as in Case1 which are coupled from a N-bit PB in accordance with the stored WL-data pattern. Then SEG signal is switched from Vss to Vdd to turn on MLBLp transistors to connect each broken $C_{GBL}$ capacitor to each corresponding $C_{SEG}$ capacitor that is filled with the precharged 7V-inhibit initially. As a result, the voltages of LBL capacitors will be selectively discharged to either Vss or retained to 7V-inhibit voltage according to $V_{GBL}$=Vss and $V_{GBL}$=Vdd from the PB respectively through transistors MLBLp set to On-state.

In other words, both Case1 and Case2 need the Vdd-inhibit and Vss-program voltages coupled from the common N-bit PB. But in Case1, no 7V-inhibit voltage is coupled to all $C_{SEG}$ capacitors prior to Program operation. But in Case2, precharging 7V-inhibit voltage to all selected 16 $C_{SEG}$ capacitors are required for a superior PI and Program operations.

In conventional NAND SLC one page (1-WL) Program, it takes about 250 μs. For 64-WL Program in a Consolidated-Block, it takes 250 μs×64=16 ms. For this preferred Multiple-WL and All-BL simultaneous SLC Program in 64 Dispersed Block, it only needs 250 μs. This is a big saving in NAND Program throughput.

This Multiple-WL and All-BL SLC Program scheme can be similarly applied for a MLC or TLC, even XLC Program to save the program time. Regardless of Case1 or Case2 program, the N-bit PB is a same LV PB as the conventional NAND.

In principle, the total numbers of WLs to be programmed of the present invention are subject to at least following factors: 1) P/N junction leakages, 2) operating temperature, 3) precharged $V_{inhibit}$ voltages, 4) the length or value of each $C_{SEG}$ capacitance and 5) the number of Caches in a PB.

Firstly, the total numbers of WLs to be programmed is determined by how long the trapped $V_{inhibit}$ voltage (7V or Vdd) can last duo to the junction leakages of P/N source/drain areas of one transistor of MLBLp, one transistor of MS/MG, one transistor of MLBLp and 64 transistors of NAND cells, MC, per $C_{LBL}$ capacitor. Since 64 WLs are being simultaneously programmed in 250 μs per SLC, thus retaining all 64 trapped $V_{inhibit}$ voltages in 250 μs should not be a bottleneck of program time. The longest time is the 64-WL data loading into and trapped in the 64 N×$C_{LBL}$ capacitors.

For example, for 2.5 ns/Byte DDR2 transmitted time and 8 KB page size, the total 64-WL loading time would be 2.5 ns×8K=20 μs. Then total 64-WL data needs 20 μs×64=1.28 ms. This time lapse should be okay for this Vdd–$V_{inhibit}$ and 0.1 pf per $C_{LBL}$ capacitor. If there is a concern to retain $V_{inhibit}$ within a 1.28 ms time lapse, then 2 cycles of two 32-WL or 4 cycles of 16-WL Program can be used instead. As a result, even a 16-WL and All-GBL simultaneous Program is still a great saving in program time.

Secondly, the P/N junction leakage is highly depended on operating temperature. In particular, the higher operating temperature is, the higher P/N junction leakage. Thirdly, the higher precharged $V_{inhibit}$ voltage is, the longer retaining time for part of $C_{LBL}$ capacitors. In practice, the highest $V_{inhibit}$ voltage is set to be around 7V. Additionally, the length or value of each $C_{LBL}$ capacitance is another determination factor for the number of WLs during simultaneous Program operation. Furthermore, the number of Caches in a PB also affects the determination of the total number of WLs to be programmed simultaneously.

Are 64 Cache memories per PB required to store 64-WL data and their associated addresses for a 64-WL simultaneous program? Practically, for programming 64-WL to have 64 Cache per PB is not economic. It is desired to determine an optimal number of Cache memory for more flexible handling of on-chip Program-Verification of MLC or TLC Program operation. One option is that the multiple-WL data is preferably loaded into a 4-Cache memory serially from NAND 8×I/Os in a pipeline manner. Therefore, no multiple Registers or Caches to store all K-WL data is required for this HiNAND2's architecture design. In other words, under the preferred condition that the number of Registers or Caches is smaller than K, for example, ½ K or ¼ K, etc.

FIG. 6A is a diagram showing a set of SLC Read timing waveforms for Multiple-WL and All-GBL simultaneous Read operation with a preferred set of initial biased conditions in accordance with the 1-bit static PB circuit shown in FIG. 5A of both HiNAND1 and HiNAND2 arrays according to an embodiment of the present invention. As shown, the control signals RECALL, PGM, LOAD, and VFY are set to 0V as initial biased conditions in accordance with the PB circuit shown in FIG. 5A. Since SLC Data Register has 4 paths of 4 operations to set the digital value D1 of one Latch comprising INV0 and INV1, so D1 is set to 0 when WAT_BK is subjected to one-shot pulse of Vdd; D1 is also set to 0 when LATO is subjected to one-shot pulse of Vdd; D1 is set to 1 when signal VFY is subjected to one-shot pulse of Vdd and Q[i] is coupled to Vdd; D1=1 when RW_RES signal is subjected to one-shot pulse of Vdd.

As shown in FIG. 6A, the SLC Read Timing Waveforms start from two undistinguished SLC states such as the erased E-state and the programmed A-state with one Latch's output D1 node reset to Vdd as an E-state in a Program-Buffer along with the Selected WL voltage set to a value of $V_{R1}$ initially. For those selected NAND cells storing E-state, the corresponding GBL capacitor voltage would be discharged to Vss to flip the Latch's D1 from Vdd to Vss. For those selected NAND cells storing A-state, the corresponding GBL capacitors' voltage would be retained after charge-sharing and then amplified by the Multiplier to retain Latch's D1=Vdd, thus the stored state is A-state. Once the first selected WL data is successfully distinguished, the page data would be sent to I/O pins through I/O Control circuit. Subsequently, the remaining second to J WL data would be read out and evaluated each WL one-by-one and then sent out to I/O in a pipeline manner.

FIG. 6B is a diagram showing a set of Sample/Hold Multiple-WL SLC PGM patterns timing waveforms in accordance with the 1-bit static PB circuit shown in FIG. 5A of both HiNAND1 and HiNAND2 arrays according to an embodiment of the present invention. as shown, the initial biased conditions includes setting T3B signal at Vdd and setting RECALL, LATP, RES signals at 0V in accordance with the PB circuit shown in FIG. 5A for the preferred Multiple-WL and All-GBL simultaneous Program operation.

As shown in FIG. 6B, the Multiple-WL SLC data are serially loaded into and stored at those well-planned N-bit broken metal1 LBL capacitors in the selected Segments, Groups of HiNAND2 array. Since the S/H function is to load multiple-WL data into SLC Data Register within a Program operation rather than a Program-Verify operation, the VFY signal is set to 0V. Additionally, it is not within a Read operation either, thus T3B signal must be set to Vdd. Again, it is rather than a Recall operation, thus RECALL signal must be set to 0V. In particular, the multiple-WL data is serially loaded in to SLC Data Register in unit of Byte if I/O number is eight (8) or in unit of Word if I/O number is sixteen (16).

For storing J-WLs SLC data in the designated array areas of the broken metal1 LBL capacitors, totally J preferred rows of LBL capacitors near the PB are required. During J-WL Program-Verify operation, a Recall operation to restore the Program SLC data pattern in HiNAND array to SLC Data-Register 506 in the PB 500 (see FIG. 5A) is performed sequentially in a predetermined order from one-WL by J-WL to save the silicon area of J–1 Data Register.

Next, the WL-data loading into Data Register 506 (see FIG. 5A) starts with a one-shot pulse of RW_RES to reset D1=Vdd initially. The first SLC WL-data would be serially loaded into Data Register 506 in PB from external I/Os 522 in unit of Byte as an example. Then for transferring N-bit of a large WL size of 16 KB, it will take 16K times to fill up whole page of one WL SLC data. After 16 KB one WL SLC data being successfully loaded into N-bit Data Register 506 through bus 520 and Y-pass 510, then the whole 16 KB data in the Data Register 506 via BLP line would be stored in the corresponding designed N-bit broken metal1 GBL or metal1 LBL capacitors by one-shot of PGM clock. This one page or one row of LBL or GBL capacitors is termed as Dynamic Cache in HiNAND array. For data bit=1, then the corresponding LBL or GBL capacitor would store Vdd voltage, while data bit=0, then the corresponding LBL or GBL capacitor would store Vss=0V voltage accordingly.

FIG. 6C is a diagram showing a set of set biased conditions of Multiple-WL and All-GBL SLC simultaneous PGM timing waveforms in accordance with the 1-bit static PB circuit shown in FIG. 5A. As shown, the biased conditions include setting signals LOAD and LATP to 0V in accordance with the PB circuit 500 in FIG. 5A. This preferred set of Multiple-WL SLC Program waveforms should be performed along with the associated S/H waveforms shown in FIG. 6B.

Since this is the preferred S/H operation in Program operation to load WL-data into SLC Data Register 506 (see FIG. 5A), rather than Program-Verify thus VFY=0V, rather than Read, thus T3B=Vdd, and rather than Recall, thus RECALL=0V. The data is serially loaded in to SLC Data Register 506 in unit of Byte if I/O number is eight (8) or in unit of Word if I/O number is sixteen (16).

FIG. 6D is a flow chart showing a method for the preferred Multiple-WL and All-GBL SLC simultaneous Program operation in accordance with the preferred PB circuit shown in FIG. 5A. As shown, the method for performing a SLC Multiple-WL and All-BL Program operation for both 2D and 3D HiNAND2 arrays starts from loading the 1-WL or 1-page SLC data from external I/Os sequentially into N-bit Data Register (step 710). Once a whole page of N-bit data is ready in Data register, then whole one-WL SLC data is then being transferred to N-bit Selected LBL capacitors as termed as Dynamic Caches in step 712.

Total WLs' SLC data are checked if all of them being successfully transferred to the multiple designated N-bit Dynamic Caches and Static Cache as shown in step 714. If the check indicates that all of WLs' SLC data have been successfully transferred to the multiple designated N-bit Dynamic Caches and Static Cache, then the Multiple-WL Program operation is activated in step 718. If not, then the above loading is continued sequentially by increasing the page counter to next page address in step 716.

Once the Program operation is finished after one iterative program pulse, then the next Multiple-WL Program-Verify operation would be initiated as shown in step 722. But prior to this Program-Verify operation, a Recall operation is performed at step 720 to restore multiple-WL N-bit program data from Dynamic Cache or LBL capacitors back to the corresponding bits of one Static PB which is shared by multiple-WL SLC data. Thus, the Recall is performed on one-WL by one-WL basis sequentially.

During each WL data Program-Verify operation, those bits passing the Program-Verify in one selected WL have to be set a $V_{inhibit}$ voltage on the selected GBLs and transferred to selected LBL dynamic cache in parallel at step 724. The next WL data is moved to be subjected to the next Program-Verify and is checked to see if all multiple-WL programmed data being checked at step 726. If not, then move to next iterative program cycle by increasing Vpgm by ΔVpgm on multiple WLs simultaneously. And then the next iterative program pulse is issued again at step 728.

The Program and Program-Verify iterative operations on all selected multiple WLs will be continued and checked. Once all multiple-WL data being programmed passing the verification of desired data at step 730, and the Program and Program-Verify iterative operations will be stopped at step 732.

FIG. 7A is a diagram showing a set of MLC Read timing waveforms for performing the preferred Multiple-WL and All-GBL MLC simultaneous Read operation in accordance with the multi-bit static PB circuit shown in FIG. 5B of both HiNAND1 and HiNAND2 arrays according to an embodiment of the present invention. As shown, the timing waveforms start from initial setting E-state with two bits of CODE1 and CODE2 generated from on-chip Code generator and rolling from E-state, A-state, B-state, and C-state for comparison against to two bits per NAND cell read from multiple selected WLs. The PB circuit is configured for MLC Read operation by disabling Program and Program-Verify functions by setting control signals of VFY, PGM, LOAD, PGM_DIS, to 0V and setting signals RECALL1 to RECALLe, L2A1 to L2Ae, and PGM_EN to 0V, and also by setting RW_RES to 0V, etc.

The data comparison starts first, by applying one-shot RES signal, from the preferred lowest level of E-state to A-state to B-state and then C-state by applying the same step-rising voltages on multiple selected WLs with $V_{R1}$ (0V) to differentiate A-state from E-state, $V_{R2}$ to differentiate B-state from A-state and $V_{R3}$ to differentiate the last C-state from B-state.

Once the data is matched, the data would be locked into the corresponding Data Buffer upon each rising-edge of T7 clock that will sequentially set LAT signals of corresponding Data Registers. The T3 and T5 are the signals used by each DRAM-like Latch-type SA 304 shown in FIG. 5B.

FIG. 7B is a diagram showing a set of Sample/Hold Multiple-WL PGM patterns timing waveforms for the preferred Multiple-WL and All-GBL MLC simultaneous Program Patterns operation in accordance with the multi-bit static PB circuit shown in FIG. 5B. As shown, the timing waveforms start from first setting all DLs to initial E-state by applying one-shot pulse of RW_RES. Then the external Multiple-WL program data are sequentially loaded into the static on-chip Data Cache in unit of byte if 8 I/Os NAND is used or in unit of Word if 16 I/Os NAND is used through I/O control circuit and system clocks.

First, the whole WL Word or Byte data are sequentially clocked by a plurality of LOAD clocks' rising edge. Totally, 2 N-bit MLC data per one WL are loaded into 3 N-bit static Data Cache. After that, L2A1 and L2A2 clocks are sent to load two corresponding $C_{SEG}$ capacitors in multiple Segments in one Consolidated HiNAND Group or to one Segment per multiple Dispersed HiNAND Groups as explained previously in FIGS. 4A-4D.

Since the storage data is MLC type, it just needs two clocks of L2A1 and L2A2. If the storage data is TLC type, then it needs three L2A1, L2A2 and L2A3 signals to complete 3-bit TLC loading into 3 N-bit Data Cache Registers. Note, in the circuit of Data Buffer of FIG. 5B, the two MLC outputs are shorted at OUTP node through two MN15 transistors MSB and LSB bits of Data Buffer. That is why two separate clocks are needed to avoid data contention on OUTP node if 2-bit of MLC data per GBL line is sent.

Once all MLC programmed data are fully loaded into 2 N-bit Data-Buffer, then 2 MLC bits have to serially loaded into the different $C_{SEG}$ capacitors in predetermined addresses through only one shared GBL and one BLP line. Thus it needs to be loaded by two clocks of L2A1 and L2A2 with BIAS≥Vdd for passing the MSB and LSB WL data into the corresponding $C_{SEG}$ Dynamic Cache Registers, which actually are capacitors in HiNAND designated areas with the input of Multiplier 602 being disconnected.

But the Program and Program-Inhibit pattern has to be generated per one 2-bit MLC data before Multiple-WL Program being executed. This can be done by using a circuit of MN24, MN25, . . . , MN30 and MN6 with gate tied to PGM_DIS. For MLC, only D1 and D2 are required. For TLC, D1, D2 and D3 are required to be at Vdd to reset QOB to Vss so that BLP is set to Vdd to prohibit further program to avoid over-programming. Otherwise, unmatched MLC data would set BLP and GBL to Vss to allow the next program pulse to increase Vt from E-state to A-state. Initially BLP and GBL are set to be 0V for programming by applying one-shot pulse to reset signal PGM-EN to set Q0 at Vss but QOB at Vdd, and set BLP to Vss at the output of INV8. Once matched, then MATCH is set to Vdd to reset QOB at Vss again so that BLP is at Vdd to provide the Vdd-Inhibit GBL voltage for those matched MLC cells.

Once Program and Program-Inhibit of N-bit MLC is ready per whole selected Multiple WLs, then the Program operation is initiated.

FIG. 7C is a diagram showing a set of biased conditions of Multiple-WL and All-GBL MLC simultaneous PGM timing waveforms in accordance with the preferred PB circuit shown in FIG. 5B. Similar timing waveforms can be extended to TLC and XLC simultaneous Program operation. As shown, the timing waveforms include the HiNAND2 array's major control signals such as SEL, WL, RES, T3B, VFY, RW_RES, RECALL1, RECALL2, PGM, PGM_EN, PGM_DIS, L2A1, L2A2, Q0 of three WLs, etc. The selected multiple WLs are applied with same step-rising Vpgm on the same address of multiple WLs. Unlike the conventional NAND Program, the Vpgm only applied to only one selected WL, the HiNAND Program operation can be performed simultaneous on one and more selected WLs to cut the total program time.

One major difference is that there are more than one WL Program-Verify operations are performed between two successive program pulses. In a first step, the initial one 2-bit E-state code of a MLC cell are generated on CODE1 and CODE bits to two DLs in two Data-Buffers 640 in FIG. 5B. And two outputs of D1 and D2 are coupled to the gates of MN24 and MN25 with D1 and D2 being set to Vdd in the beginning of program cycle when one-shot clock of RW_RES is applied to the gate of MN13. Besides, SA and Latch of INV4 and INV5 are reset by one common signal of RES. As a result, initially, both IB[i] and Q[i] are at Vss and D1 and D2 are at Vdd.

In the next step, the T7 signal is first applied an one-shot pulse to enable the latch of INV5 and INV4 for Q[i] or QB[i] to reset IB[i] and I[i] of latch. Before Verify for one selected WL is performed, two Recall signals RECALL1 and RECALL2 have to be performed to restore the stored 2-bit program data in two $C_{SEG}$ capacitors or Dynamic Registers back to 2-bit Data-Buffers 340 through one Multiplier 602 and one SA 604. In addition, one Program and Program-Inhibit MLC data patterns needs to be restored back to one program buffer of 304. That is why three clocks of RW_RES, RECALL1, and RECALL2 and three T7 clocks in between are required to enable SA 604. Once above 2-bit MLC data of program data is ready, the Multiple-WL Program-Verify operation can be performed by one-shot VFY thereafter.

The new Program and Program-Inhibit 2-bit data will be sent back to two $C_{SEG}$ capacitors again, which can be done by two one-shot L2A1 and L2A2. A new cycle of Program-Verify is then moved to next selected WL in same VFY1 of same WL voltage of previous WL. The above Program-Verify cycles would be performed on all selected multiple WLs. Then whole multiple-WL simultaneous Program will be performed again with rising Vpgm pulse. This iterative Program operation will end once all selected multiple WLs are completely programmed to meet the desired stored data.

FIG. 7D is a flow chart showing a method for the preferred Multiple-WL and All-GBL MLC simultaneous Program operation in accordance with the multi-bit static PB circuit shown in FIG. 5B. The method is applicable for performing MLC Multiple-WL and All-GBL simultaneous Program operation for both 2D and 3D HiNAND2 arrays according to an embodiment of the present invention. As shown, the method starts from a step 740 to load external 1-page or 1-WL data to the designated N-bit Data Register sequentially for all Multiple WLs. The data can be 1×N-bit SLC, 2×N-bit MLC, 3×N-bit TCL or 4×N-bit XLC.

When a first WL data is successfully loaded into N-bit Data Register, then it is immediately transferred to the corresponding N-bit Cache Register as seen in step 742. When the first WL data is successfully loaded into N-bit Cache Register, then it is immediately transferred to the corresponding N-bit Program Buffer Register that is made of N local LBL capacitors in the designated areas of HiNAND2 array as shown in step 744.

Then next step 746 is to check if all the desired program data of Multiple WLs being successfully loaded in the designated metal1 LBL capacitors? If not, then the loading from external I/O to LBL capacitors will be repeated (step 748) for next page until it completes. If yes, then the step 750 is to start the Multiple-WL simultaneous Program. The one-shot pulse of Vpgm for Multiple selected WLs one per Segment or Group should be the same along with Vpass on multiple unselected WLs.

Once program time is due, then a Recall destructive operation of step 752 is preferably being implemented prior to the Program-Verify operation in step 754. The reason needs to do the Recall is to restore Multiple programmed WL data that are stored in the corresponding N-bit LBL metal1 capacitors as seen in FIG. 4A and FIG. 4B. For example, if the stored data is the MLC data, then it requires 3 N-bit Cache Registers to store total three N-bit MLC data for each WL in three rows of LBL metal1 capacitors. For 16-WL MLC data simultaneous Program, the restoring of 16-WL MLC data takes 3×16=48 clock cycles for 3-bit MLC WL data.

Since the stored 3-bit MLC data are being restored back into 3-bit Cache Register per GBL, then the data read from the selected WL bit can be compared against to the stored data. Thus the Program-Verify operation is activated at step 754. Note, the Program-Verify operation of HiNAND memory cells is using DRAM-like charge-sharing scheme for HiNAND2 or HiNAND1 Read operations that need to precharge and discharge the metal1 LBL and metal2 GBL lines (details are can be seen in earlier sections of the specification and skipped here for the description simplicity). Note, the restoring of the first multiple WLs' data of corresponding metal1 LBL and metal2 GBL capacitors should be preferably done during the lengthy Multiple-WL Program operation to save the first program-verify time because all N-bit GBL line buses are free in that period.

In step 756 a successful Program-Verify operation is done for the first N-bit data of the selected WL after the first iterative Program operation. The successfully verified data in Data Register are flipped to V-inhibit and is transferred to dynamic cache in parallel. Then the new set of Program and Program-Inhibit patterns are restored back to the corresponding metal1 broken LBL capacitors (step 758) for next-bit of MLC Program in the same WL.

A check operation is then executed (step 760) if all bits of each WL MLC data being Program-Verified. If not, move to the next WL (page) in step 762 to repeat the above Program-Verify steps 752-758 until all multiple-WL MLC data completely pass Program-Verify (step 764), then the method for performing MLC Multiple-WL and All-GBL simultaneous Program operation for both 2D and 3D HiNAND2 arrays ends at step 766.

FIG. 8 is a diagram showing a preferred set of bias voltage conditions of array control signals for Multiple-WL & All-GBL simultaneous Read operation based on the HiNAND1 array shown in FIG. 2A according to a specific embodiment of the present invention. A preferred set of bias voltage conditions of several key array control signals are included in a table for performing a preferred J-WL & All-GBL simultaneous Read operation divided into 8 steps. The bias conditions for multiple control signals in each step are listed in one column of the table. The operation is based on the HiNAND1 array shown in FIG. 2A with only J broken metal1 GBL lines and capacitors only without being further divided into L Segment lines according to a specific embodiment of the present invention. The so-called J-WL and All-GBL simultaneous Read operation means the number of the selected WLs can be flexibly varied from 1 to J with an identical address in the selected NAND String of the J selected Blocks. The number of selected GBL lines is N-bit, thus it is termed as J-WL and All-GBL simultaneous Read. The simultaneous J-WL and All-GBL Read operation is made possible because a novel Charge-sharing scheme is adopted for HiNAND1 array, regardless of SLC, MLC, TLC and XLC Read.

The key HiNAND1 array's selected and unselected control signals include DIV_EN, CSL, PRE, GBLps, SEG, SSL, GSL, WL and GBL in accordance with FIG. 2A, regardless of SLC, MLC, TLC and XLC storages according to the embodiment of the present invention. As shown in FIG. 8, the J-WL and All-GBL simultaneous Read operation is preferably being divided into 8 steps from the step 1) of precharging all J N-bit metal1 broken GBL capacitors in all Groups of the HiNAND1 array with a preferred $V_{precharge} \geq Vdd$ from J GBLps lines to the last step 8) to send out the well-distinguished N-bit page digital data. Step 4) is to provide a reduced GBL voltage Vdd/M(J) for Off-state cells by charge-sharing a broken GBL capacitor with all GBL capacitors. M(J) is a function of J (i.e., the charge-sharing effect varies for different Group with different location relative to the page buffer circuit in the HiNAND array). The N-bit page data are read from J selected WLs, loaded serially into one or two N-bit Data Registers (top or bottom), and then transferred in parallel to one N-bit Cache Register in unit of one-WL size. Lastly, each WL-data in the N-bit Cache Register are then transferred to NAND's multiple I/Os in a pipeline manner. Today, the regular NAND or ONFI NAND I/O numbers are either 8 or 16.

Typically, one WL Read voltage is termed as $V_{Rn}$, the 63 unselected WL pass voltage is denoted as Vread=6V for a 64-cell 2D NAND String. The number of $V_{Rn}$ values is one $V_{R1}$ for SLC, 3 ($V_{R1}$, $V_{R2}$, $V_{R3}$) for MLC, 7 $V_{Rn}$ for TLC, and 15 $V_{Rn}$ for XLC.

FIG. 9 is a diagram showing a preferred set of bias voltage conditions of array control signals for Multiple-WL & All-GBL simultaneous Read operation based on the HiNAND2 array shown in FIG. 2B according to a specific embodiment of the present invention. A preferred set of bias voltage conditions of several key array control signals are included in a Table for performing a preferred J-WL & All-GBL simultaneous Read operation executed in 8 steps. The bias conditions for multiple control signals in each step are listed in one column of the Table. The operation is based on the HiNAND2 array shown in FIG. 2B with J Groups divided by J−1 MGBL transistors connected by J broken Group GBL metal2 lines according to an embodiment of the present invention. As shown in FIG. 2B, each Group is further divided into Segments and each Segment is further divided by n broken LBL metal1 lines. Each broken LBL metal1 line comprises K Blocks. And each Block comprises N 64-cell Strings extending in X-direction.

Since HiNAND2 array has 2-level BL-hierarchical structure, thus more array control signals than HiNAND1 are required to take care of both divided metal2 broken J GBL and metal1 broken L LBL lines and capacitors. The key HiNAND2 array includes two new control signals DI_1 and PRE_1, and new LBL-divided NMOS MHV transistor MDBLp in addition to other HiNAND1 control signals like DIV_EN, CSL, PRE, GBLps, SEG, SSL, GSL, WL, and GBL in accordance with FIG. 2B, regardless of SLC, MLC, TLC and XLC storages of the present invention.

Similarly, the preferred J-WL and All-GBL simultaneous Read operation is preferably divided into 8 steps from the step 1) of precharging all J N-bit metal2 broken GBL to the last step 8) to send out the well-distinguished N-bit page digital data, read from J selected WL serially. Step 4) is also to provide a reduced GBL voltage Vdd/M(J) for Off-state cells by charge-sharing a LBL capacitor with corresponding GBL capacitor for the selected Group. Again, M(J) is a function of J.

FIG. 10 is a diagram showing a first preferred set of bias voltage conditions of array control signals for Multiple-WL & All-GBL simultaneous Program operation based on the HiNAND1 array shown in FIG. 2A according to a specific embodiment of the present invention. As shown, a set of bias voltage conditions of several key array control signals is provided for 7 steps of an option 1 J-WL & All-GBL simultaneous Program operation for the HiNAND1 array shown in FIG. 2A of the present invention. The selected/unselected key control signals associated with the 2D HiNAND1 array include DIV_EN, CSL, PRE, GBLps, SEG, SSL, GSL, WL, and GBL (referring to FIG. 2A). These bias conditions are applicable regardless of SLC, MLC, TLC and XLC storages of the present invention. For example, in step 2) of precharging GBL of selected Group, GBLps associated with the selected Segment is coupled to Vinh (e.g., $V_{inhibit}$ voltage) >Vdd for charging the broken GBL capacitor associated with a selected Segment, the charge is then trapped in the corresponding cell channels of the Strings in selected Block. All GBL lines are subjected to, from the PB, the loaded page data pattern in Vdd/Vss respectively for inhibit/program cells. In another example, at step 6), a Recall operation is to restore multiple-WL N-bit program data from a Dynamic Cache made of broken LBL capacitors back to the corresponding bits of one Static PB which is shared by multiple-WL SLC data before a Program-Verify operation is performed. The selected programmed WL is switched from Vpgm voltage to VFYn (n=1 for SLC, n=3 for MLC, n=7 for TLC, and n=15 for XLC).

FIG. 11 is a diagram showing a second preferred set of bias voltage conditions of array control signals for Multiple-WL & All-GBL simultaneous Program operation based on the HiNAND1 array shown in FIG. 2A according to a specific embodiment of the present invention. As shown, another preferred set of bias voltage conditions of several control signals is provided for 7 steps of an option 2 J-WL & All-GBL simultaneous Program operation for the HiNAND1 array shown in FIG. 2A of the present invention. The key control signals include DI, DIV_EN, CSL, PRE, LBLps, SEG, SSL, GSL, WL, LBL, and GBL are associated with the 2D HiNAND1 array (FIG. 2A) regardless of SLC, MLC, TLC and XLC storages of the present invention. In the option 2 operation, all steps are substantially the same as option 1 operation except in precharging step the GBLps line is coupled to just the Vdd voltage rather than higher $V_{inhibit}$ voltage to save power for precharging while using conventional SB coupling effect for cell Program.

Unlike the above mentioned (FIG. 8 and FIG. 9) J-WL and All-GBL simultaneous Read operation for both HiNAND1 and HiNAND2 arrays, the maximum number of multiple-WL simultaneous Program should not be limited by J number, although it is optimized to be less than 20 in HiNAND Read as a same design guideline used in conventional DRAM charge-sharing sensing scheme. In this preferred simultaneous Multiple-WL Program operation, no charge-sharing concern is involved.

FIG. 12 is a diagram showing a first preferred set of bias voltage conditions of array control signals for Multiple-WL & All-GBL simultaneous Program operation based on the 2D HiNAND2 array shown in FIG. 2B, regardless of SLC, MLC, TLC and XLC storages, according to another specific embodiment of the present invention. As shown, a preferred set of bias voltage conditions of several control signals is provided for an option 1 Multiple-WL & All-GBL simultaneous Program operation for the 2D HiNAND2 array shown in FIG. 2B of the present invention. The key control signals such as DI, DIV_EN, CSL, PRE, LBLps, SEG, SSL, GSL, WL, LBL, and GBL are included for executing a preferred Multiple-WL & All-GBL simultaneous Program operation in 7 steps for the 2D HiNAND2 array, regardless of SLC, MLC, TLC and XLC storages of the present invention.

Like the above mentioned J-WL and All-GBL simultaneous Read and Program operation for the HiNAND1 array, the maximum number of multiple-WL simultaneous Program of the HiNAND2 array should not be limited by J because no charge-sharing concern is involved.

FIG. 13 is a diagram showing a second preferred set of bias voltage conditions of array control signals for Multiple-WL & All-GBL Simultaneous Program operation based on the 2D HiNAND2 array shown in FIG. 2B, regardless of SLC, MLC, TLC and XLC storages, according to yet another specific embodiment of the present invention. As shown, a preferred set of bias voltage conditions is provided for an option 2 Multiple-WL & All-GBL simultaneous Program operation for 2D HiNAND2 array shown in FIG. 2B of the present invention. The key control signals such as DI, DIV_EN, CSL, PRE, LBLps, SEG, SSL, GSL, WL, LBL, and GBL are included for executing a preferred Multiple-WL & All-GBL simultaneous Program operation in 7 steps for the 2D HiNAND2 array, regardless of SLC, MLC, TLC and XLC storages of the present invention.

Like the above mentioned Option 1 J-WL and All-GBL simultaneous Read and Program operation for the HiNAND1 array, the maximum number of multiple-WL simultaneous Program of the HiNAND2 array should not be limited by J because no charge-sharing concern is involved.

FIG. 14 is a diagram showing a preferred set of bias voltage conditions of 2D HiNAND array for a Multiple-WL & All-GBL simultaneous Erase operation using Channel-Erase scheme, regardless of SLC, MLC, TLC and XLC storages, according to an alternative embodiment of the present invention. As shown, a preferred set of bias voltage conditions is provided for performing Multiple-WL & All-GBL simultaneous Erase operation using FN-channel tunneling Erase scheme as used for conventional 2D NAND flash based on 2D HiNAND1 array (Embodiment 1 in FIG. 2A) and 2D HiNAND2 array (Embodiment 2 in FIG. 2B) with dispersed Blocks. The biased conditions for the selected and unselected control signals including DI, DIV_EN, CSL, PRE, GBLps, SSL, GSL, WL, and GBL for a preferred Multiple-WL & All-GBL simultaneous Erase operation for HiNAND1 array shown in FIG. 2A, regardless of SLC, MLC, TLC and XLC storages of the present invention, are summarized in a Table in FIG. 14. In the same Table, the biased conditions for control signals DI, DIV_EN, CSL, PRE, LBLps, SEG, SSL, GSL, WL, LBL, and GBL are also listed for a preferred Multiple-WL & All-GBL simultaneous Erase operation for HiNAND2 array shown in FIG. 2B, regardless of SLC, MLC, TLC and XLC storages of the present invention.

In an embodiment, each Erase operation includes two setup steps such as Erase Setup1 and Erase Setup2 and one execution step of Erase Start as shown in FIG. 14. As shown, in the first setup step, by using a WL-decoder circuit including one 20V NMOS pass-transistor (not shown) without need of any pull-down transistor, the unselect WLs, SSLs and GSLs control signals are being shut off in a floating state at 0V. Conversely, the selected WLs, SSL and GSL signals are precharged with Vdd-Vt. The rest of other varied gate signals of DI, DIV_EN, PRE and SEC are preferably biased with Vdd and two power lines of CSL an LBLps are also biased at Vdd to help prevent two String-select transistors MS and MG in each String from being punch-throughed when $V_{inhibit}$ voltage ~7V is precharged into LBL or GBL capacitors associated with the selected Block of a selected Segment of a selected Group.

The second setup step is used to prepare for the subsequent HV 20V Erase step. All initial HiNAND array low-voltage bias conditions applied to DI, DIV_EN, PRE, LBLps, SEC, SSL, GSL, WL(unselected ones), LBL and GBL are preferably turned into floating states with their respective precharged voltages initially obtained in the Setup1 step by disconnecting the corresponding ports from their respective driver circuits excepting that the selected WL voltage is coupled to 0V.

The Erase Start step is to execute the desired Block-based Erase operation. Unlike prior art, the erase size of the present invention can be reduced down to single, randomly selected WL by setting WL=0V with respect to TPW voltage being switched from 0V as set in the Setup2 step to a high Vers voltage of 20V.

Since 2D NAND uses the FN-tunneling scheme, thus the electrons would be electrically expelled out from each cell's floating-gate to cell's channel. As a result, for each selected WL page each cell's Vt will be reduced below −2.0V after Erase-Verify over each iterative erase pulse. For M WLs to be erased in each String within each Block, M WLs in one String are respectively coupled to 0V. Similarly, one or more WLs can be selected for Erase in one or more Groups with WLs being coupled to 0V with the selected TPW voltage being ramped to 20V.

FIG. 15 is a diagram showing a set of bias voltage conditions preferred for 3D HiNAND array for Multiple-WL & All-GBL simultaneous Erase operation using gate-induced drain leakage (GIDL) Erase scheme, regardless of SLC, MLC, TLC and XLC storages, according to another specific embodiment of the present invention. As shown, a preferred set of bias voltage conditions is provided for performing Multiple-WL & All-GBL simultaneous Erase operation using GIDL Erase scheme for a 3D HiNAND array with either 1-level BL (Embodiment 1) and 2-level BL (Embodiment 2) architecture with dispersed Blocks. For example, the biased conditions for the selected and unselected control signals include DI, DIV_EN, CSL, PRE, LBLps, SEG, SSL, GSL, WL, LBL and GBL for a preferred Multiple-WL & All-GBL simultaneous Erase operation for Embodiment 2, regardless of SLC, MLC, TLC and XLC storages of the present invention, are briefly explained below.

The Erase operation for 3D HiNAND array is preferably performed the same as 2D HiNAND array with erase-size flexibly reducing down to single WL except with one major difference in the Erase scheme. Unlike a FN-Erase scheme used for 2D HiNAND array (see FIG. 14), a scheme with GIDL-induced hot-hole to erase the electrons stored in the charge-trapped layer is used for 3D HiNAND array due to the built-in deep-layer cell structures. Therefore, the selected bit line and source line of the selected 3D String have to be coupled to Vers, rather than in floating state as used for 2D String. Similarly, the voltages of DI, DIV_EN, PRE, LBL, LBLps, SEC have to coupled to Vers to allow the full Vers voltage pass to the selected bit line and source line without a drop to ensure the success of Erase operation.

Unlike 2D HiNAND2 array having a 64-cell String is very popular, 3D HiNAND array has less number of cells in one String. Thus, 3D HiNAND2 simultaneous operation has to be re-adjusted accordingly. In this case, a similarly mixed WL number of three simultaneous operations are preferably performed in 3D HiNAND2 array with a shorter String length is summarized in Table 7 below.

TABLE 7

| | Preferred operation | | |
|---|---|---|---|
| | Simultaneous Erase | Simultaneous Program | Simultaneous Read |
| WL number | 64/32 | 16 or 8 | 16 or 8 |

Figure 16:
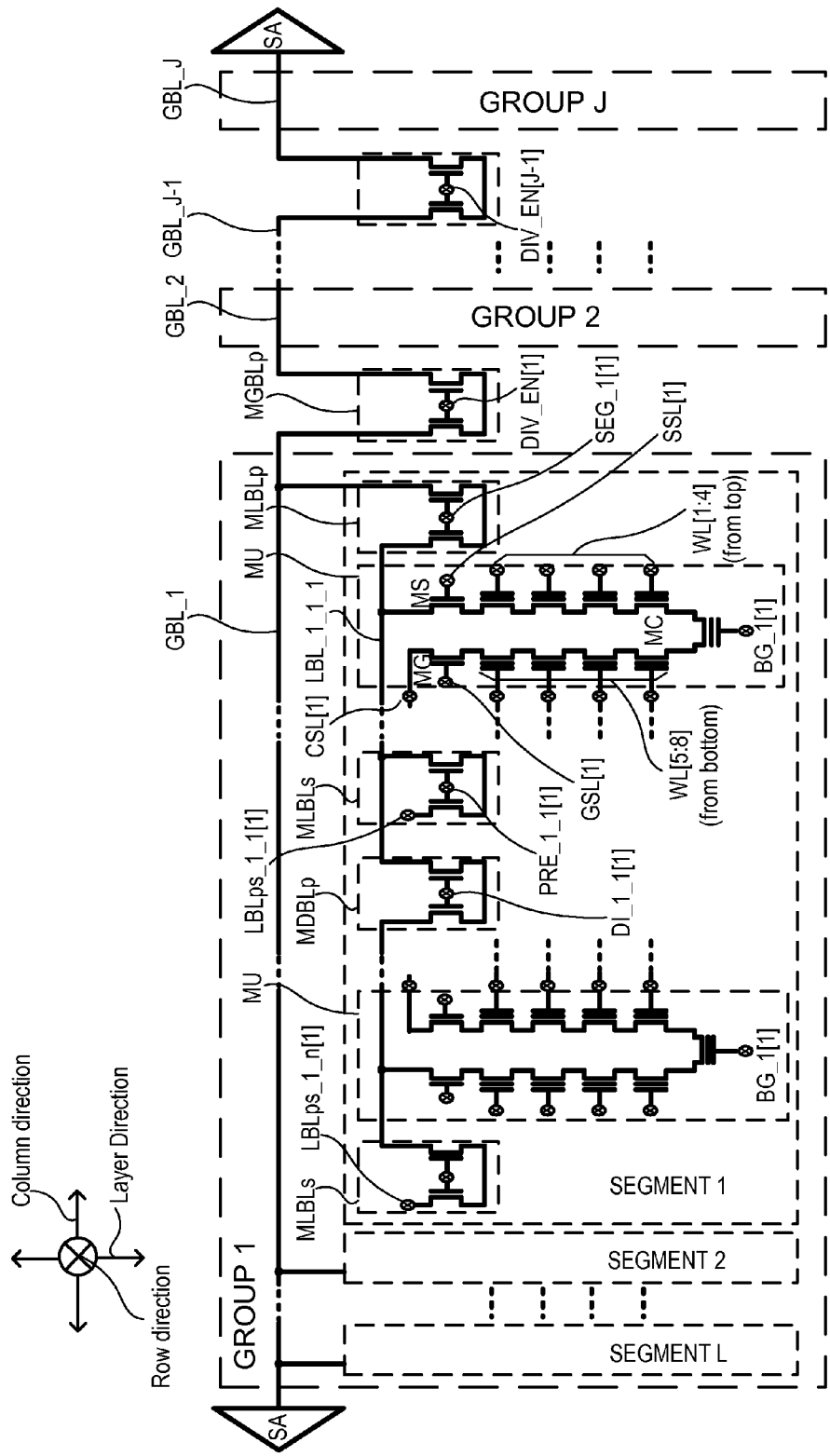

FIG. 16 is a simplified circuit diagram showing a 3D HiNAND2 array with 2-transistor GBL/LBL-divided device and U-shaped vertical-channel String according to an embodiment of the present invention. As shown, 3D HiNAND2 array includes J−1 paired 2-transistor GBL/LBL-divided device to from broken metal2-GBL/metal1-LBL lines (or capacitors) to form multiple Groups (e.g., Group 1 through Group J) of multiple Segments of multiple memory Blocks MU made by U-shaped vertical-channel Strings. Similar to 2D HiNAND2 array, metal1 lines are one topological level lower than metal2 lines in device layout. Each top-level metal2 GBL line is broken into J metal2 GBL lines or capacitors, such as GBL_1 to GBL_J, by using (J−1) paired GBL-divided NMOS transistors, MGBLp. Gates of the (J−1) GBL-divided devices MGBLp are tied to J−1 respective signals of DIV_EN[1] to DIV_EN[J−1] for forming the preferred broken metal2 GBL_3D HiNAND2 array. In an embodiment, the broken GBL_1 line capacitor in Group 1 is directly connected to a first SA located at left end of the array and the broken GBL_J line capacitor in Group J is connected to a second SA located at the right end of the array, similar to a 2D HiNAND2 array with 2-sided SA of the present invention shown in earlier sections of the specification.

Similarly, each bottom-level metal1 LBL line is broken into n metal1 LBL lines or capacitors, such as LBL_1_1_1 to LBL_1_1_n, by using (n−1) paired LBL-divided NMOS transistors, MDBLp. The device type of MDBLp is similar to that of a 3D NAND String-select transistor, MG or MS. Totally, the n−1 paired transistors MDBLp have their gates tied to respective n−1 signals, DI_1_1[1] to DI_1_n−1[1], for forming the preferred broken metal1 LBL 3D HiNAND2 array. The 3D source nodes of the paired MGBLp transistors are shorted by a metal and the source nodes of another paired MDBLp transistors are shorted by another metal.

Besides, n different ends of n broken LBL capacitors are connected to n corresponding power lines, such as LBLps_1_1[1] to LBLps_1_n[1]. Each 3D HiNAND2 memory Block has N cells connected in series forming a U-shaped vertical-channel String with one back-gate NMOS transistor, MC, having its gate tied to BG_1[1]. The U-shaped vertical-channel Strings are based on traditional multilayered BiCS (Bit-Cost Scalable) or P-BiCS U-shape cell-string manufacturing processes. Detail descriptions on the processes of forming the U-shaped vertical-channel Strings and their operations can be found in U.S. Pat. No. 8,169,826, incorporated fully as references. By dividing the GBL line to multiple Groups as shown above, the preferred Multiple-WL and All-GBL simultaneous Read and Program operations like the 2D HiNAND2 array can be also executed in the 3D HiNAND array without much changes in memory cell manufacture processes.

According to some traditional 3D NAND technologies, for example, in U.S. Pat. No. 8,169,826, both BiCS and P-BiCS use a multi-stacked memory array with a few constant critical lithography steps regardless of number of stacked layers to keep a continuous reduction of bit cost. Therefore, whole stack of electrode plate is punched through and plugged by another electrode material. More information about P-BiCS or BiCS structure can be referred to U.S. Pat. Nos. 8,334,551, 8,169,826, 8,189,391, 8,194,453, 8,203,882, 8,334,551, and 8,335,111, incorporated fully as references. All of the disclosed vertical 3D NAND array circuits are 2-level non-broken-BL structures for performing single-WL and All-GBL Read, Program and Program-Verify operations with a high power consumption due to the heavy capacitance loading on each long unbroken metal2 GBL line along with corresponding unbroken metal1 LBL line. While with the improved 3D HiNAND array with broken metal2 GBL and broken metal1 LBL lines according to the embodiments of the present invention, multiple-WL and All-GBL Read and Program operations can be performed due to dramatically reduction of the current for executing Read and Program operations.

In the traditional 3D NAND architecture, only one end of each selected, long but unbroken, top-level, metal2 GBL is connected to each corresponding SA at right end of the array through a NMOS transistor. Each GBL line crosses a plurality of horizontal 3D-NAND memory Blocks. And each 3D-NAND memory Block includes a plurality of 3D NAND MUs. Each 3D MU further includes one vertical 3D NAND String with many 3D memory cells connected in series having a back-gate NMOS transistor, BTrb, in the middle (or bottom) of the 3D NAND String having two NMOS String-select transistors, SSTrb and SDTrb, placed on top. The top drain nodes of all MUs within the same memory Block are connected together by a common but unbroken metal1 LBL line or capacitor.

Based on the 3D HiNAND's 2-level unbroken-BL structure, a high-current precharge operation to both GBL and LBL has to be performed initially prior to any 3D NAND Read operation but only happens on each GBL without LBL. Similar to the 2D NAND Read operation, each GBL line or capacitor has two precharged voltages, such as Vdd-Vt of about 1.0V for the corresponding stored bit data "1" and 0V for the corresponding stored bit data "0", supplied by a N-bit PB that contains N SAs. Therefore, regardless of the nearest memory Block (MB) or the farthest MB from the one-end SA scheme's viewpoint, each traditional unbroken heavy and long GBL and each unbroken LBL capacitors have to be fully charged up to Vdd-Vt or discharged to Vss by one corresponding bit of N-bit PB that contains one-bit of SA through each corresponding global HV transistor and each paired transistors of SSTra and SDTra with a common or separated gate control signals of SGSa and SGDa within each corresponding LBL capacitor (see U.S. Pat. No. 8,169,826). In other words, high power consumption for both precharge and discharge operations of each metal2 GBL capacitors and its associated each metal1 LBL capacitors has no discrimination on all selected MUs in each selected MB of each selected common metal1 LBL line and all selected MBs in each selected common metal2 GBL line when the traditional 3D NAND with 2-level BL-hierarchical structure is adopted for single-WL Program and Read scheme.

Unlike the above conventional 3D NAND Read and Program schemes, one embodiment of a 3D HiNAND2 scheme of the present invention provided above in FIG. 16 proposes a novel 3D architecture with modifications in circuit particularly in GBL and LBL layout to allow much powerful Multiple-WL and All-BL simultaneous Read, Program and Program-Verify operations as explained below. Several alternative embodiments of the 3D HiNAND2 scheme with references to FIG. 17, FIG. 18 and FIG. 19 of this application are further illustrated.

In an embodiment, as shown in FIG. 16, each long metal2 GBL has been changed to a plurality of broken or segmented metal2 GBLs, such as GBL_1, GBL_2, through GBL_J in one of the 3D HiNAND with a one-end SA scheme. The capacitance of each piece-wise, broken GBL_J line is only 1/J of capacitance of traditional long GBL line. For example, if the right-most broken GBL_J is the one that is connected to the SA at the right end, then the GBL capacitor, $C_{GBL\_J}$, is a nearest one connected to the corresponding SA at right end. By contrast, the left-most $C_{GBL\_1}$ capacitor would become the farthest one connected to the SA at the right end.

The newly inserted devices in between two adjacent broken $C_{GBL\_J}$ and $C_{GBL\_J-1}$ capacitors is a paired transistors of NMOS HV MLBLp with two gates tied to a common signal of DIV_EN line such as DIV_EN[1] to enable and disable the selection of the corresponding broken GBL_1, and DIV_EN[2] to enable and disable the selection of GBL_2 and lastly DIV_[J−1] to enable and disable the selection of the corresponding broken GBL_J−1. The last one of the broken GBL_J is directly connected to its corresponding SA without going through any MLBLp transistor.

In this 3D HiNAND2 operation, both DIV_[1]=DIV_[2]= . . . =DIV_[J−1]=Vread to allow the selection of GBL_1. The Vread is preferably set to be about 6V to reduce the on-resistance of each MGBLp transistor to reduce the RC delays of precharge and discharge operations. Note, the GBL_1 precharge and discharge times are the slowest with the highest power-consumption for this 3D HiNAND2 Read scheme due to the largest RC from each one-end SA sensing viewpoint. Several scenario are shown below:

A) For reading GBL_1, the largest RC'2 [(J−1)×R(MLBLp)]×[J×$C_{GBL}$],
B) For reading GBL_2, the RC=[(J−2)×R(MLBLp)]×[(J−1)×$C_{GBL}$],
C) For reading GBL_J−1, the RC=1×R(MLBLp)]×[2×$C_{GBL}$],
D) For reading GBL_J, the RC=1×$C_{GBL}$ with zero R(MLBLp). The smallest RC from right-end N-bit SA viewpoint.

More details of comparison between traditional 3D NAND with unbroken GBL and the 3D HiNAND2 of the present invention (see FIG. 16) with broken GBL for 1-WL Read charge-sharing operation are summarized in the following Table 8.

TABLE 8

| 1-WL and All-GBL Read charge-sharing operation | | | |
|---|---|---|---|
| Read comparison | 3D NAND | 3D HiNAND2 | Comment |
| Each broken GBL with each unbroken LBL line | unbroken GBL | J broken GBL | J = 16 |
| $C_{GBL}$ loading to precharge Jth memory Block near SA | 16 $C_{GBL}$s | 1 $C_{GBL}$ | 1/16 power |

TABLE 8-continued

1-WL and All-GBL Read charge-sharing operation

| | | | |
|---|---|---|---|
| $C_{GBL}$ loading to precharge 15th memory Block | 16 $C_{GBL}$s | 2 $C_{GBL}$s | 1/8 power |
| $C_{GBL}$ loading to precharge 2nd memory Block | 16 $C_{GBL}$s | 15 $C_{GBL}$s | 15/16 power |
| $C_{GBL}$ loading to precharge 1st memory Block | 16 $C_{GBL}$s | 16 $C_{GBL}$s | 16/16 = 1, i.e., same power |

The above explanation of the 3D HiNAND2 array is to show how to read one WL by one WL from different broken GBL and impact of charge-sharing if the similar DRAM-like Latch-type SA is used for this 3D HiNAND2 Read operation for one WL.

More comparison between traditional 3D NAND with unbroken GBL and the 3D HiNAND2 of the present invention (see FIG. 16) with broken GBL for Multiple J WLs All-GBL simultaneous Read charge-sharing operation is illustrated below in Table 9.

TABLE 9

J-WL and All-GBL Read charge-sharing operation

| Read comparison for Each broken GBL with each unbroken LBL line | 3D NAND unbroken GBL | 3D HiNAND2 J broken GBL (J = 16) |
|---|---|---|
| Precharge time of all GBL lines and LBLs in 16 memory Blocks | 16X One memory Block by one memory Block, thus 16 times for 1 GBL | 1X Simultaneously on 16 memory Blocks one time only |
| $V_R$ on selected WLs # of LBL & GBL discharged | 16 $V_R$s for 16 WLs 16 times 1WL-by-1WL for 16 WLs | 1 $V_R$ for 16 WLs one time for 16-WL |

In above 3D HiNAND2 flash array with broken-GBL but with non-broken LBL scheme, it allows the Multiple-WL simultaneous Read, Program, and Program-Verify operations to be performed within multiple memory Blocks. However, for traditional 3D NAND flash array, the Multiple-WL simultaneous Read, Program, and Program-Verify operations cannot be performed even within only one memory Block.

For the 3D HiNAND2 flash array, it includes J broken metal2 GBL lines and K broken metal1 LBL lines. The values of J and K can be different or same. There are two major advantages to change one unbroken LBL into K broken LBL lines per one broken GBL line is for the preferred low-power, simultaneous, fast, multiple-WL Program and Program-Verify operations. In an embodiment, the scheme of one of K broken LBL lines consumes only 1/K of $V_{inhibit}$ precharge current of the whole unbroken LBL line. As explained in 2D HiNAND2 array with a broken LBL structure, each of the K broken LBLs would have only 1/K capacitance of whole unbroken LBL capacitor. In a preferred Non-SBPI method of the present invention, only 1/K power is required to precharge each selected broken LBL capacitor to $V_{inhibit}$ voltage, which is about 7V. In another embodiment, the scheme of the K broken LBL lines allows K-WL and All GBL simultaneous Read, Program, and Program-Verify operations to be performed in only one small MB, rather than multiple big MBs. Thus, this scheme provides more fine multiple-WL & All-GBL Program.

There is a disadvantage with the K broken LBL structure for Kth broken LBL would be associated with only 1/K capacitance of whole unbroken LBL capacitor. Due to the required charge-sharing scheme for the preferred Multiple-WL Read and Program-Verify operation, the 3D HiNAND2 array with broken-LBL structure still has its application for multiple-WL Read except the MB of GBL_J. The results for one-end SA 3D HiNAND2 scheme are summarized in Table 10 below.

TABLE 10

16-WL and All-GBL Read charge-sharing operation

| Comparison For one-end SA | 3D HiNAND2 Broken GBL but non-broken LBL scheme | 3D HiNAND2 Broken GBL & broken LBL scheme |
|---|---|---|
| 16-WL simultaneous program in 16 memory Blocks? | Yes but consumes 16X $V_{inhibit}$ power | Yes but consumes 1X $V_{inhibit}$ power |
| 16-WL simultaneous program in one memory Block? | No | Yes |
| Multiple-WL & All-GBL Read in 16 memory Blocks? | Yes | Yes |
| Multiple-WL & All-GBL Read in one memory Block? | No | Yes on GBL_16 only |

In an alternative embodiment, a 3D HiNAND2 scheme with two-ended N-bit SA on each GBL including a first N-bit SA placed at the right end and a second N-bit SA placed at left end. For example, in a 3D HiNADN2 with 16 broken GBL scheme and two-ended SA, there are two nearest and two farthest GBL capacitors per one metal2 GBL. In particular, two nearest GBL capacitors are GBL_1 from the far-left SA viewpoint and GBL_16 from the far-right SA viewpoint, and two farthest GBL capacitors are GBL_8 from the far-left SA viewpoint and GBL_9 from the far-right SA viewpoint, here J=16. The detailed operations of this two-ended SA associated with the 3D HiNAND2 array with broken GBL and broken LBL or unbroken LBL schemes would be similar to the one-ended SA associated with the same 3D HiNAND2 array explained previously and the corresponding descriptions are then skipped here for simplicity.

FIG. 17 is a simplified circuit diagram showing a 3D HiNAND2 array with 3-transistor divided-GBL/LBL device and U-shaped vertical String according to another embodiment of the present invention. It is a second embodiment of 3D HiNAND2 circuit with divided GBL devices for the broken GBLs and broken LBLs. The divided GBL devices include one paired NMOS transistors of MGBLp with a common gate connected to DIV_EN and one Back-gate NMOS transistor of MC with its gate tied to BG. Similarly, the divided LBL devices are comprised of one paired transistors of MLBLp with a common gate tied to DI_1 and one back-gate NMOS transistor, MC, with gate tied to BG_[1].

Besides the one divided device is added in between two adjacent broken GBL capacitors and two adjacent broken LBL capacitors, there are additional devices are added at one end of each LBL and each GBL. These devices are like the above said devices for the Divided or broken LBL and GBL.

For example, these devices include one-paired MLBLps with the common gate tied to PRE_1_1[1] to PRE_1_n[1] with power line of LBLps_1-1[1] to LBLps_1-n[1]. Similarly, the same MGBLps transistor can be added to each broken GBL line for precharging or discharging the $V_{inhibit}$ or Vss. But in order to save one the transistors and power line, GBLps, is not added into each broken GBL.

The differences between the embodiment in FIG. 16 and the embodiment in FIG. 17 is to add one extra back-gate transistor MC in series with the paired 2-transistor GBL-divided device MGBLp to form a 3-transistor GBL-divided device, and similarly, add one back-gate transistor MC in series with the paired 2-transistor LBL-divided device MDBLp. Each added transistor MC has its gate respectively tied to a signal BG. All other circuits such as two-sided SA and 3D NAND Strings are kept the same as a traditional U-shaped vertical NAND flash technology.

FIG. 18 is a simplified circuit diagram showing a 3D HiNAND2 array with 1-transistor divided-GBL/LBL device and with U-shaped vertical-channel String according to yet another embodiment of the present invention. It is a third embodiment of 3D HiNAND2 flash array circuit. As shown, it includes both broken metal2 GBL lines and broken metal1 LBL lines. The divided devices do not include one paired transistors but one back-gate transistor (such as MGBLp, or MDBLp). For example, between two adjacent broken divided metal2 GBL lines of GBL_J−1 and GBL_J, a GBL-divided transistor is a 1-poly NMOS transistor MGBLp with its gate tied to DIV_EN[J−1]. A LBL-divided 1-poly NMOS transistor MDBLp with its gate tied to DI_1_1[N] is to connect two adjacent broken metal1 LBL lines, LBL_1_1_1 and LBL_1_1_2. To precharge or discharge each LBL line or capacitor, it goes through each corresponding LBLps line through a 3D NMOS transistor of MLBLs. All other circuits such as two-sided SA and 3D NAND Strings are kept the same as the traditional U-shaped vertical NAND flash technology.

FIG. 19 is a simplified circuit diagram showing a 3D HiNAND2 array with 1-transistor divided-GBL/LBL device and with straight vertical-channel String according to still another embodiment of the present invention. As shown, the 3D HiNAND2 array with broken GBL and broken LBL scheme has a different MU String structure. The two String-select transistors with one on top and one on bottom. But the way of dividing GBL and LBL are similar to previous embodiments shown in FIG. 17 and FIG. 18.

In this embodiment, both GBL and LBL divided devices are made of 1-poly NMOS transistors such as MGBLp and MDBLp. The 1-poly MGBLp transistor has its gate tied to signal DIV_EN for forming a broken metal2 GBL structure and the 1-poly MDBLp transistor has its gate tied to DI_1 for forming a broken metal1 LBL structure.

As shown, the second String-source select transistor is not at the top of String, Instead, it is formed at the bottom of the String with its gate tied to signal GSL[1] and its source tied to signal CSL[1]. In this case, the number of memory cells MC in this 3D HiNAND String is halved as compared to the String sizes shown in FIGS. 16-18.

FIG. 20 is a simplified circuit diagram showing a 3D HiNAND2 array compatible with vertical-gate NAND cell string scheme according to an alternative specific embodiment of the present invention. As shown, the 3D HiNAND2 array circuit includes a similar 2-level segmented or broken GBL and LBL structure based on a vertical-gate 3D NAND flash technology. Examples of traditional vertical-gate lateral-channel 3D NAND architecture can be referred to U.S. Pat. Nos. 8,148,763, 8,437,192, and U.S. Patent Application Publication No. 2012/0051137 A1, incorporated all for references.

Similarly, the broken LBL uses the same 8-transistor divided LBL device with their 8 gates tied to each common DI_1_1 signal line. As shown in FIG. 20, each long GBL has been divided into a plurality of broken GBLs (such as GBL_1 to GBL_J for total J broken GBL lines) or capacitors by inserting eight 1-poly NMOS transistors, MGBLp, in a vertical column in parallel with drain and source connected to two adjacent GBL lines or capacitors and with 8 gates commonly tied to a signal DIV_EN [J−1]. This is implemented similar to but slightly different from the previous embodiment shown in FIG. 19. In this embodiment, the vertical-gate 3D structure is adopted, thus multiple-layer of transistors are easier to stack on top of one another for eight stories than the previous embodiment with vertical-channel 3D structure. In a specific embodiment, the 3D HiNAND array with vertical-gate can be implemented by using traditional platform without process changes. Simply, the GBL divided devices of MGBLp associated with the novel 3D HiNAND array are also made of compatible vertical-gate structure on the same silicon die.

Since eight MGBLp transistors are formed in parallel between two adjacent GBL_J lines or capacitors, thus the effective resistance of total eight MGBLp becomes ⅛ of one MGBLp. As a result, the RC delay for each divided GBL becomes smaller 1/J as compared to one long unbroken GBL line when gate signal voltage of DIV_EN J=Vread=6V or higher. As a result, the total RC delay of connecting all J GBL capacitors and J−1 resistors of MGBLp is almost same without degradation of using this broken GBL scheme as one long GBL capacitance without MGBLp resistance used in a prior-art 3D NAND. But if the accessed MBs are near SA in physical layout, then the RC delay is much less than prior-art 3D NAND. As a result, a superior 3D HiNAND performance can be achieved based on a conventional vertical-gate 3D NAND design when the preferred broken 3D GBL structure is adopted therein.

Similarly, a broken LBL scheme can be also used for this 3D HiNAND Flash array with a vertical-gate platform. In particular the broken LBL line can be achieved by using 8-Transistor LBL-divided devices MDBLp connected in parallel with their 8 gates tied to respective common signal DI_1_1[L−1].

Besides, one end of each broken LBL is connected to one corresponding power line of LBLps_1_n though eight MLBLs with eight gates tied to one common signal of PRE_1_n. Similarly, one end of each broken GBL can also be connected to a corresponding power line of a GBLps bus. Alternatively, because each broken GBL capacitor voltage can be precharged or discharged through the corresponding LBLps_1_n, in this 3D HiNAND2 structure with vertical-gate platform. This GBLps line can be saved to reduce the silicon area.

In addition, each preferred broken GBL is connected to two SA placed in far-left and far-right ends. As explained in 2D NAND Flash with two-ended SA per one broken GBL, the fastest and lowest power-consumption GBLs are two, rather than one. Thus more flexibility of the 3D HiNAND2 array can be planned for faster and superior reliability NAND operation.

All the basic 3D HiNAND cell Program, Erase, and Read conditions in this vertical-gate technology are fully compatible with traditional 3D NAND operating conditions. The major attributions of this vertical-gate 3D HiNAND array are to use short and light broken-GBL and broken-LBL schemes to replace long and heavy un-broken GBL and LBL so that fast simultaneous Multiple-WL and All-BL Program, Read, and Program-Verify operations can be achieved.

FIG. 21 is a diagram showing six decoding logics for eight layers of the vertical String-selected transistors of the 3D vertical-gate HiNAND2 array structure of FIG. 20 according to a specific embodiment of the present invention. As shown, the GBL decoding scheme is executed through six GBL-select NMOS transistor connected in series with their six common gates tied to six control logics such as SS1B, SS1, SS2B, SS2, SS3B, SS3, and SS4B, SS4. These gate logic assignments are designed for 8-layer vertical-gate 3D NAND Strings GBL selections. The detail description of these gate logic assignments is kept the same as traditional ones for the vertical-gate 3D NAND architecture which can be found in U.S. Pat. No. 8,437,192, incorporated fully as references. Thus, the 3D HiNAND2 broken-GBL and broken LBL preferred schemes according to an embodiment of the present invention can still be implemented without change in the GBL-select scheme based on the traditional 3D NAND technology. Regardless of any new design approaches of GBL-select circuit, the 3D HiNAND2 scheme of the present invention can still be applied.

Throughout the specification, all the 3D HiNAND2 arrays proposed above (FIGS. 16-20) have 2-sided SA and multiple-level broken-BL hierarchical structures. However, all of them can be turned into 3D HINAND2 arrays with 1-sided SA and multiple-level hierarchical BL structures so that a faster and less-power consumption of the preferred Charge-sharing, Precharge and Discharge Read and Verify operations can be performed.

The detailed operations of the vertical-gate 3D NAND flash using the HiNAND2 BL-hierarchical structure of the present invention for Multiple-WL and All-BL Read, Program and Program-Verify operations would be same as the previous descriptions for the 2D HiNAND2 flash array and the 3D HINAND2 array with U-shaped vertical-channel String.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A high-density NAND (HiNAND) flash memory array with 1-level broken-bit-line hierarchical architecture for performing multiple-WL All-BL simultaneous Program, Program-Verify, and Read operations, the HiNAND flash memory array comprising:

an array of NAND memory cells arranged either as a first plurality of columns in a first direction or as a second plurality of rows in a second direction, each column including multiple Strings having all transistors connected in series to couple with a global bit line (GBL) extended through a full length of the column and each row including one Page having all transistor gates being commonly coupled to a word line (WL);

J−1 rows of the first plurality of Group-divided devices aligned in the second direction in parallel to the WL to respectively divide each GBL to J broken Group metal1 lines so that the array is divided into J Groups in the first direction, each broken Group metal1 line comprising a first parasitic capacitor, J being selected from 8, 16, or other integer numbers; L−1 rows of the first plurality of Segment-divided devices aligned in the second direction for each Group to respectively divide each broken Group metal1 line in to L broken Segment metal1 lines so that each Group is divided into L Segments, each broken Segment metal1 line comprising a second parasitic capacitor, L being selected from 4, 8, 16, 32, or other integer numbers, each Segment including K identical Blocks laid in the first direction, each Block including N identical Strings cascaded in the second direction, each String including M NAND memory cells connected in series capped by a first String-select device coupled to the corresponding GBL and a second String-select device coupled to a common source line, K and M are integer numbers, N being total number of the GBLs and a same number as the first plurality of columns;

a row of the first plurality of pull-down devices aligned in the second direction for each Segment, each pull-down transistor being coupled between each broken Segment metal1 line and a metal0 GBLps line coupled to a voltage decoder or ground; and a page buffer having N-bit ports to couple with the N GBLs, the page buffer comprising at least a first Data Register coupled with a first Cache Register located at a first end of the first plurality of columns near a first Group of the array;

wherein each row of the first plurality of Group-divided devices is controlled by one of first control signals, each row of the first plurality of Segment-divided devices is controlled by one of second control signals, each row of the first plurality of pull-down devices is controlled by one of third control signals, multiple Pages with respective multiple WLs and all GBLs across the array can be selected from multiple dispersed Blocks in same or different Segments of one or more Groups for at least partially performing simultaneous Program, Program-Verify, and Read operations.

2. The Hi NAND flash memory array of claim 1 wherein each Group-divided device, each Segment-divided device, each pull-down device, each first String-select device, and each second String-select device is a same type NMOS 1-poly medium-high-voltage (MHV) transistor.

3. The HiNAND flash memory array of claim 1 wherein M is selected from 8, 32, 64, or other integer numbers depending on NAND design density and N is 65,536 for 8 KB Page size and upgradable for a larger Page size.

4. The HiNAND flash memory array of claim 1 wherein each NAND memory cell is configured to store 2-state SLC, or 4-state MLC, or 8-state TLC, or 16-state XLC, or even 256-state analog values.

5. The HiNAND flash memory array of claim 1 wherein the page buffer further includes a Multiplier circuit, a Sense Amplifier circuit, a Y-pass circuit, an I/O Control circuit and multiple I/O [1:X] pins, the first or second data register is a 1-bit data register for SLC type cell, a 2-bit data register for MLC type cell, a 3-bit data register for TLC type cell, a 4-bit data register for XLC type cell, the 2-bit and above data registers additionally including a Program Buffer circuit, a Matching logic circuit, and a Data Buffer circuit.

6. The HiNAND flash memory array of claim 5 wherein the page buffer further comprises a second data register coupled with a second cache register located at a second end of the array to connect with the last Group via the N GBLs, for saving power and enhancing performance speed in loading 1-page data in 1-cycle either from the first data register at the first end or from the second data register at the second end during multiple-WL and All-GBL simultaneous operations.

7. The HiNAND flash memory array of claim 5 wherein the page buffer comprises a N/2-bit PB circuit connected to the N GBLs for loading one page N-bit data in 2-cycle from either the first-end or the second-end of the array.

8. The HiNAND flash memory array of claim 5 wherein the page buffer comprises a N-bit PB circuit located between two divided halves of the array with a first half array comprising Group 1 through Group D and a second half array comprising Group D+1 through Group J, where the Group D and the Group D+1 are two Groups located nearest to the N-bit PB circuit.

9. The HiNAND flash memory array of claim 5 wherein the page buffer comprises only one N-bit Cache circuit for one N-bit SLC Read, two N-bit Cache circuits for a 2×N-bit MLC Read, three N-bit Cache circuits for a 3×N-bit TLC Read, and four N-bit Cache circuits for a 4×N-bit XLC Read by using corresponding K Pages in different Segments associated with available N-bit second parasitic capacitors to temporarily store K×N-bit page-data wherein K=1 for SLC Read, 2 for MLC Read, 3 for TLC Read, and 4 for XLC Read of multiple selected WLs without overheads of extra Data Registers.

10. The HiNAND flash memory array of claim 1 wherein each broken Group metal1 line has a first length extending through just one Group, which equals to 1/J of the full length of the global BL throughout the array and each broken Segment metal1 line has a second length equal to 1/L of the first length, correspondingly, a capacitance of each first parasitic capacitor being equal to 1/J of a capacitance of a GBL and serving as a unit for precharging during a all-GBL Read operation using a charge-sharing scheme.

11. The HiNAND flash memory array of claim 1 wherein each Group from 1 through J comprises a broken Group metal1 line configured with an unequal length with different number of Segments varied for the Group 1 through the Group J so that the Group being farthest from the page buffer circuit at one end of the array has a longest length or largest capacitance for a reduced charge dilution during a charge-sharing for performing superior Read operation thereon.

12. The HiNAND flash memory array of claim 1 wherein each metal0 GBLps line is laid substantially similar to the common source line in parallel to the second direction at one level below the metal1 line and is associated with one Segment.

13. The HiNAND flash memory array of claim 12 wherein the metal0 GBLps line per Segment is configured to be a power line to couple a desired voltage applied from the block voltage decoder for precharging one or more sets of N broken Segment metal1 lines associated with one or more Segments of a Group up to all N broken Group metal1 lines associated with a Group to store charges in the corresponding one or more sets of N second parasitic capacitors up to a set of N first parasitic capacitors rather charging the full length global BLs from the first-end page buffer or the second-end page buffer.

14. The HiNAND flash memory array of claim 13 wherein multiple metal0 GBLps lines respectively associated with multiple Groups are configured to perform a simultaneous precharge operation on multiple sets of N broken Group metal1 lines respectively associated with the multiple corresponding Groups by coupling a Vdd voltage to each corresponding metal0 GBLps line, setting all first control signals to 0V, all second control signals to Vread of about 6V, all third control signals for the multiple Groups to Vread of about 6V, for performing simultaneous multiple-WL and all-BL Read operation on the basis of one Page per one Group, the selected Page to be read comprising N-bit data stored by part of N memory cells in On-state and remaining part of the N memory cells in Off-state by setting WL voltage for selected Page to a Read voltage $V_R$ against threshold level of each memory cell in the Page while setting WLs for other unselected Pages at Vread=6V.

15. The HiNAND flash memory array of claim 14 wherein the simultaneous precharge operation further comprises applying Vdd to turn on the first String-select device and 0V to turn off the second String-select device for each of multiple selected Blocks in the multiple Groups including the selected Page to be read and keeping the common source line connected to the second String-select device at 0V so that charges of Vdd voltage can be trapped in corresponding N Strings of memory cells in each of multiple selected Blocks.

16. The HiNAND flash memory array of claim 15 wherein the multiple sets of N broken Group metal1 lines in multiple Groups initially precharged to Vdd are configured to have part of the N broken Group metal1 lines for each Group that cross with any On-states memory cells in the selected Page be discharged from Vdd to 0V simultaneously by turning on the second String-select device connected to the common source line at 0V, and to have remaining part of the N broken Group metal1 lines for each Group that cross with any Off-states memory cells in the same Page be retained at the Vdd voltage, providing a data pattern of Vdd vs. 0V matching original data stored in the selected Page for performing a simultaneous multiple-WL and all-GBL Read operation.

17. The HiNAND flash memory array of claim 16 wherein each retained Vdd voltage associated with the data pattern is shared with the corresponding GBL in a DRAM-like charge-sharing scheme to provide a Vdd/M(J) voltage for the page buffer to amplify the Vdd/M(J) voltage by a Multiplier and further amplify it to a digital voltage by a Sense Amplifier, where M(J) is a function of J depending on location of Jth Group relative to the page buffer, while each discharged 0V voltage associated with the same data pattern is similarly converted to another digital voltage depending on Sense Amplifier design in the page buffer, thereby converting the data pattern of Vdd vs 0V to a digital bit in the page buffer.

18. The HiNAND flash memory array of claim 13 wherein each metal0 GBLps line associated with a selected Segment is configured to perform an independent precharge operation on one set of N broken Segment metal1 lines associated with the corresponding Segment in one or more Groups by coupling a program-inhibit voltage from Vdd of 1.8V up to about 7V to the corresponding metal0 GBLps line, setting all first control signals to 0V, setting a selected second control signals for the rows of Segment-divided devices associated with the corresponding Segment to a Vpass voltage of about 10V, and all third control signals for the pull-down devices associated with the corresponding Segment to the Vpass voltage, and keeping each common source line at Vdd, for performing a simultaneous multiple-WL and all-GBL Program operation.

19. The HiNAND flash memory array of claim 18 wherein each set of N broken Segment metal1 lines associated with the selected Segment in one or more Groups is subjected to a sequential sample-and-hold operation per Segment to make the precharged voltage up to about 7V selectively discharged to 0V in part of the N broken Segment metal1 lines based on data bits "0" sent by the page buffer via the corresponding GBLs by coupling the selected first control signals to the Vpass voltage and to retain the precharged voltage in the remaining part of the N broken Segment metal1 lines if the corresponding data bits from the page buffer are "1", the data bits "0" or "1" being distributed as a data pattern depended on a whole WL page data to be programmed.

20. The HiNAND flash memory array of claim 19 wherein each set of N broken Segment metal1 lines subjected to the sample-and-hold operation is configured to trap a charge pattern of the precharged voltage or 0V in corresponding N Strings of memory cells in each selected Block containing a selected Page for programming by coupling the corresponding metal0 GBLps line per Segment to 0V and setting the third control signal for the row of pull-down devices of the corresponding Segment to 0V.

21. The HiNAND flash memory array of claim 20 wherein once each of all selected Blocks including respective Pages to be programmed in multiple Segments in one or more Groups holds the trapped charge pattern based on corresponding data pattern associated with corresponding whole WL page data sent sequentially from the page buffer, all the selected Blocks are subjected to a simultaneous program operation by applying a Vpgm=20V to selected WL of each corresponding Page and applying the Vpass voltage of about 10V to rest WLs in each selected Block.

22. The HiNAND flash memory array of claim 1 wherein multiple dispersed Blocks in different Segments of one or more Groups are configured to independently latch and trap one WL page data with Vdd voltage of 1.8V for program-inhibit and Vss of 0V for program directly coupled via the N GBLs from the page buffer and then to execute a simultaneous All-GBL Program operation based on a self-boosting-program-inhibit scheme.

23. The HiNAND flash memory array of claim 1 wherein multiple dispersed Blocks in different Segments of one or more Groups are configured to independently latch and trap one WL page data pattern with $V_{inhibit}$ voltage of about 7V for program-inhibit and Vss of 0V for program by first precharging each of N broken Segment metal1 lines to the $V_{inhibit}$ voltage from independent metal0 GBLps line for each corresponding Segment followed by coupling with a WL page data with Vdd for program-inhibit and Vss for program sent via the N GBLs from the page buffer, then to execute a simultaneous All-GBL Program operation on multiple selected Pages respectively in the multiple dispersed Blocks based on the corresponding one WL page data pattern using a non-self-boosting-program-inhibit scheme.

24. The HiNAND flash memory array of claim 1 wherein K sets of N second parasitic capacitors respectively associated with different Segments in a Group near the page buffer are configured to serve as K Dynamic Caches to temporarily store K one-WL page data from the page buffer rather than to store in multiple pages of the first Cache Register in the page buffer, where K=1 for N-bit SLC storage data, 2 for N-bit MLC storage data, 3 for N-bit TLC storage data, and 4 for N-bit XLC storage data, at a same time when storing one-page programming data into a separate selected set of N second parasitic capacitors during a simultaneous multiple-WL All-GBL Program operation.

25. The HiNAND flash memory array of claim 24 comprising a rotation capacitor assignment of n+1 free sets of N second parasitic capacitors associated with different Segments to be n rotation Dynamic Caches and one Dynamic PB per multiple-state storage data during progression multiple-WL Program operation with selected WL for programming being shifted in order from one WL to a next WL, wherein the Dynamic PB is assigned for programming N-bit one-page data from the real page buffer while the n rotation Dynamic Caches are respectively assigned for storing temporary N-bit data loaded from I/O via the page buffer depended on data storage type, wherein n=1 for SLC type, n=2 for MLC type, n=3 for TLC type, and n=4 for XLC type.

26. The HiNAND flash memory array of claim 25 wherein all n N-bit data loaded from I/O stored in the respective n rotation Dynamic Caches are configured to be recalled back to the page buffer by sharing charges stored in each second parasitic capacitor with the corresponding first parasitic capacitor, performing an analog amplification of an reduced GBL voltage by a Multiplier, and performing a digital amplification by a Latch-type SA's to give a bit of recalled data and be used for comparing with the programming N-bit one-page data read from the Dynamic PB within 1-cycle of Program-Verify operation without adding extra silicon area other than the first Cache Register in the page buffer.

27. The HiNAND flash memory array of claim 1 wherein each memory cells in the array is formed on a common triple-P-well (TPW) so that one or more dispersed Pages from K Blocks in different Segments of one or more Groups of the array are configured to flexibly subject to a simultaneous Erase operation by at least setting each selected WL to 0V for each of the one or more dispersed Pages while non-selected WLs at Vdd then floating, setting the first String-select device and the second String-select device corresponding to each of the K Blocks at floating, then setting the common TPW to a Vers voltage of 20V to erase all memory cells in the selected one or more Pages by reducing threshold levels below −0.7V using a reverse FN-channel tunneling scheme, wherein K is selected from 16, 32, 64, 128 or any integer number.

28. The HiNAND flash memory array of claim 1 comprising a 3D flash array structure with each String of memory cells being stacked in a third direction in a straight vertical-channel configuration, or U-shaped vertical-channel configuration, or vertical-gate lateral-channel configuration, the third direction being perpendicular to both the first direction and the second direction.

29. The HiNAND flash memory array of claim 28 wherein each Group-divided device, each Segment-divided device, each pull-down device, each first String-select device, and each second String-select device associated with a vertical-channel 3D NAND String configuration is selected from a one-transistor device of a same type NMOS 1-poly medium-high-voltage (MHV) transistor, a two-transistor device having two NMOS 1-poly medium-high-voltage (MHV) transistors with a common gate, and a three-transistor device having two NMOS 1-poly medium-high-voltage (MHV) transistors with a common gate plus a third NMOS 2-poly LV transistor.

30. The HiNAND flash memory array of claim 28 wherein each Group-divided device, each Segment-divided device, each pull-down device, each second String-select device associated with a n-layer vertical-gate 3D NAND String configuration is a n-transistor device having n NMOS 1-poly MHV transistors connected in parallel where n is number of cell layers of the vertical-gate 3D NAND String configuration in the third direction.

31. The HiNAND flash memory array of claim 28 wherein one or more dispersed Pages from K Blocks in different Segments of one or more Groups of the 3D flash array structure are configured to flexibly subject to a simultaneous Erase operation by at least setting all first control signals, all second control signals, all third control signals, metal0 GBLps line first to Vdd voltage and turning on both the first String-select device and the second String-select device corresponding to each selected Block, then ramping those signals from the Vdd to a Vers voltage of 20V to use a gate-induced drain leakage (GIDL) scheme to induce hot-hole to erase trapped electrons in each memory cell of the whole corresponding Page, wherein K is selected from 16, 32, 64, or any integer number.

32. A high-density NAND (HiNAND) flash memory array with 2-level broken-bit-line hierarchical architecture for performing multiple-WL All-BL simultaneous Program, Program-Verify, and Read operations, the HiNAND flash memory array comprising:

an array of NAND memory cells arranged either as a first plurality of columns in a first direction or as a second plurality of rows in a second direction, each column including multiple Strings having all transistors connected in series to couple with a global bit line (GBL) extended through a full length of the column and each row including one Page having all transistor gates being commonly coupled to a word line (WL);

J−1 rows of the first plurality of GBL-divided devices aligned in the second direction in parallel to the WL to respectively divide each GBL to J broken-GBL metal2 lines so that the array is divided into J Groups in the first direction, each broken-GBL metal2 line comprising a first parasitic capacitor located at a top-level in layout, J being selected from 8, 16, or other integer numbers, each Group being further divided into L Segments, each column of one Segment being associated with a metal1 local bit line (LBL) in parallel to the corresponding GBL associated with the same column, each LBL metal1 line comprising a second parasitic capacitor located at a lower-level than the top-level GBL metal2 line;

n−1 rows of the first plurality of LBL-divided devices aligned in the second direction for each Segment to respectively divide each LBL metal1 line in to n broken-LBL metal1 lines so that each Segment is divided into n sub-Segments, each broken-LBL metal1 line comprising a third parasitic capacitor, n being selected from an integer of 4 and greater, each sub-Segment including K identical Blocks laid in the first direction, each Block including N identical Strings cascaded in the second direction, each String including M NAND memory cells connected in series capped by a first String-select device coupled to the corresponding broken-LBL metal1 line and a second String-select device coupled to a common source line laid in the second direction, K and M are integer numbers, N being total number of the GBLs and a same number as the first plurality of columns;

a row of N first pull-down devices aligned in the second direction for each Segment, each pull-down device being coupled between each broken-GBL metal2 line and a LBL metal1 line;

a row of N second pull-down devices aligned in the second direction for each sub-Segment, each pull-down device being coupled between each broken-LBL metal1 line and a metal0 LBLps line laid in the second direction coupled to a block voltage decoder or ground; and a page buffer having N-bit ports to couple with the N GBLs, the page buffer comprising at least a first Data Register coupled with a first Cache Register located at a first end of the first plurality of columns near a first Group of the array;

wherein each row of the first plurality of GBL-divided devices is controlled by one of first control signals, each row of the first plurality of LBL-divided devices is controlled by one of second control signals, each row of the N first pull-down devices is controlled by one of third control signals, each row of the N second pull-down devices is controlled by one of fourth control signals, multiple Pages with respective multiple WLs and all GBLs across the array can be selected from multiple dispersed Blocks in different sub-Segments of one or more Segments of one or more Groups for at least partially performing simultaneous Program, Program-Verify, and Read operations.

33. The Hi NAND flash memory array of claim 32 wherein each Group-divided device, each Segment-divided device, each first pull-down device, each second pull-down device, each first String-select device, and each second String-select device is a same type NMOS 1-poly medium-high-voltage (MHV) transistor.

34. The HiNAND flash memory array of claim 32 wherein K is selected from 4, 8, or other integer, M is selected from 8, 32, 64, or other integer numbers depending on NAND design density and N is 65,536 for 8 KB Page size and upgradable for a larger Page size.

35. The HiNAND flash memory array of claim 32 wherein each NAND memory cell is configured to store 2-state SLC, or 4-state MLC, or 8-state TLC, or 16-state XLC, or even 256-state analog values.

36. The HiNAND flash memory array of claim 35 wherein the page buffer further includes a Multiplier circuit, a Sense Amplifier circuit, a Y-pass circuit, an I/O Control circuit and multiple I/O [1:X] pins, the first or second data register is a 1-bit data register for SLC type cell, a 2-bit data register for MLC type cell, a 3-bit data register for TLC type cell, a 4-bit data register for XLC type cell, the 2-bit and above data registers additionally including a Program Buffer circuit, a Matching Logic circuit, and a Data Buffer circuit.

37. The HiNAND flash memory array of claim 36 wherein the page buffer further comprises a second data register coupled with a second cache register located at a second end of the array to connect with the last Group via the N GBLs, for saving power and enhancing performance speed in loading 1-page data in 1-cycle either from the first data register at the first end or from the second data register at the second end during multiple-WL and All-GBL simultaneous operations.

38. The HiNAND flash memory array of claim 36 wherein the page buffer comprises a N-bit B circuit located between two divided halves of the array with a first half array comprising Group 1 through Group D and a second half array comprising Group D+1 through Group J, where the Group D and the Group D+1 are two Groups located nearest to the N-bit PB circuit.

39. The HiNAND flash memory array of claim 36 wherein the page buffer comprises only one N-bit Cache circuit for one N-bit SLC Read, two N-bit Cache circuits for a 2×N-bit MLC Read, three N-bit Cache circuits for a 3×N-bit TLC Read, and four N-bit Cache circuits for a 4×N-bit XLC Read by using corresponding K Pages in different Segments associated with available N-bit second parasitic capacitors to temporarily store K×N-bit page-data wherein K=1 for SLC Read, 2 for MLC Read, 3 for TLC Read, and 4 for XLC Read of multiple selected WLs without overheads of extra Data Registers.

40. The HiNAND flash memory array of claim 32 wherein each broken-GBL metal2 line has a first length extending through just one Group, the first length being equal to about 1/J of the full length of the GBL throughout the array, each LBL metal1 line has a second length extending through just one Segment equal to about 1/L of the first length, each broken-LBL metal1 line has a third length through one sub-Segment equal to about 1/n of the second length, correspondingly, a capacitance of each second parasitic capacitor being a precharging unit for charge-sharing in All-GBL Read operation and a capacitance of each third parasitic capacitor being a precharging unit for data sampling and holding in All-GBL Program operation.

41. The HiNAND flash memory array of claim 32 wherein each Group from 1 through J comprises a broken-GBL metal1 line configured with an unequal length with different number of Segments varied for the Group 1 through the Group J so that the Group being farthest from the page buffer circuit at one end of the array has a longest length or largest capacitance for a reduced charge dilution during a charge-sharing for performing superior Read operation thereon.

42. The HiNAND flash memory array of claim 32 wherein each metal0 LBLps line is laid substantially similar to the common source line in parallel to the second direction at one level below the metal1 line and is associated with each Segment.

43. The HiNAND flash memory array of claim 42 wherein the metal0 LBLps line per Segment is configured to be a power line commonly shared for n sub-Segments to couple a desired voltage applied from the block voltage decoder for precharging flexibly one or more sets of N broken-LBL metal1 lines associated with one or more sub-Segments of a Segment, or to one or more sets of N LBL metal1 lines associated with one or more Segments of a Group up to one set of N broken-GBL metal2 line associated with one Group to store charges respectively in corresponding one or more sets of N third parasitic capacitors, or one or more sets of N second parasitic capacitors up to a set of N first parasitic capacitors rather charging the full length of GBLs from the page buffer.

44. The HiNAND flash memory array of claim 43 wherein multiple metal0 LBLps lines respectively associated with one or more Groups are configured to perform a simultaneous precharge operation on multiple sets of N LBL metal1 lines respectively associated with the multiple corresponding Segments of multiple Groups by coupling a Vdd voltage to each corresponding metal0 LBLps line, setting all first control signals to 0V, all second control signals to Vread of about 6V, all fourth control signals for the multiple Groups to Vread of about 6V, for performing a simultaneous multiple-WL and all-GBL Read operation on the basis of one Page per one Group, the selected Page to be read comprising N-bit data stored by part of N memory cells in On-state and remaining part of the N memory cells in Off-state by setting WL voltage for selected Page to a Read voltage $V_R$ against threshold level of each memory cell in the Page while setting WLs for other unselected Pages at Vread=6V.

45. The HiNAND flash memory array of claim 44 wherein the simultaneous precharge operation further comprises applying Vdd to turn on the first String-select device and 0V to turn off the second String-select device for each of multiple selected Blocks corresponding Segments of one or more Groups including the selected Page to be read and keeping the common source line connected to the second String-select device at 0V so that charges of Vdd voltage can be trapped in corresponding N Strings of memory cells in each of multiple selected Blocks.

46. The HiNAND flash memory array of claim 45 wherein the multiple sets of N LBL metal1 lines respectively associated with the multiple corresponding Segments of one or more Groups that are initially precharged to Vdd are configured to have part of the N LBL metal1 lines for each selected Segment that cross with any On-states memory cells in the selected Page be discharged from Vdd to 0V simultaneously by turning on the second String-select device connected to the common source line at 0V, and to have remaining part of the same N LBL metal1 lines that cross with any Off-states memory cells in the same Page be retained at the Vdd voltage, providing a data pattern of Vdd vs. 0V matching original data stored in the selected Page for performing a simultaneous multiple-WL and all-GBL Read operation.

47. The HiNAND flash memory array of claim 46 wherein each retained Vdd voltage associated with the data pattern is shared with the corresponding GBL in a DRAM-like charge-sharing scheme to provide a reduced Vdd/M(J) voltage for the page buffer to amplify the Vdd/M(J) voltage by a Multiplier and further amplify to a digital voltage by a Sense Amplifier, where M(J) is a function of J depending on location of Jth Group relative to the page buffer, while each discharged 0V voltage associated with the same data pattern is similarly converted to another digital voltage depending on Sense Amplifier design in the page buffer, thereby converting the data pattern of Vdd vs 0V to a digital bit in the page buffer.

48. The HiNAND flash memory array of claim 42 wherein multiple metal0 LBLps lines respectively associated with multiple Segments in one or more Groups are configured to perform a simultaneous precharge operation on multiple sets of N broken-LBL metal1 lines respectively associated with multiple sub-Segments in corresponding multiple Segments in one or more Groups by coupling a program-inhibit voltage from Vdd of 1.8V up to 7V to each corresponding metal0 LBLps line, setting all first control signals to 0V, setting selected second control signals for the Segment-divided devices associated with the multiple corresponding Segments to a Vpass voltage of about 10V, all third control signals for the pull-down devices associated with the corresponding multiple Segments to 0V, all third control signals for the pull-down devices associated with the corresponding multiple Segments to the Vpass voltage, and keeping each common source line at Vdd, for performing a simultaneous multiple-WL and all-GBL Program operation.

49. The HiNAND flash memory array of claim 48 wherein each of the multiple sets of N broken-LBL metal1 lines respectively associated with the multiple corresponding Segments in one or more Groups is configured to be subjected to a sequential sample-and-hold operation per each sub-Segment to discharge the precharged voltage to 0V in part of N broken-LBL metal1 lines selectively based on data bits "0" sent by the page buffer via the corresponding GBLs by coupling the selected first control signals and selected second control signals to the Vpass voltage, applying a short pulse of Vdd to the third control signals of the corresponding Segments, and setting the fourth control signals of the corresponding sub-Segments to 0V, and to retain the precharged voltage in remaining part of the N broken-LBL metal1 lines if the corresponding data bits from the page buffer are "1", the data bits "0" or "1" being distributed as a data pattern depended on a whole WL page data to be programmed.

50. The HiNAND flash memory array of claim 49 wherein each of the multiple sets of N broken-LBL metal1 lines subjected to the sample-and-hold operation is configured to trap a charge pattern with the precharged voltage/0V in corresponding N Strings of memory cells in a selected Block of each sub-Segment of multiple Segments in one or more Groups containing a selected Page for programming by coupling the metal0 LBLps line of the corresponding Segment to 0V and setting the fourth control signal for the set of pull-down devices of each corresponding Sub-Segment to 0V.

51. The HiNAND flash memory array of claim 50 wherein once each selected Block including the respective Page to be programmed in multiple sub-Segments of one or more Segments in one or more Groups holds a trapped charge pattern based on corresponding data pattern associated with corresponding whole WL page data sent sequentially from the buffer, all the selected Blocks are subjected to a simultaneous Program operation by applying Vpgm=20V to selected WL of each corresponding Page and applying the Vpass voltage of about 10V to rest WLs in each selected Block.

52. The HiNAND flash memory array of claim 32 wherein multiple dispersed Blocks in different Segments of one or more Groups are configured to independently latch and trap one WL page data with Vdd voltage of 1.8V for program-inhibit and Vss of 0V for program directly coupled via the N GBLs from the page buffer and then to execute a simultaneous All-GBL Program operation based on a self-boosting-program-inhibit scheme.

53. The HiNAND flash memory array of claim 32 wherein multiple dispersed Blocks in different Segments of one or more Groups are configured to independently latch and trap one WL page data pattern with $V_{inhibit}$ voltage of about 7V (or Vdd) for program-inhibit and Vss of 0V for program by first precharging each of N broken Segment metal1 lines to the $V_{inhibit}$ voltage (or Vdd) from independent metal0 LBLps line shared for each corresponding Segment followed by coupling with a WL page data with Vdd for program-inhibit and Vss for program sent via the N GBLs from the page buffer, then to execute a simultaneous All-GBL Program operation on multiple selected Pages respectively in the multiple dispersed Blocks based on the corresponding one WL page data pattern using a non-self-boosting-program-inhibit scheme.

54. The HiNAND flash memory array of claim 32 wherein K sets of N second parasitic capacitors respectively associated with different Segments in a Group near the page buffer are configured to serve as K Dynamic Caches to temporarily store K one-WL page data from the page buffer rather than to store in multiple pages of the first Cache Register in the page buffer, where K=1 for N-bit SLC storage data, 2 for N-bit MLC storage data, 3 for N-bit TLC storage data, and 4 for N-bit XLC storage data, at a same time when storing one-page programming data into a separate selected set of N second parasitic capacitors during a simultaneous multiple-WL All-GBL Program operation.

55. The HiNAND flash memory array of claim 54 comprising a rotation capacitor assignment of n+1 free sets of N second parasitic capacitors associated with different Segments to be n rotation Dynamic Caches and one Dynamic PB per multiple-state storage data during progression multiple-WL Program operation with selected WL for programming being shifted in order from one WL to a next WL, wherein the Dynamic PB is assigned for programming N-bit one-page data from the real page buffer while the n rotation Dynamic Caches are respectively assigned for storing temporary N-bit data loaded from I/O via the page buffer depended on data storage type, wherein n=1 for SLC type, n=2 for MLC type, n=3 for TLC type, and n=4 for XLC type.

56. The HiNAND flash memory array of claim 32 wherein each memory cells in the array is formed on a common triple-P-well (TPW) so that one or more dispersed Pages from K Blocks in different Segments of one or more Groups of the array are configured to flexibly subject to a simultaneous Erase operation by at least setting each selected WL to 0V for each of the one or more dispersed Pages while non-selected WLs at Vdd then floating, setting the first String-select device and the second String-select device corresponding to each of the K Blocks at floating, then setting the common TPW to a Vers voltage of 20V to erase all memory cells in the selected one or more Pages by reducing threshold levels below −0.7V using a reverse FN-channel tunneling scheme, wherein K is selected from 16, 32, 64, 128 or any integer number.

57. The HiNAND flash memory array of claim 32 comprising a 3D flash array structure with each String of memory cells being stacked in a third direction in a straight vertical-channel configuration, or U-shaped vertical-channel configuration, or vertical-gate lateral-channel configuration, the third direction being perpendicular to both the first direction and the second direction.

58. The HiNAND flash memory array of claim 57 wherein each Group-divided device, each Segment-divided device, each pull-down device, each first String-select device, and each second String-select device associated with a vertical-channel 3D NAND String configuration is selected from a one-transistor device of a same type NMOS 1-poly medium-high-voltage (MHV) transistor, a two-transistor device having two NMOS 1-poly medium-high-voltage (MHV) transistors with a common gate, and a three-transistor device having two NMOS 1-poly medium-high-voltage (MHV) transistors with a common gate plus a third NMOS 2-poly LV transistor.

59. The HiNAND flash memory array of claim 57 wherein each Group-divided device, each Segment-divided device, each pull-down device, each second String-select device associated with a n-layer vertical-gate 3D NAND String configuration is a n-transistor device having n NMOS 1-poly MHV transistors connected in parallel where n is number of cell layers of the vertical-gate 3D NAND String configuration in the third direction.

60. The HiNAND flash memory array of claim 32 wherein each memory cells in the array is formed on a common triple-P-well (TPW) so that one or more dispersed Pages from K Blocks in different Segments of one or more Groups of the array are configured to flexibly subject to a simultaneous Erase operation by at least setting each selected WL to 0V for each of the one or more dispersed Pages while non-selected WLs at Vdd then floating, setting the first String-select device and the second String-select device corresponding to each of the K Blocks at floating, then setting the common TPW to a Vers voltage of 20V to erase all memory cells in the selected one or more Pages by reducing threshold levels below −0.7V using a reverse FN-channel tunneling scheme, wherein K is selected from 16, 32, 64, 128 or any integer number.

61. The HiNAND flash memory array of claim 32 wherein one or more dispersed Pages from K Blocks in different Segments of one or more Groups of the 3D flash array structure are configured to flexibly subject to a simultaneous Erase operation by at least setting all first control signals, all second control signals, all third control signals, metal0 LBLps line first to Vdd voltage and turning on both the first String-select device and the second String-select device corresponding to each selected Block, then ramping those signals from the Vdd to a Vers voltage of 20V to use a gate-induced drain leakage (GIDL) scheme to induce hot-hole to erase trapped electrons in each memory cell of the whole corresponding Page, wherein K is selected from 16, 32, 64, or any integer number.

62. A method of performing simultaneous multiple-WL & All-BL Program operations in a HiNAND flash memory array with 2-level broken-BL hierarchical structure, the method comprising,
  loading from external I/O a N-bit 1-page data of SLC type sequentially to a N-bit page buffer circuit comprising a data register and a cache register associated with the HiNAND flash memory array with 2-level broken-BL hierarchical structure;
  transferring the N-bit 1-page data in the data register to a first dynamic cache;
  continuing the loading and transferring steps above for another N-bit 1-page data until a last N-bit page data is loaded;
  activating program pulse simultaneously, if the last N-bit page data is loaded, to each word line of all selected pages to respectively store N-bit programmed data to the multiple pages of memory cells;
  recalling the loaded N-bit 1-page data back to the data register in units of whole page;
  verifying if each bit of a corresponding N-bit programmed data is matched with corresponding bit of the N-bit 1-page data recalled from the first dynamic cache;
  converting successfully verified data of the N-bit 1-page data in the data register to a first data pattern;
  transferring the first data pattern to a second dynamic cache;
  continuing the recalling verifying, converting and transferring steps above for next page until last page is performed with successfully verified; and
  repeating activating; recalling, verifying, converting, and transferring steps above for all pages until every N-bit programmed data for every page are fully matched with every corresponding loaded N-bit 1-page data.

63. The method of claim 62 wherein the HiNAND flash memory array comprises a top-level broken-GBL metal2 lines and an associated bottom-level LBL metal1 lines hierarchical structure configured with multiple pages of memory cells aligned in rows, the multiple pages being arranged in column direction to form part of multiple separated Blocks connected in parallel via the LBL metal1 lines to associated one or more Segments connected further in parallel via the broken-GBL metal2 lines to one of multiple divided Groups.

64. The method of claim 62 wherein transferring the N-bit 1-page data is executed in units of whole page.

65. The method of claim 62 wherein the first dynamic cache comprises a set of N-bit parasitic capacitors formed by N pieces of LBL metal1 lines associated a Segment.

66. The method of claim 65 wherein transferring the N-bit 1-page data comprises latching and trapping a first charge pattern across a whole page into the set of N-bit parasitic capacitors.

67. The method of claim 62 wherein continuing the loading and transferring steps comprising a sequential operation.

68. The method of claim 63 wherein activating program pulse simultaneously comprises applying Vpgm=20V simultaneously to a word line of each of multiple selected pages in different Blocks of one or more Segments of one or more Groups, each selected page being associated with a trapped charge pattern in corresponding N-bit parasitic capacitors formed by N pieces of LBL metal1 lines.

69. The method of claim 62 wherein recalling comprises reading a trapped charge pattern in the corresponding dynamic cache and converting it as a digital signal back to the page buffer.

70. The method of claim 62 wherein verifying comprises reading the corresponding first N-bit programmed data stored in the corresponding page of memory cells.

71. The method of claim 62 wherein converting comprises flipping some bits of the N-bit programmed data that are matched with corresponding bits of the N-bit 1-page data recalled to bits with a program-inhibit voltage level and retaining remaining bits of the first N-bit programmed data that are not matched with corresponding bits of the first N-bit 1-page data recalled to bits with original program voltage level.

72. The method of claim 62 wherein the second dynamic cache can be same as the first dynamic cache at a same location associated with the selected Segment of the HiNAND flash memory array or a different location associated with a different Segment.

73. A method of performing simultaneous multiple-WL & All-BL Program operations in a HiNAND flash memory array with 2-level broken-BL hierarchical structure, the method comprising, loading from external I/O a 2×N-bit page data of MLC type sequentially to a N-bit page buffer circuit comprising a data register, a program buffer, and a cache register associated with the HiNAND flash memory array with 2-level broken-BL hierarchical structure;

transferring the 2×N-bit page data in the data register to a first dynamic cache to store N-bit MSB data and to a second dynamic cache to store N-bit LSB data;

transferring a decoded N-bit data in the program buffer based on the N-bit MSB data and N-bit LSB data to a first dynamic page buffer;

continuing the loading and transferring steps above until a last 2×N-bit page data is loaded;

activating program pulse simultaneously, if the last 2×N-bit page data is loaded, to each word line of all selected pages for respectively storing N-bit programmed data in multiple pages of memory cells;

recalling the loaded 2×N-bit page data back to the data register including N-bit MSB data from the first dynamic cache and N-bit LSB data from the second dynamic cache;

verifying if each bit of corresponding N-bit programmed data read from the first dynamic page buffer is matched with the corresponding decoded N-bit data of the 2×N-bit page data recalled;

converting successfully verified data of the 2×N-bit page data in the data register to form a renewed N-bit MSB data and renewed LSB data;

transferring the renewed N-bit MSB data to a third dynamic cache and the renewed N-bit LSB data to a fourth dynamic cache;

transferring another decoded N-bit data in the program buffer based on the renewed and renewed LSB data to a dynamic page buffer;

continuing the recalling verifying, converting, and transferring steps above for next page until last page is performed with successfully verified; and repeating activating; recalling, verifying, converting, and transferring steps above for all pages until every N-bit programmed data for every page are fully matched with every corresponding decoded N-bit data from original loaded 2×N-bit page data.

* * * * *